US006831523B1

(12) United States Patent
Pastorello et al.

(10) Patent No.: US 6,831,523 B1
(45) Date of Patent: Dec. 14, 2004

(54) AUTO-DETECTION BETWEEN REFERENCELESS AND REFERENCE CLOCK MODE OF OPERATION

(75) Inventors: Douglas F. Pastorello, Hudson, NH (US); Michael H. Perrott, Cambridge, MA (US)

(73) Assignee: Silicon Laboratories Inc., Austin, TX (US)

( * ) Notice: Subject to any disclaimer, the term of this patent is extended or adjusted under 35 U.S.C. 154(b) by 16 days.

(21) Appl. No.: 10/131,002

(22) Filed: Apr. 24, 2002

Related U.S. Application Data

(63) Continuation-in-part of application No. 09/902,543, filed on Jul. 10, 2001.
(60) Provisional application No. 60/302,932, filed on Jul. 3, 2001, provisional application No. 60/217,207, filed on Jul. 10, 2000, and provisional application No. 60/217,208, filed on Jul. 10, 2000.

(51) Int. Cl.[7] .............................................. H03L 7/00
(52) U.S. Cl. ........................................ 331/25; 331/1 A
(58) Field of Search .................... 331/17, 1 A; 327/147, 327/156, 157, 158, 159

(56) References Cited

U.S. PATENT DOCUMENTS

| | | |
|---|---|---|
| 3,684,976 A | 8/1972 | Terreault |
| 3,993,958 A * | 11/1976 | Cutsogeorge ............... 328/109 |
| 4,322,697 A | 3/1982 | Carbrey |
| 4,349,916 A | 9/1982 | Roeder |
| 4,728,906 A | 3/1988 | Turl et al. |
| 5,039,955 A | 8/1991 | Motte |
| 5,138,281 A | 8/1992 | Boudewijns |
| 5,731,737 A | 3/1998 | Cranford, Jr. et al. |
| 6,038,181 A | 3/2000 | Braceras et al. |
| 6,064,273 A * | 5/2000 | Donohue ..................... 331/17 |
| 6,137,372 A | 10/2000 | Welland |
| 6,307,413 B1 * | 10/2001 | Dalmia et al. .............. 327/166 |
| 6,356,156 B2 | 3/2002 | Wesolowski |
| 6,424,229 B1 | 7/2002 | Justice et al. |

OTHER PUBLICATIONS

Silicon Laboratories, "SiPHYTM Multi–Rate SONET/SDH Clock and Data Recovery IC", Si5020–DS06, Preliminary Rev. 0.6 7/00, pp. 1–16 (especially p. 9).
Andersson, L. I. et al, "Silicon Bipolar Chipset for SONET/SDH 10 Gb/s Fiber–Optic Communication Links," IEEE Journal of Solid–State Circuits, vol. 30, No. 3, Mar. 1995, pp. 210–218.
Belot, D. et al., "A 3.3–V Power Adaptive 1244/622/155 Mbit/s Transceiver for ATM, SONET/SDH," IEEE Journal of Solid–State Circuits, vol. 33, No. 7, Jul. 1998, pp. 1047–1058.
Gray, C. T. et al., "A Sampling Technique and Its CMOS Implementation with 1 Gb/s Bandwidth and 25 ps Resolution," IEEE Journal of Solid–State Circuits, vol. 29, No. 3, Mar. 1994, pp. 340–349.

(List continued on next page.)

*Primary Examiner*—Henry Choe
(74) *Attorney, Agent, or Firm*—Zagorin, O'Brien & Graham, LLP

(57) ABSTRACT

An internal frequency reference, such as a VCO used in a PLL, having a free-running frequency fairly well controlled within a predictable range, is used to determine which of two possible modes of operation, a referenceless or reference clock mode of operation, is used based on a detected frequency of an externally-provided frequency reference signal. The frequency is detected without any additional externally provided signal to indicate the mode of operation or the frequency of the reference clock. If the frequency detection circuit detects a frequency below a predetermined threshold, referenceless mode of operation is indicated. Otherwise, reference clock mode of operation is indicated. In referenceless mode of operation such operations as frequency acquisition and lock detect are performed without the use of a reference clock. In reference clock mode the reference clock is used for such operations as frequency acquisition and lock detect.

20 Claims, 42 Drawing Sheets

OTHER PUBLICATIONS

Guiterrez G. et al, "2.488 Gb/s Silicon Bipolar Clock and Data Recovery IC for SONET (OC–48)," IEEE 1998 Custom Integrated Circuits Conference, pp. 575–578.

Guiterrez, G. and Kong, S., "Unaided 2.5 Gb/s Silicon Bipolar Clock and Data Recovery IC," VIII–7, 1998 IEEE Radio Frequency Integrated Circuits Symposium, pp. 173–176.

Hu, T. H. and Gray, P. R., "A Monolithic 480 Mb/s Parallel AGC/Decision/Clock–Recovery Circuit in 1.2– μm CMOS," IEEE Journal of Solid–State Circuits, vol. 28, No. 12, Dec. 1993, pp. 1314–1320.

Kawai, K. et al., "A 557–mW, 2.5–Gbit/s SONET/SDH Regenerator–Section Terminating LSI Chip Using Low-Power Bipolar–LSI Design," IEEE Journal of Solid–State Circuits, vol. 34, No. 1, Jan. 1999, pp. 12–17.

Pottbacker, A. et al., "A Si Bipolar Phase and Frequency Detector IC for Clock Extraction up to 8 Gb/s," IEEE Journal of Solid–State Circuits, vol. 27, No. 12, Dec. 1992, pp. 1747–1751.

"ProSLIC™ Programmable CMOS SLIC/Codec with Ringing/Battery Voltage Generation," Silicon Laboratories datasheet Si3210, Rev. 0.4 Jan. 2000, pp. 1–104, and particularly pp. 35–36 and pp. 22–23.

Razavi, Behzad, "Design of Monolithic Phase–Locked Loops and Clock Recovery Circuits—A Tutorial," Monolithic Phase–Locked Loops and Clock Recovery Circuits—Theory and Design, ed. B. Razavi, IEEE Press, N.Y., 1996, pp. 1–39.

Walker, R. C. et al., "A 100Gb/s Si–Bipolar TX/RX Chipset for Computer Data Transmission," IEEE International Solid–State Circuits Conference, Session 19, Paper 19.1 Slide Supplement, 1998, pp. 19.1–1–19.1–11.

Walker, R. C. et al., "A 1.5 Gb/s Link Interface Chipset for Computer Data Transmission," IEEE Journal on Selected Areas in Communications, vol. 9, No. 5, Jun. 1991, pp. 698–703.

Weston, H. T. et al., "A Submicrometer NMOS Multiplexer-Demultiplexer Chip Set for 622.08–Mb/s SONET Applications," IEEE Journal of Solid–State Circuits, vol. 27, No. 7 Jul. 1992, pp. 1041–1049.

* cited by examiner

| BER Counter | Digital Value |
|---|---|
| > 470 | 31 |
| 400-469 | 30 |
| 335-399 | 29 |
| 280-334 | 28 |
| 230-279 | 27 |
| 180-229 | 26 |
| 135-179 | 25 |
| 95-134 | 24 |
| 64-94 | 23 |
| 46-63 | 22 |
| 33-45 | 21 |
| 22-32 | 20 |
| 16-21 | 19 |
| 11-15 | 18 |
| 7-10 | 17 |
| 5-6 | 16 |
| 4 | 15 |
| 3 | 14 |
| 2 | 13 |
| 1 | Use SubBER |

FIG. 27A

| SubBER Counter | Digital Value |
|---|---|
| > 200 | 12 |
| 150-199 | 11 |
| 100-149 | 10 |
| 65-99 | 9 |
| 34-64 | 8 |
| 18-33 | 7 |
| 10-17 | 6 |
| 6-9 | 5 |
| 4-5 | 4 |
| 3 | 3 |
| 2 | 2 |
| 1 | 1 |

FIG. 27B

- Jitter: 0 UI
- Transition density: 1/2

- Jitter: 5 UI, 100 kHz
- Transition density: 1/2

- Jitter: .5 UI, 5 MHz
- Transition density: 1/2

- Jitter: 0 UI
- Transition density: 1/6

- Jitter: 5 UI, 100 kHz
- Transition density: 1/6

- Jitter: .5 UI, 5 MHz
- Transition density: 1/6

- Jitter: 0 UI

- Transition density: 1

- Jitter: 5 UI, 100 kHz

- Transition density: 1

- Jitter: .5 UI, 5 MHz
- Transition density: 1

AUTO-DETECTION BETWEEN REFERENCELESS AND REFERENCE CLOCK MODE OF OPERATION

CROSS-REFERENCE TO RELATED APPLICATION

This application is a continuation-in-part of application entitled "Integrated Circuit Incorporating Auto Detection of an Externally Provided Reference Clock Frequency and Method Therefor", application Ser. No. 09/902,543, flied Jul. 10, 2001 (which application claims the benefit of provisional Application Nos. 60/217,207 and 60/217,208, filed Jul. 10, 2000), and claims the benefit of U.S. Provisional Application No. 60/302,932, filed Jul. 3, 2001, which application is incorporated herein by reference in its entirety.

BACKGROUND OF THE INVENTION

1. Field of the Invention

The present invention relates to data communication systems and more particularly to use of an externally provided reference clock by circuits used in acquisition of a timing signal associated with the data communication

2. Description of the Related Art

Communication systems frequently transmit data in which the clock is embedded in the data stream rather than sent as a separate signal. When the data stream is received, a clock and data recovery circuit recovers the embedded clock and retimes the received data to the recovered clock. Traditionally, a phase-locked loop (PLL) has been used to perform the clock recovery operation. FIG. 1 shows a block diagram of a traditional PLL configured for a clock and data recovery application. The phase-locked loop 100 includes a phase detector 102, which receives the input data signal conveyed on node 104 and also receives the VCO output clock signal conveyed on node 106 from the voltage controlled oscillator (VCO) 108. The phase detector 102 generates an error signal 10, which is a unction of the phase difference between the input data signal and the VCO output clock signal. The phase detector 102 may also include additional circuitry to generate the reconstructed data on output node 114.

In order to help the VCO acquire the frequency of the input data stream, it has been common to use a reference clock to center the VCO output frequency for a nominal output that approximates the frequency of the input data stream. In a typical application, the VCO will multiply the reference clock by a predetermined (or selectable factor), e.g., 16, to achieve the nominal VCO output. For example, if the multiplication factor is 16, for a 2.7 Gbps data rate, the reference clock is 168.75 MHz. The requirement for a reference clock (generally differential) adds both cost and design complexity to the system in which a clock and data recovery circuit resides. The clock has to be supplied by a relatively high cost crystal oscillator component and distributed to the clock and data recovery circuit using design practices appropriate for high speed clock signals.

In addition to using the reference clock to center the nominal output of the PLL, the reference clock is also used to determine whether lock has been achieved. Typical lock-detect circuitry compares the reference clock to a divided down version of the recovered clock, and if the difference between the two clocks is sufficiently high, the PLL is determined to be out-of-lock.

In some cases the frequency of the reference clock may be chosen to be one of several possible frequencies, and the internal VCO operates at the same frequency, irrespective of which one of the reference clock frequencies is provided. In this case the divider which generates the divided-down VCO clock must change its divide value to properly generate a clock having a frequency nominally equal to the external reference clock. In other cases the VCO may always operate at a fixed multiple of the externally provided reference clock. Nonetheless, it may still be desirable to know which of the possible reference clock frequencies is being provided to the device so that, for example, certain characteristics of the phase locked loop may be optimized for the particular frequency of operation.

Traditionally, integrated circuit devices which may be operated with more than one reference clock frequency include one or more additional external input pins to communicate to the device which of the frequencies is being provided to the device. For example, if any of four different reference clock frequencies may be used, two additional input pins are traditionally provided to the device, and a binary code is conveyed on the pair of pins to identify which of the reference clock frequencies is presented to the device.

Unfortunately, integrated circuit pins are a valuable resource for many integrated circuit devices and allocating two of such pins for a reference clock select function may result in fewer pins available for other, more important functionality requirements, or worse, may simply not be available to allocate at all. Even if extra integrated circuit pins are available for a reference clock select function, the board design or other aspects of the system design are, in all likelihood, more complicated.

One particular application area in which the integrated circuit package size is important is fiber optic transmit and receive electronics that recover timing and drive the optics for serial data communication applications. One example of such a circuit includes a clock and data recovery circuit, which may be housed within an optical module housing where space is very critical.

What is desired is an improved technique which allows a communication system to acquire a clock signal embedded in an input data stream without having to use a reference clock signal and which also allows the use of a reference clock signal if desired. It would be further desirable to detect, without requiring the use of dedicated input pins, referenceless mode of operation in which no reference clock is used and reference clock mode of operation and to further detect which of several possible reference clock frequencies are being received if a reference clock is being used.

SUMMARY OF THE INVENTION

An integrated circuit determines which of two possible modes of operation, a referenceless or reference clock mode of operation, is used based on a detected frequency of an externally-provided frequency reference signal. The frequency is detected without any additional externally provided signal to indicate the mode of operation or the frequency of the reference clock. If the frequency detection circuit detects a frequency below a predetermined threshold, referenceless mode of operation is indicated. Otherwise, reference clock mode of operation is indicated. In referenceless mode of operation such operations as frequency acquisition and lock detect are performed without the use of a reference clock. In reference clock mode the reference clock is used for such operations as frequency acquisition and lock detect.

In one embodiment an integrated circuit includes an input terminal for receiving an input signal and a frequency detection circuit responsive to a detected frequency of the input signal, to determine according to the detected frequency whether the integrated circuit is operating in a referenceless mode of operation or in a reference clock mode of operation.

Theses and other objects, features, and advantages of the present invention may be more fully appreciated upon review of the detailed description given below.

BRIEF DESCRIPTION OF THE DRAWINGS

The present invention may be better understood, and its numerous objects, features, and advantages made apparent to those skilled in the art by referencing the accompanying drawings.

FIG. 27A shows a table that indicates one embodiment for assigning digital values indicating a bit error rate.

FIG. 27B shows a table that indicates one embodiment for assigning digital values indicating a bit error rate to achieve greater resolution.

The use of the same reference symbols in different drawings indicates similar or identical items.

DESCRIPTION OF THE PREFERRED EMBODIMENT(S)

In one embodiment, the invention provides an integrated circuit that provides both referenceless mode of operation in which the timing of an input data stream is recovered without the use of a reference clock, and reference clock mode of operation in which more traditional clock and data recovery techniques are utilized. Further, the embodiment provides not only both modes of operation but an ability to determine which mode of operation is appropriate based on the signal present on the input terminal supplying the reference clock. The input terminal may receive a reference clock (having one of a number of possible frequencies), or the input terminal, in one embodiment is tied to a fixed voltage level, e.g., ground to indicate that no reference clock is being supplied and the integrated circuit should operate in referenceless mode of operation. Before a detailed description is provided for detecting the appropriate mode of operation, a detailed description of referenceless mode of operation is being provided.

Figure 1:
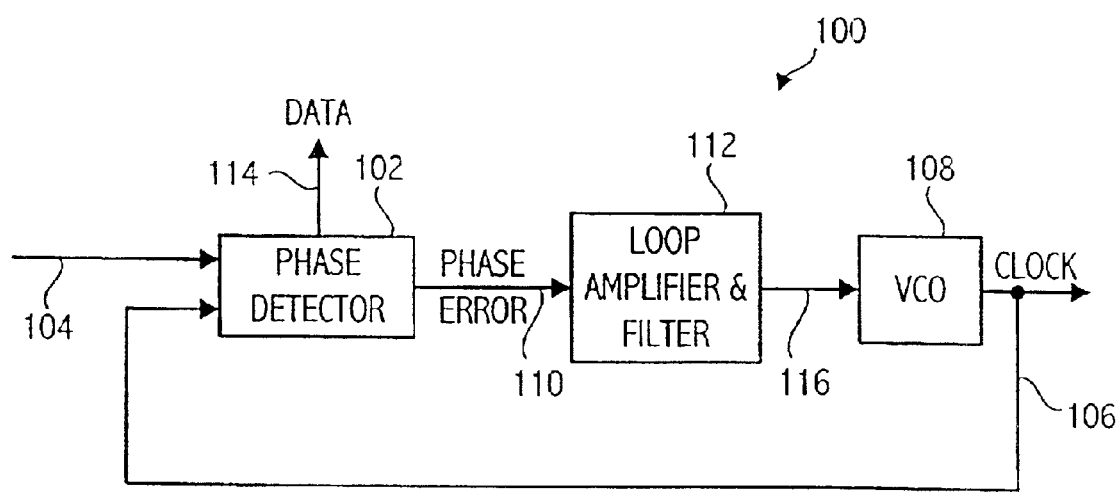
FIG. 1 shows a block diagram of a traditional PLL configured for clock and data recovery operations.
Figure 2:
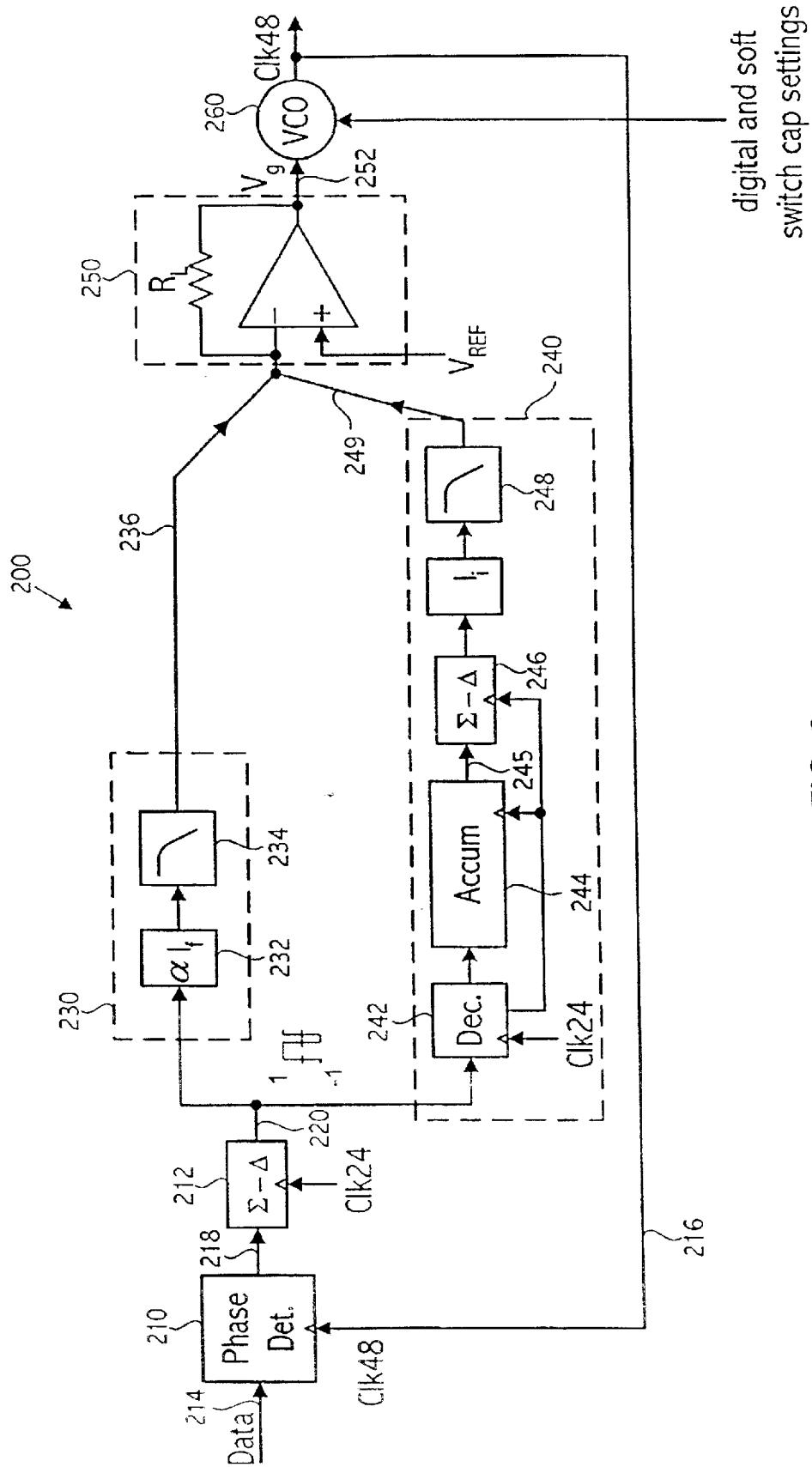
FIG. 2 shows a clock and data recovery architecture that can be modified for use with the present invention.

Referring to FIG. 2, a clock and data recovery architecture 200 that can be utilized in conjunction with the present invention is illustrated. As seen in FIG. 2, a phase detector 210, an augmented version of which is described further herein, is followed by a delta-sigma modulator 212. The phase detector 210 compares the phase of the input data signal conveyed on node 214 to the phase of the recovered clock signal conveyed on node 216, and generates a pulse width modulated error signal waveform. In this example, the error signal is a current waveform flowing into or out of node 218. The delta-sigma modulator 212 then converts the pulse width modulated error signal into a discrete-time and discrete-amplitude digital output signal, in this example generating a one-bit digital output on its output node 220.

Figure 3:
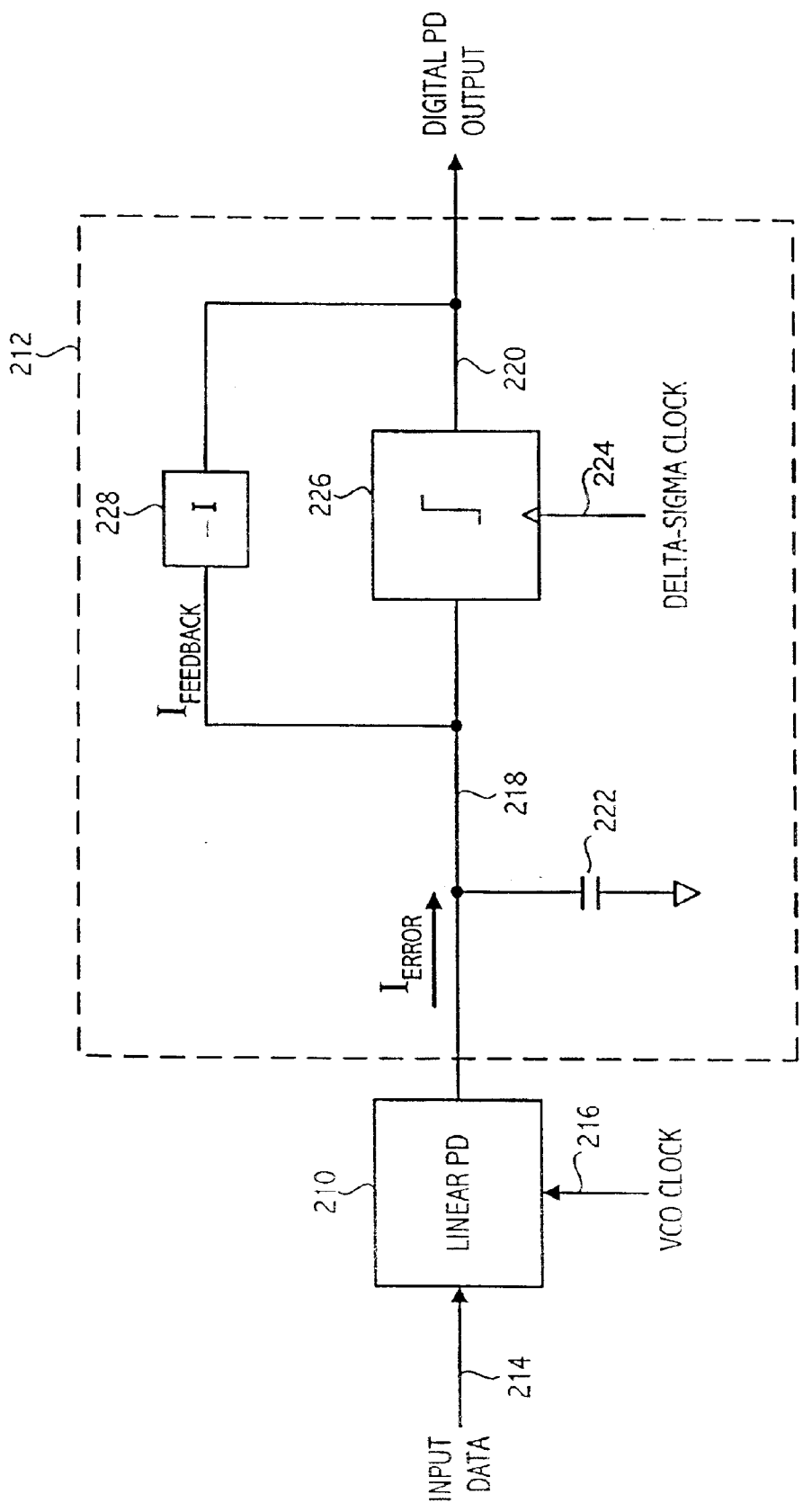
FIG. 3 shows additional details of the clock and data recovery circuit shown in FIG. 2.

As shown in greater detail in FIG. 3 in one embodiment, the delta-sigma modulator 212 includes a modest-sized (e.g., having a typical value of 2–3 pF) integrating capacitor 222 connected to node 218, and further includes a digital comparator block 226 which samples the voltage on its input node 218 when clocked by a delta-sigma clock received on clock node 224. The digital output generated on the output node 220 is fed back as a negative current by feedback block 228 into node 218 to provide the requisite feedback into the integrating capacitor 222 of the delta-sigma modulator. Operation of such first-order delta-sigma modulators is well-known to one skilled in the art. Further details on the clock and data recovery circuit shown in FIG. 2 can be found in application No. 60/217,208, filed Jul. 10, 2000, which is incorporated herein by reference in its entirety.

Referring again to FIG. 2, the loop filter for this clock and data recovery circuit includes a feedforward path 230 formed by a gain block 232 and a filter block 234, and further includes a digital integrating path 240. The output signal of the feedforward path 230, which is conveyed on node 236, and the output signal of the digital integrating path 240, which is conveyed on node 249, are combined by summer block 250 to generate a control signal ($V_g$) on node 252 for the voltage controlled oscillator 260.

The digital integrating block 240 includes a decimator 242, an accumulator 244, a D/A converter 246, and a filter block 248. The digital accumulator 244, which includes a multiple-bit register to represent the cumulative value of the phase error, receives a decimated digital phase error representation from decimator 242, and increases or decreases the cumulative value accordingly. For example, if the digital phase error representation corresponds to a "leading" phase relationship, the digital accumulator 244 will increase (or alternately, decrease) the cumulative value stored in its output register. Conversely, if the digital phase error representation corresponds to a "lagging" phase relationship, the digital accumulator 244 will decrease (or alternately, increase) its cumulative value stored in its output register. While this and other block diagrams are described using the terminology of a single node connecting the blocks, it should be appreciated that, when required by the context in the various embodiments, such a "node" may actually represent a pair of nodes for conveying a differential signal, or may represent multiple separate wires (e.g., a bus) for carrying several related signals.

As described above, the multiple-bit output register of the digital accumulator 244 holds a digital representation of an integrated value of the phase error. This digital value is preferably communicated on an N-bit wide output bus 245 to the D/A converter 246 which converts the digital representation back into an analog signal. Filter block 248 provides a smoothing function to the reconstructed analog signal. The output of the filter block 248 is then conveyed on node 249 to the summer block 250.

As stated above, because a phase detector having a digital output signal is used, the requirement for a separate analog-to-digital converter, which exists only in the digital integrating block, is eliminated. This allows a low offset to be achieved in the phase error through the feedforward path because both the feedforward path and the integrating path receive the same digital signal.

Figure 4A:
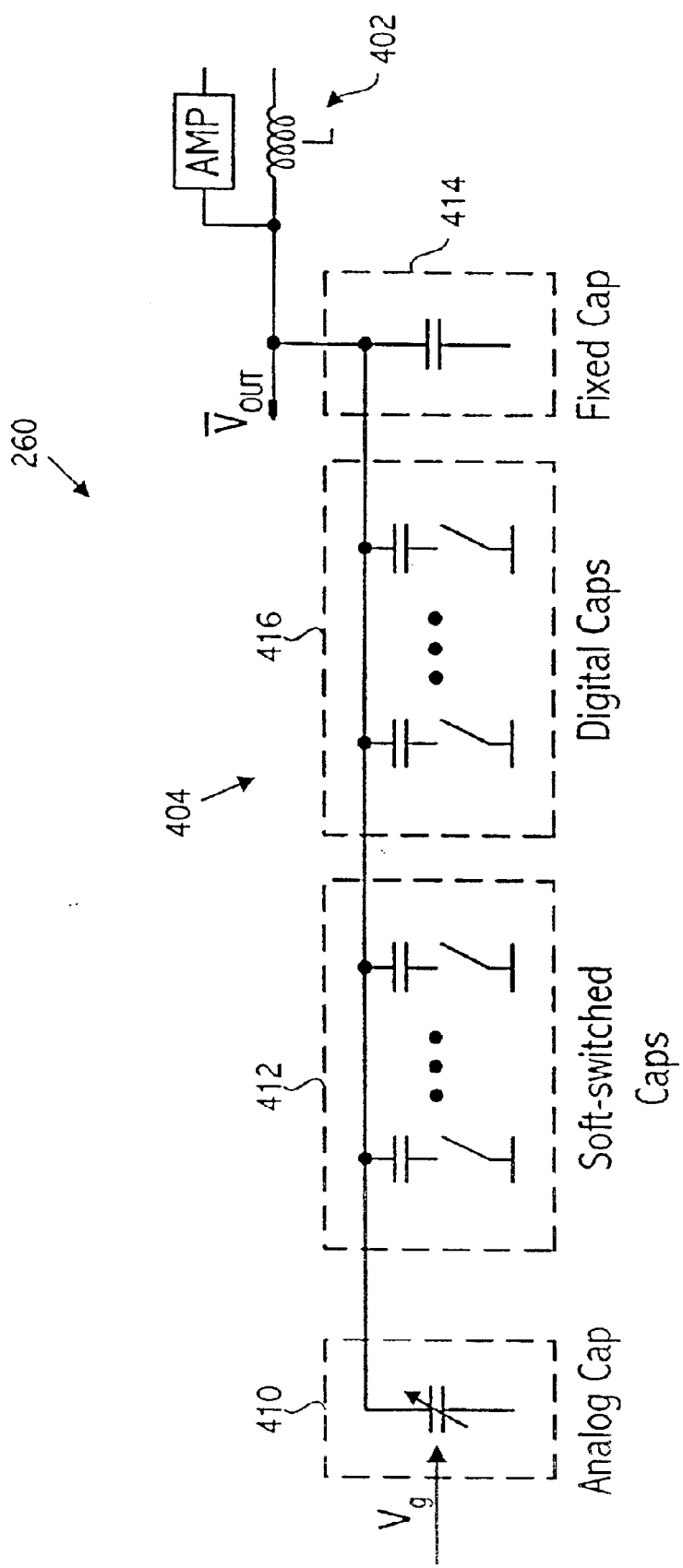
FIG. 4A illustrates an exemplary voltage controlled oscillator (VCO) used in the present invention.

An exemplary voltage controlled oscillator (VCO) 260 is shown in FIG. 4A. In one embodiment, the voltage controlled oscillator is implemented as a tank circuit (an LC oscillator) in which the frequency of oscillation depends on the inductance (L) 402 and capacitance (C) 404. In the illustrated embodiment, the output of the VCO 260 is adjusted by varying the capacitance 404, which includes separately controllable capacitor circuits. The summer circuit supplies the control voltage ($V_g$) on node 252 to adjust the variable capacitance 410 circuit. The voltage $V_g$ controlling the capacitance setting is an analog voltage and thus the capacitance is indicated as being an analog capacitance. In addition to the variable capacitance circuit 410, variable capacitance circuit 412 accounts for drift and other long term variations that can affect operation of the VCO. The fixed capacitance 414 is used to provide a capacitance that approximates the desired value and can represent parasitic capacitance in the circuit. Variable capacitance circuit 416 provides a digitally controlled variable capacitance that can be used, as described further herein, to acquire the frequency of the input data stream without the use of a reference clock. Variable capacitance 416 in one preferred embodiment includes variable capacitors configured to allow coarse grained, medium grained and fine grained adjustment of capacitance settings as described further herein. An exemplary variable capacitance circuit is shown in FIG. 4B.

Figure 4B:
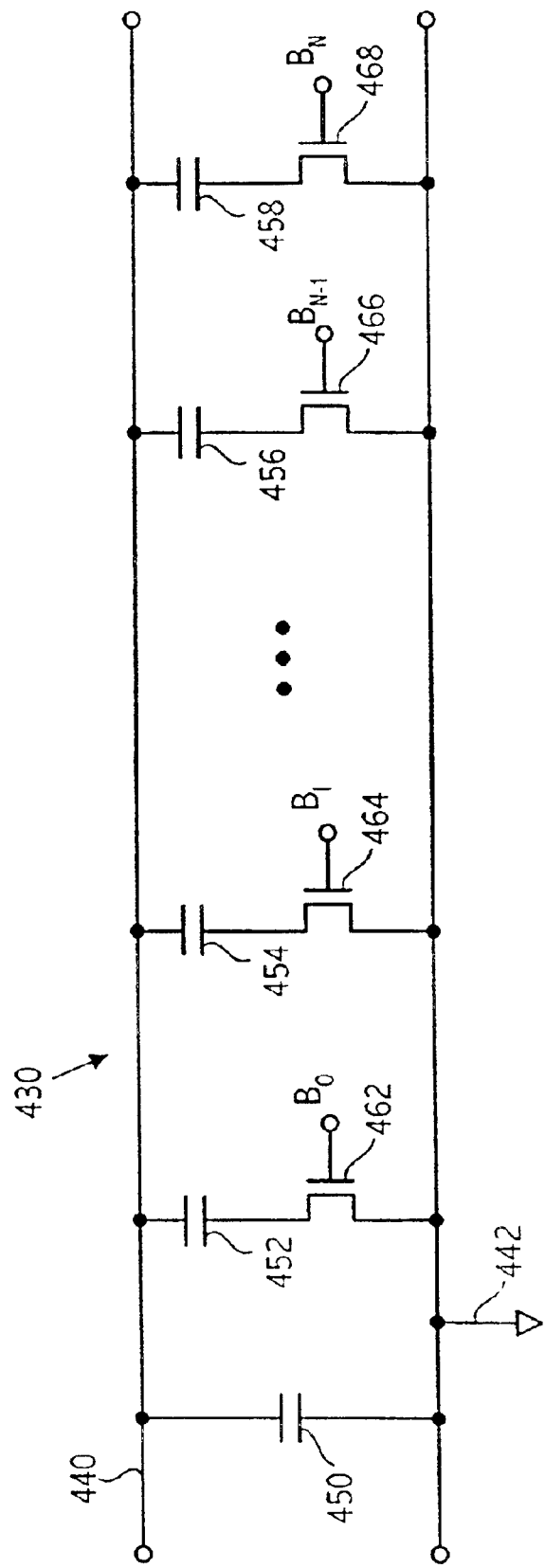
FIG. 4B is a circuit diagram of an illustrative embodiment for one of the banks of capacitors utilized in the VCO shown in FIG. 4A.

FIG. 4B is a circuit diagram of an illustrative embodiment for one of the banks of capacitors 430 utilized as part of variable capacitance 416. FIG. 4B includes a fixed capacitor 450 that represents parasitic capacitance plus any desired fixed capacitance. Discrete capacitance variations are achieved through a plurality of selectively activated capacitor and transistor pairs. FIG. 4B shows a first of these capacitor/transistor pairs, as capacitor 452 connected between ground 442 and the signal line 440 through the drain and source terminals of an NMOS transistor 462. NMOS transistor 462 acts as a switch to add in or leave out the capacitor 462 in the overall capacitance of the discretely variable capacitance 430. The "on" or "off" state of NMOS transistor 462 is controlled by a first bit ($B_0$) of a digital control word supplied from control logic as described further herein. Similarly, additional capacitors 454, 456, and 458 are connected to ground 442 through NMOS transistors 464, 466, and 468, respectively. The NMOS transistors 464, 466 and 468 are controlled by bits $B_1 \ldots B_{N-1}$, $B_N$, of a digital control word selecting the capacitance setting.

For the circuit depicted in FIG. 4B with simple capacitor/switch circuits connected together in parallel, the total capacitance for the discretely variable capacitance 430 is equal to the sum of all of the capacitors having their respective switches in the "on" state. Note that the capacitors may all have the same value, providing for linear capacitance stepping or the capacitors may be of different values providing non-linear capacitance stepping. In the latter case, turning on one transistor will have a different effect than turning on another transistor. Numerous weighting schemes are possible, and the implemented weighting scheme depends upon the particular design considerations involved. Additional details on the capacitor/switch circuits and the VCO can be found in U.S. Pat. No. 6,137,372, entitled "Method and Apparatus for Providing Coarse and Fine Tuning Control for Synthesizing High-Frequency Signals for Wireless Communications", which is incorporated herein by reference in its entirety.

In an exemplary embodiment, the variable capacitance 416 includes multiple banks of capacitors 430 to provide coarse, medium and fine-grained control over the capacitance. The coarse bank of capacitors includes seven capacitor/switch circuits each controlled by one bit of a seven bit coarse grained digital control word. A medium bank of capacitors includes eight capacitor/switch circuits each controlled by one bit of an eight bit medium-grained control word. Finally, a fine bank of capacitors is provided with 6 capacitors/switch pairs controlled by a six bit digital control word. The coarse, medium, and fine banks of capacitors allow control over total capacitance with increasing granularity. In an exemplary embodiment, the capacitors in the coarse bank are 300 femtoFarads each, in the medium bank, 38 femtoFarads and in the fine-grained bank, 9 femtoFarads. The use of the variable capacitance 416 to acquire frequency of an input data stream without the use of a reference clock is described further herein.

Before a description of the use of the architecture shown in FIG. 2 in referenceless frequency acquisition is described in more detail, a description of the operation of the phase detector 210 is provided to better understand use and operation of the augmented phase detector described herein.

Figure 5:
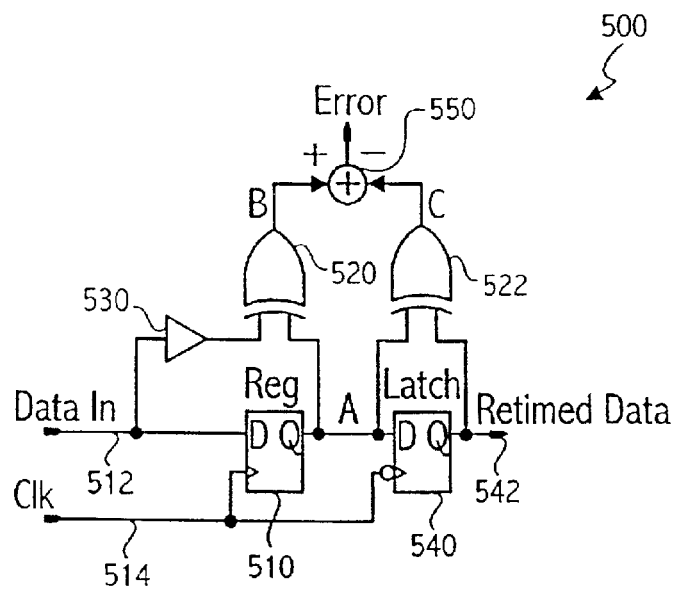
FIG. 5 depicts a common phase detector.

FIG. 5 depicts a common phase detector that is generally well known in the art. In this circuit, a register 510 samples the input data signal conveyed on node 512 when clocked by the sample clock signal conveyed on node 514. The sample clock signal conveyed on node 514 is the recovered clock from the input data signal. XOR gate 520 generates on its output node B a variable-width pulse of duration generally equal to the time by which an input data signal transition leads the corresponding transition on node A, the output of register 510, which is controlled, of course, by the recovered clock conveyed on node 514. The delay block 530 is included to compensate for the clock-to-Q delay of register 510. When the data clock is correctly aligned to the input data signal (i.e., data clock transitions at precisely the mid-point of the data bit-intervals), the register 510 generates on its output node A, a signal that replicates the input data signal, but delayed by one-half period of the data clock, and the pulse on node B is of a duration exactly equal to one-half period of the data clock.

The latch 540 generates on its output node 542 a signal which replicates its input signal delayed by one-half period of the recovered clock. As a result, the second XOR gate 522 generates on its output node C a pulse with a duration that is equal to one-half of the period of the recovered clock. The fixed-duration pulse signal conveyed on node C is subtracted from the variable-width pulse signal conveyed on node B by summing block 550 to generate a phase error signal used to adjust the recovered clock.

Figure 6:
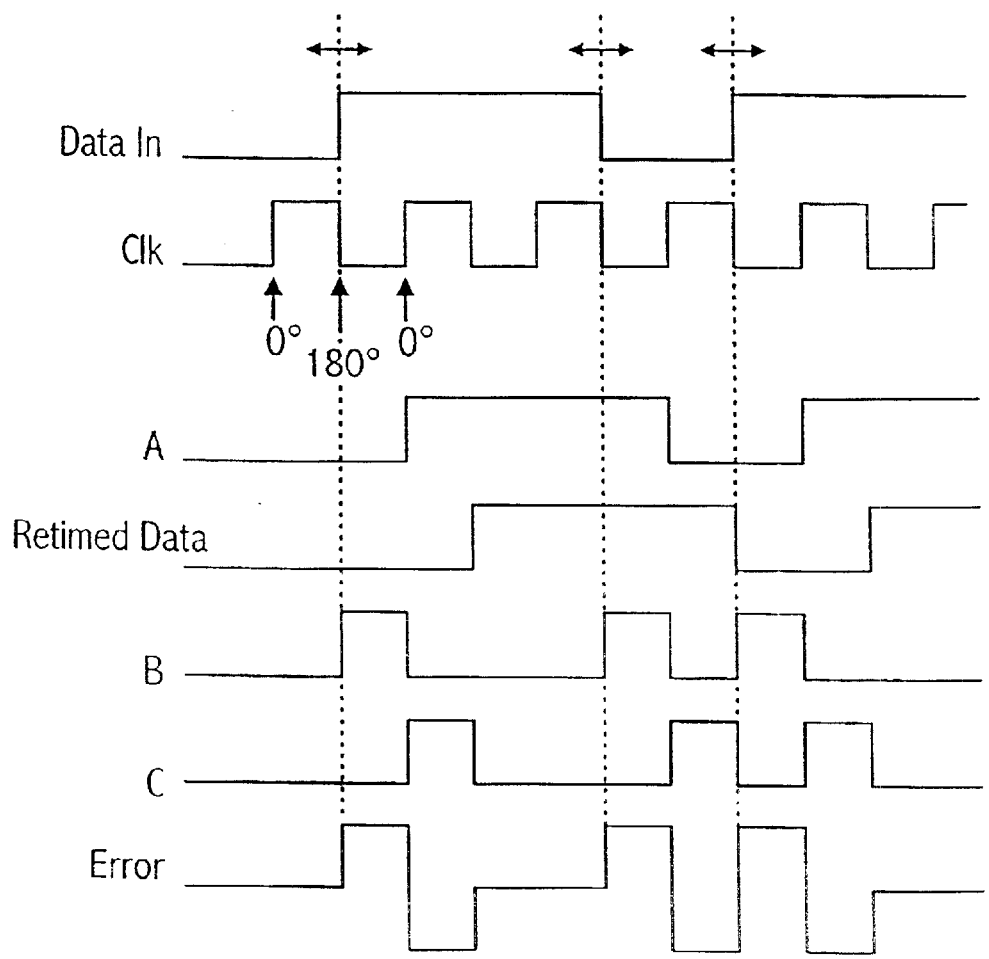
FIG. 6 shows a timing diagram illustrating operation of the phase detector shown in FIG. 5.

Operation of the phase detector shown in FIG. 5 is illustrated by the timing diagram shown in FIG. 6. When the data clock is correctly aligned, as illustrated in FIG. 6, both pulse signals have equal duration, and the summing block 550 generates a zero-valued net error current. If the input data transition arrives too early, the pulse signal on node B is longer than the pulse signal on node C, and a net error current is generated by the summing block 550. The remainder of the PLL is arranged to respond to the error current to adjust the phase of the data clock (i.e., the VCO output).

While FIG. 5 shows single-ended logic blocks and signals, in practice such circuits are typically implemented using fully differential circuitry, which provides enhanced noise immunity, better speed, and more consistent delays which are independent of data state. Moreover, many of the circuit blocks, such as the summing block 550, are more easily implemented and achieve better matching of currents when implemented differentially, thereby resulting in lower offsets.

As described previously, one method of determining if the VCO is correctly locked to the clock embedded in the input data stream is to compare the recovered clock to a reference clock. If a reference clock is unavailable, another approach has to be used both for initially setting the VCO frequency and for determining if lock has been achieved. As described further herein, frequency detection can be accomplished by detecting whether transitions fall into a predetermined phase zone (also referred to herein as a "forbidden zone") of the data clock used in the phase detector. The "forbidden zone" is a predetermined portion of the period of the sample clock used in the phase detector. When the PLL is in-lock, transitions typically will not fall into this zone. When the PLL is out-of-lock, transitions will often fall into the zone. By performing a test over many trials to determine whether data transitions in the input data stream are falling into the forbidden zone, it can be statistically inferred whether the PLL is in-lock.

Figure 7:
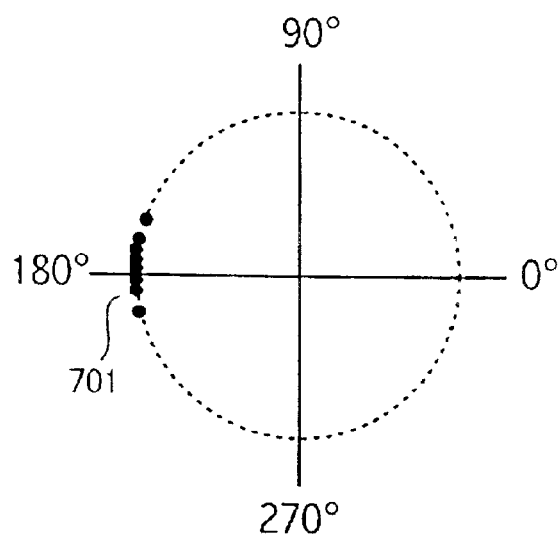
FIG. 7 illustrates the ideal placement of data transitions within the phase window of the clock used to sample the data.
Figure 8:
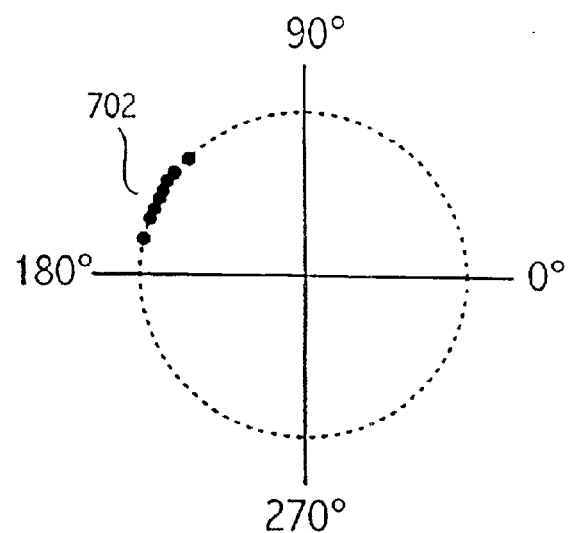
FIG. 8 illustrates the movement of the transitions clockwise with respect to the 180 degree point of the sample clock in the phase detector.
Figure 9:
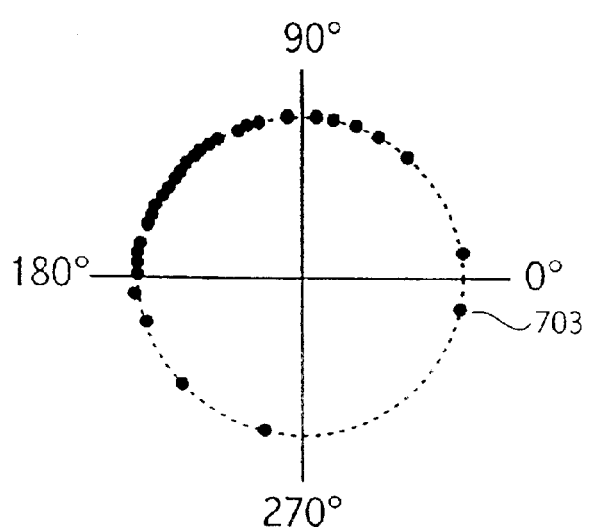
FIG. 9 illustrates the effect of phase offset and increased jitter amplitude on the location of the data transitions.

Referring again to FIGS. 5 and 6, the first register 510 of the phase detector 500 samples the data at 0 degrees, i.e., the leading edge of the recovered clock used to sample the data. Thus, data transitions of the input data stream ideally occur around 180 degrees with respect to the recovered clock to maximize the likelihood that a transition is detected given the existence of jitter and phase offset. FIG. 7 illustrates the preferred placement of data transitions 701 assuming low jitter. FIG. 8 illustrates the influence of phase offset on the placement of data transitions with respect to the phase of the recovered clock being used to sample the data in the first register of the phase detector 500 in FIG. 5. As can be seen in FIG. 8, the transitions have moved clockwise with respect to the recovered clock. FIG. 9 illustrates the effect of phase offset and increased jitter amplitude. The data transitions can be seen to be more distributed in the phase of the recovered clock. If the jitter is sufficiently high, it can lead to bit errors such as transition 703.

Figure 10:
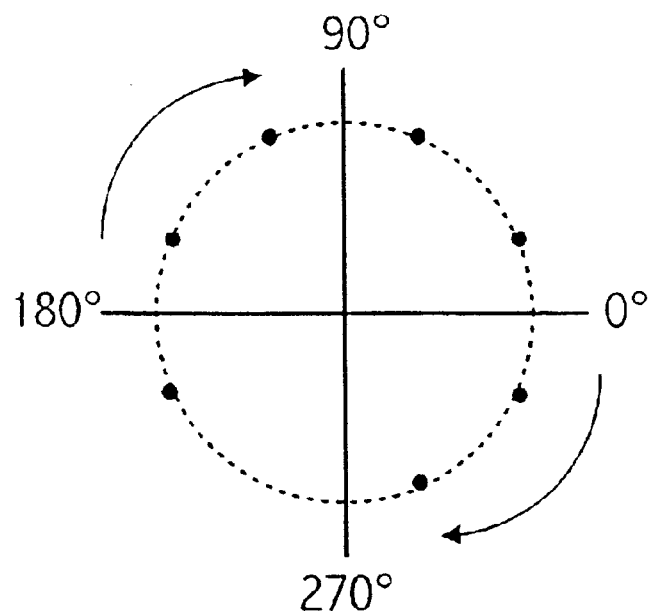
FIG. 10 shows the movement of the data transitions from quadrant to quadrant as a result of frequency offset.

If the PLL is trying to acquire the frequency of a clock embedded in an input data stream and no reference clock is available, the effect of frequency offset is one approach that can be used to determine whether the frequency is too high or too low and adjust the sample clock frequency accordingly. Frequency offset is the difference in frequency between the input data stream and the sample clock, and causes the data transitions in the input data stream to travel from quadrant to quadrant as shown in FIG. 10. The speed at which the transitions travel from quadrant to quadrant increases as the frequency offset increases. The direction of travel (clockwise or counterclockwise) indicates whether the frequency error is positive or negative. The number of transitions that occur in a quadrant before the transitions enter a new quadrant is a function of the magnitude of the frequency offset and the data transition density (assuming, e.g., a non-return to zero (NRZ) encoding).

Thus, one method of frequency detection is to determine the frequency offset by determining the order of the quadrants that the data transitions go through. That order indicates the direction of travel of the transitions and thus can be used to alter the VCO output positively or negatively according to the sign of the frequency error. However, that approach has several disadvantages. One problem is that the range of frequency detection is limited. The range of frequency detection is in part a function of the data transition density. A low transition density increases the difficulty in resolving the direction of travel of the transitions. Additionally, the range of frequency detection is limited because it is a function of quadrant sizes. A larger frequency offset can cause larger intervals between transitions in the quadrants, which can also increase the difficulty in resolving transition direction. In addition, quadrature phases are required for the largest frequency detection range, which can be difficult to implement with an LC oscillator.

Figure 11:
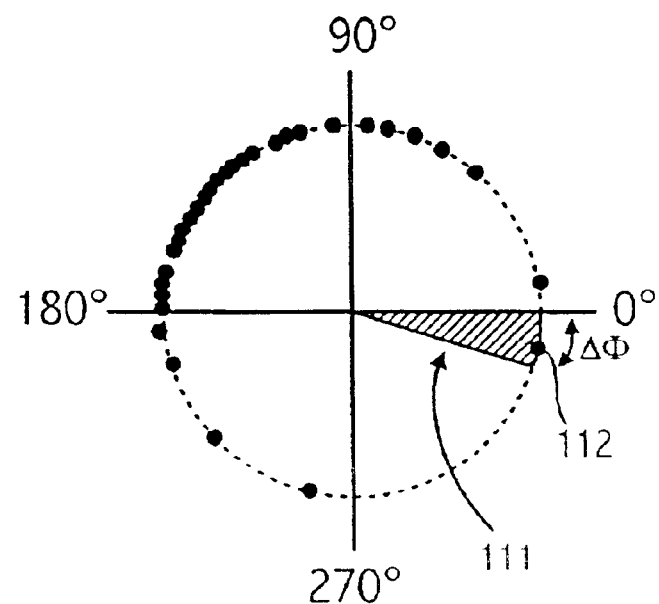
FIG. 11 illustrates the "forbidden zone" of the sample clock.

In view of those limitations, another approach can be used to detect the frequency of an input data stream that overcomes those problems. Referring to FIG. 11, a small phase window or "forbidden zone" 111 can be defined. Any transitions, such as transition 112, that occur in that phase window 111, are assumed to be bit errors. The phase window 111 (also shown as Δφ) should be placed on the side of the zero degree mark that is farthest from the placement of the data transitions that occur due to phase offset. There may be a systemic offset due to, e.g., circuit delays, as well as random offset. The systemic offset in one embodiment rotates the placement of the data transitions clockwise from the 180 degree mark. Thus, the forbidden zone in such an embodiment is offset in a clockwise direction from the zero degree mark as shown in FIG. 11. In other embodiments, the phase zone can reside on the other side of the zero degree point.

Figure 12A:
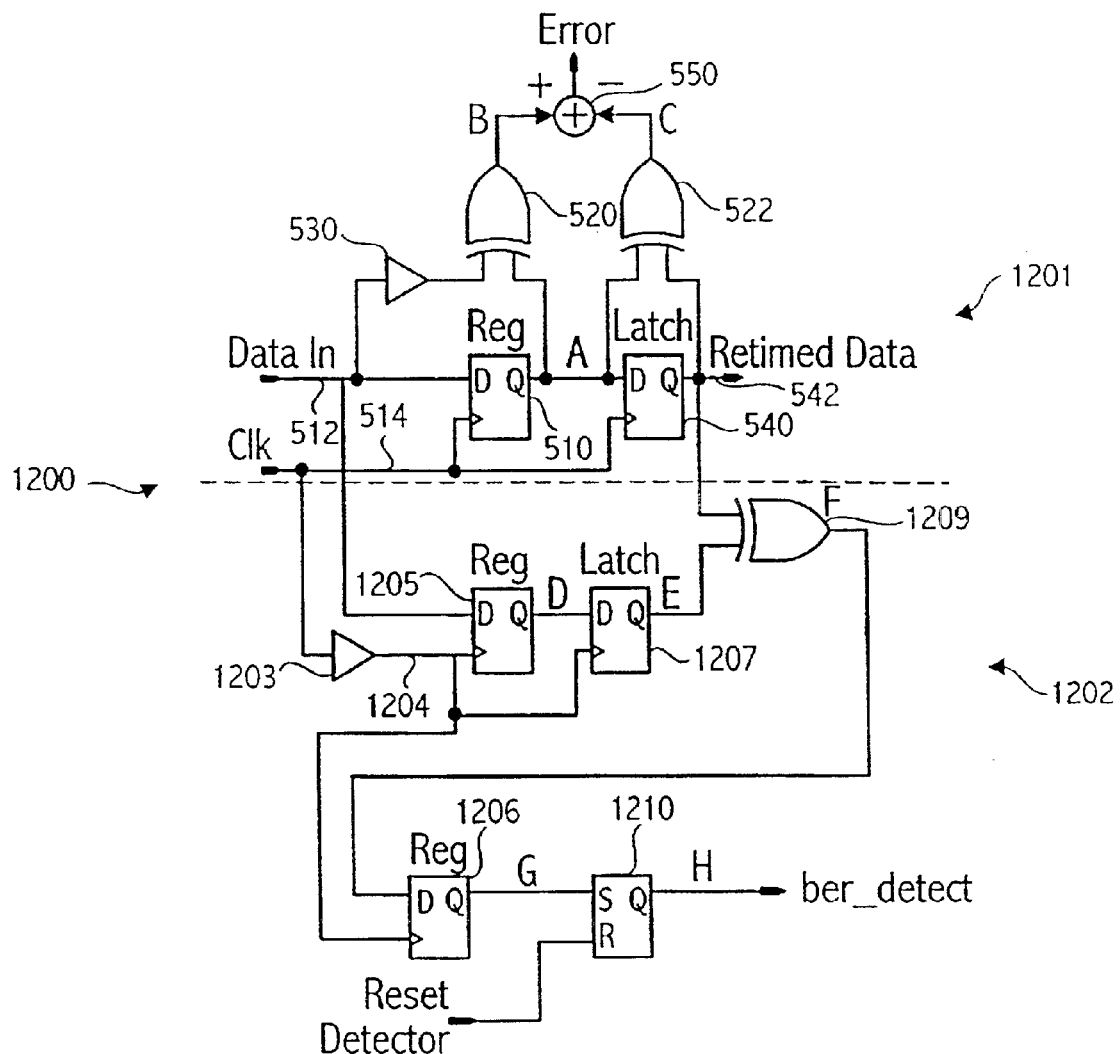
FIG. 12A illustrates an augmented phase detector circuit that detects transitions in the forbidden zone.

If the PLL has not locked to the frequency of the input data stream, data transitions will eventually fall into the forbidden zone. That information can be used to determine whether the PLL has locked, and if it has not, adjust the output of the VCO until it does. The "forbidden zone" approach requires a circuit that detects transitions that occur in the forbidden zone. FIG. 12A illustrates a simplified augmented phase detector circuit 1200 that detects transitions in the forbidden zone. Comparing the phase detectors in FIG. 12A and FIG. 5, it can be seen that the top half 1201 of the phase detector circuit 1200 is substantially identical to the phase detector 500 shown in FIG. 5 and operates conventionally to generate an error signal from summer 550 indicating the phase error between the data in signal 512 and the clock signal 514 supplied from the VCO. In addition to the conventional phase detector 1201 illustrated, the phase detector of FIG. 12A further includes forbidden zone circuitry 1202 that detects transitions occurring in the forbidden zone of the clock signal 514. That circuitry includes a delay element 1203 that functions to delay the clock 514 by an amount corresponding to the size of the phase window. In an exemplary embodiment, the delay element 1203 delays the clock by 50–60 picoseconds. The amount of delay depends on such factors as the size of the phase window desired, the bit rate of the input data stream, and the bit error rate of the input data stream. The delayed clock 1204 is supplied to registers 1205 and 1206 and to the latch 1207. The XOR gate 1209 generates a pulse that indicates the difference between the retimed data on node 542 and the delayed data supplied from latch 1207. Note that the latches 540 and 1207 are configured to pass data when the clock is low.

Figure 12B:
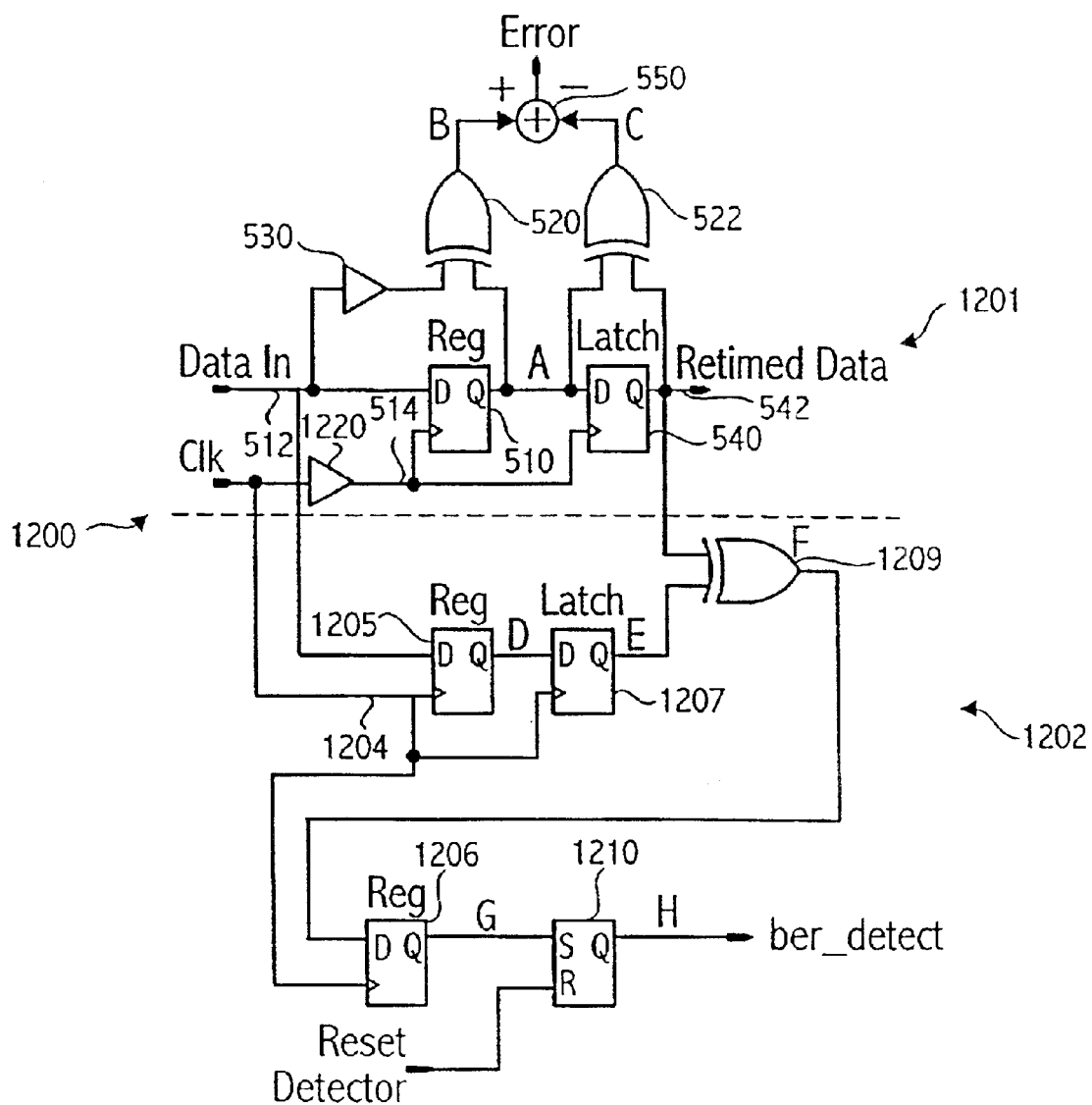
FIG. 12B illustrates another embodiment of an augmented phase detector circuit that detects transitions in the forbidden zone.

FIG. 12B illustrates an alternative embodiment in which the clock for the register 510 is delayed rather than the clock for register 1205. Note also that rather than delaying the clock in either path, the data in either path may be delayed.

Figure 13A:
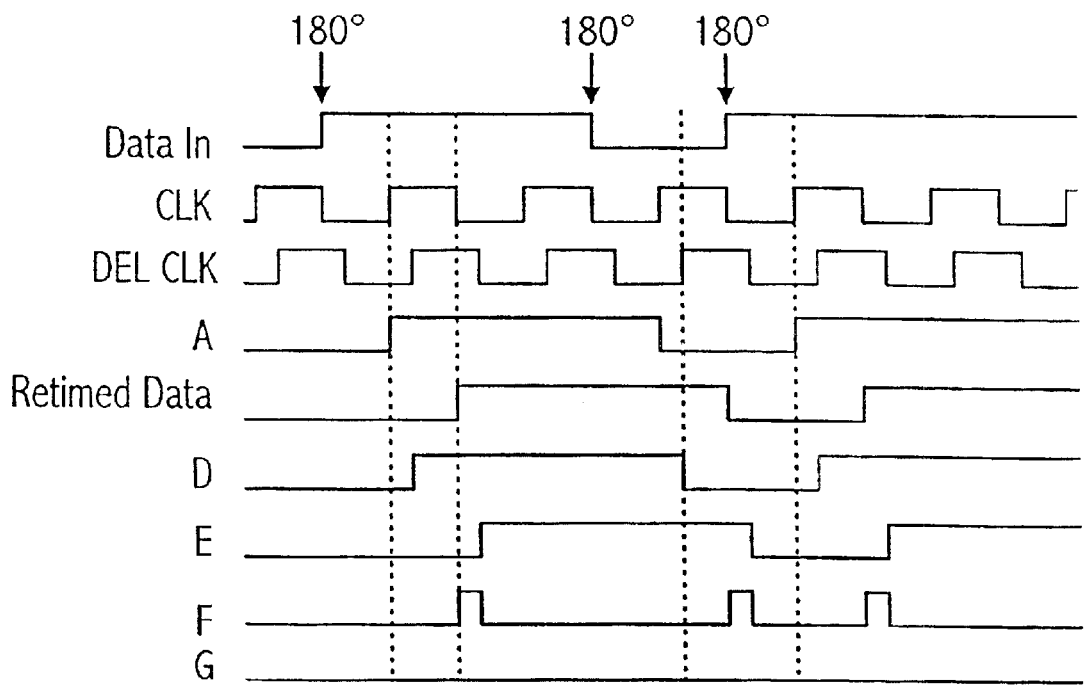
FIG. 13A illustrates data transitions at 180 degrees with respect to the phase of the sample clock signal.

The operation of the circuit of FIG. 12A is illustrated in the timing diagrams 13A and 13B. In FIG. 13A the data is transitioning in the ideal location at 180 degrees with respect to the phase of the clock signal 514 (shown as CLK in FIGS. 13A and 13B). The output from the registers and latches are shown to create a pulse on node F from XOR gate 1209. However, the duration of that pulse is short and therefore is not clocked into register 1206 by the rising edge of the delayed clock (DEL CLK). Thus, no error is detected and the SR latch 1210 is not set.

Figure 13B:
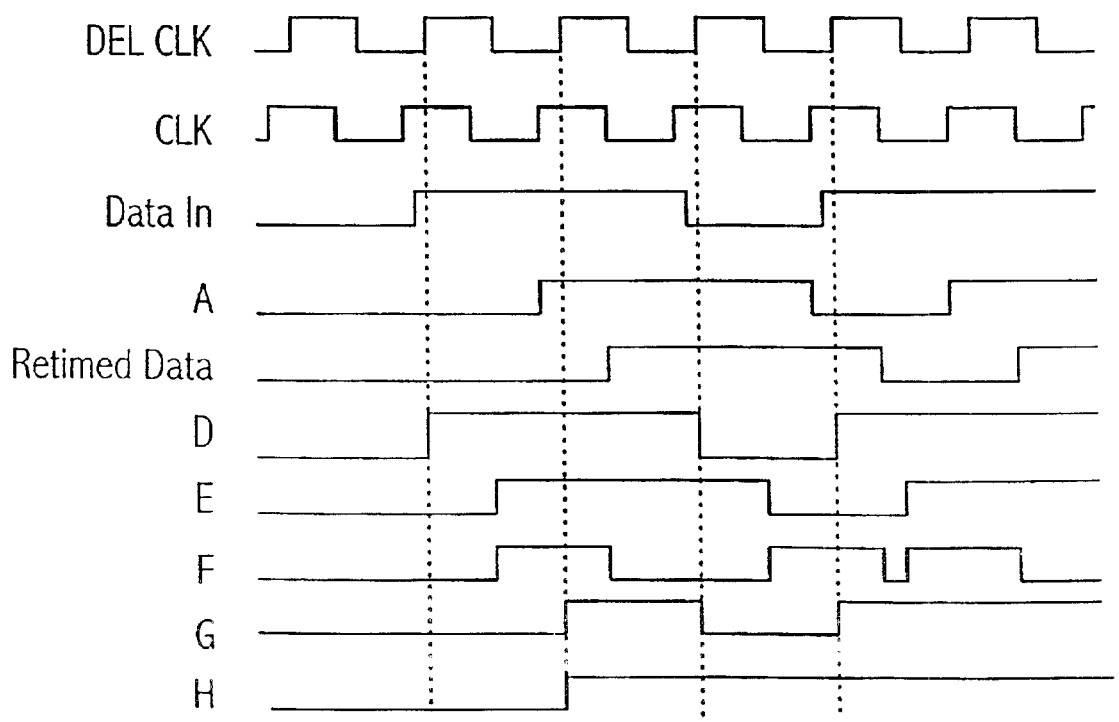
FIG. 13B illustrates the operation of the phase detector shown in FIG. 12A when data transitions occur in the forbidden zone.

Referring to FIG. 13B, the operation of phase detector 1200 is illustrated for the case where data transitions do occur in the forbidden zone. When that occurs, the transition on Data In occurs after the rising edge of CLK conveyed on node 514 and thus is not clocked into register 510. The delayed clock 1204 (DEL CLK in FIG. 13B) is delayed sufficiently to catch the transition and thus the transition is stored in register 1206. As the transition or lack thereof propagates through the latches 1207 and 540, XOR gate 1209 generates a pulse output on node F that is clocked into register 1206 on the rising edge of the delayed clock. That in turn causes the SR latch to be set. The SR latch remains set indicating the existence of a bit error until control logic, described further herein, causes the SR latch to be reset so it can be used to detect another bit error.

As described more fully herein, the ability to detect the forbidden zone transitions allows the VCO output to be adjusted until transitions in the forbidden zone occur at a rate below the allowable bit error rate. The forbidden zone approach requires only a small delay element, e.g., utilizing a buffer, rather than needing to detect in which quadrature of the VCO output clock phase a transition occurs. In addition, the frequency capture range is not limited by those limitations associated with quadrature detection. The quadrature detection approach is "soft" in terms of evaluating whether the PLL is in-lock. The VCO is simply nudged in a certain direction when data shifts through quadrant boundaries. Thus, with a large frequency offset, the quadrature detection method may drift. In contrast, the forbidden zone approach described herein makes "hard" decisions. A frequency offset is evaluated and then a VCO setting is either rejected or accepted. One cannot drift through the same settings as in the quadrature approach, until all VCO settings have been tried.

The probability of entering the forbidden zone in out-of-lock conditions can be made approximately the same for all frequency offsets. That facilitates a clock and data recovery circuit that can operate at a wide range of frequencies. In addition, the detection circuitry and control logic can be mostly built in digital logic allowing for easy implementation and low gate count. That can be particularly advantageous in mixed signal technologies. Note that in the forbidden zone approach, high bit error rates can result in the inability to lock. That will become more obvious as the approach is described in more detail. In contrast, the traditional quadrature approach may be fairly insensitive to bit error rates.

Figure 14:
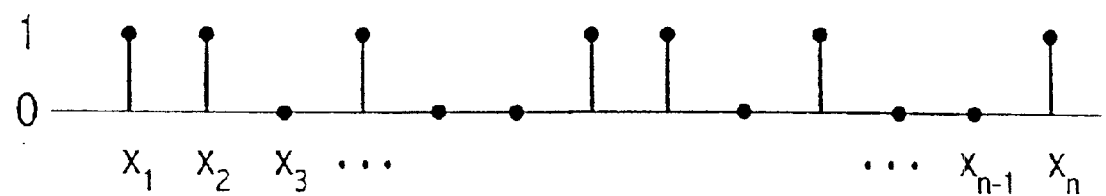
FIG. 14 illustrates a Bernoulli process.

One way to understand the forbidden zone approach is to understand the statistical behavior associated therewith. That statistical behavior can be explained using Bernoulli processes. Referring to FIG. 14, a Bernoulli process is a series of independent Bernoulli trials, where the outcome can be a one or a zero. The probability that $x_i=1$ is defined as p and the probability that $x_i=0$ is therefore $1-p$.

Define k as $$k = \sum_{i=1}^{n} x_i.$$

The probability that $k=k_0$ is:

$$p_k(k_o) = \left(\frac{n!}{(n-k_o)!k_o!}\right) p^{k_o}(1-p)^{n-k_o}$$

A better numerical implementation of that equation is:

$$\frac{n!}{(n-k_o)!k_o!} = \prod_{i=1}^{k} \frac{n-k+i}{i}$$

If a probability of occurrence of an event is p, then the expected value of the first occurrence is:

$$E(l_1)=1/p$$

With that background, assume that $x_i=1$ if any transitions fall into the forbidden zone and that $x_i=0$ if no transitions fall into the forbidden zone. A measurement period T is chosen over which to measure whether any transitions fall into the forbidden zone. For example, T may be 1024 times the period of the rate data. The measurements over period T are repeated over n intervals of time. The number of intervals k is counted in which at least one transition fell into the forbidden zone:

$$k = \sum_{i=1}^{n} x_l$$

That value k is then compared to a critical count value $k_c$, and if $k>k_c$, the PLL is declared out-of-lock. If $k<k_c$, then the PLL is declared in-lock.

Because the PLL is being declared in-lock or out-of-lock based on detection of transitions in the forbidden zone, there exists the possibility of falsely declaring the PLL being out-of-lock because of a high bit error rate (BER) causing transitions to occur in the forbidden zone. There also exists the possibility of falsely declaring lock because sufficient transitions did not fall into the forbidden zone over a period of time. Remember that in a preferred embodiment, the data is encoded in an NRZ format or an equivalent and therefore transition density can vary based on data patterns. The probability of falsely declaring the PLL to be in-lock or out-of-lock should be sufficiently small as to be tolerable in the system in which the forbidden zone detection approach is employed. The specific equations for such probabilities are provided herein.

Note that the size of the forbidden zone can vary as a percentage of the entire period, and that a larger size has the effect of lower jitter tolerance since a larger number of data transitions caused by jitter will be determined to be bit errors.

Assume that transitions occur in the forbidden zone according to the bit error rate (BER). Calculate $P(x_i=0)=(1-BER)^m$, where m is the number of bits in the measurement period, or m=(data rate)(T).

Of course, $P(x_i=1)=1-P(x_i=0)$.

Figure 15:
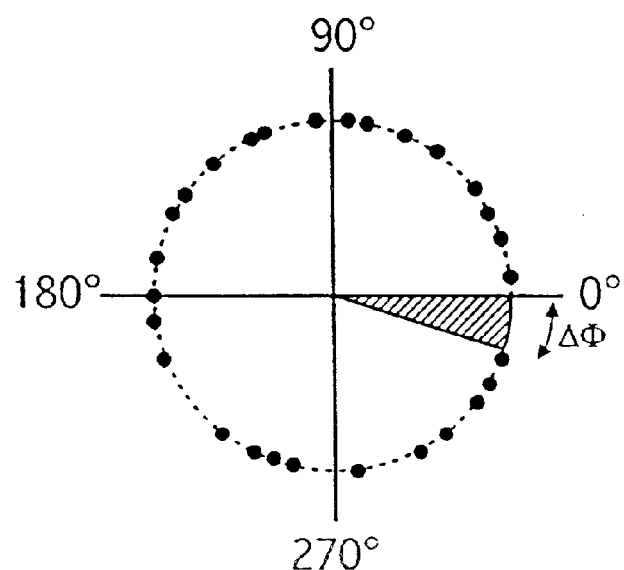
FIG. 15 illustrates uniform distribution of transitions across the phase range.

Assume that transitions are uniformly distributed across the phase range. That is illustrated in FIG. 15. That is roughly true if the period of frequency offset<period of measurement. If that is true, the probability that a transition does not occur in the forbidden zone over a period T is given by, $$P(x_i = 0) = \left(\frac{2\pi - \Delta\Phi}{2\pi}\right)^m,$$

where m is the number of transitions in the measurement period and m=(data rate)(T)(transition density). Of course, $P(x_i=1)=1-P(x_i=0)$.

The desire to achieve a uniform transition distribution when the clock and data recovery (CDR) circuit is out-of-lock leads to the period of frequency offset being less than (or equal to) the period of measurement (evaluation interval). In an exemplary embodiment suitable for meeting SONET specifications, the minimum period of frequency offset is given by the frequency lock-in range of the CDR. For a typical SONET transfer specification, the frequency lock-in range is on the order of 1000 parts per million (ppm). Thus, the minimum offset frequency is approximately (2.5 GHz×1000×10$^{-6}$)=2.5 MHz. That is, the CDR should be able to acquire a frequency that is within 2.5 MHz of the 2.5 GHz data rate. In such an application, the measurement period T=1/(2.5 MHz)=0.4 microseconds.

The probability that $x_i=1$ (incorrect decision) when PLL is actually in-lock is given by, $$P(x_i=1)=1-(1-BER)^m,$$

where m is the number of bits in the measurement period, that is m=(data rate)T.

The probability that that $x_i=1$ (correct decision) when PLL is not in-lock is given by, $$P(x_i = 1) = 1 - \left(\frac{2\pi - \Delta\Phi}{2\pi}\right)^m,$$

where m is the number of transitions in the measurement period, $$m=\text{(data rate)}T\text{(transition density)}$$

The probability of falsely asserting out-of-lock when PLL is in-lock is given by $$p(k > k_c) = \sum_{i=k_c+1}^{n} \left(\frac{n!}{(n-i)!i!}\right) p^i (1-p)^{n-i}$$

where $$p=1-1(1-BER)^{(\text{data rate})T}$$

The probability of falsely asserting lock when the PLL is out-of-lock is given by, $$p(k <= k_c) = \sum_{i=n-k_c}^{n} \left(\frac{n!}{(n-i)!i!}\right)p^i(1-p)^{n-i}, \text{ where}$$

$$p = \left(\frac{2\pi - \Delta\Phi}{2\pi}\right)$$

Exemplary curves for various bit error rates and various sizes of the forbidden zone will be provided after embodiments of the augmented phase detector circuit and the control circuitry used to adjust the capacitance of the LC oscillator, used for the variable oscillator in one embodiment of the invention, are examined in greater detail.

Figure 16:
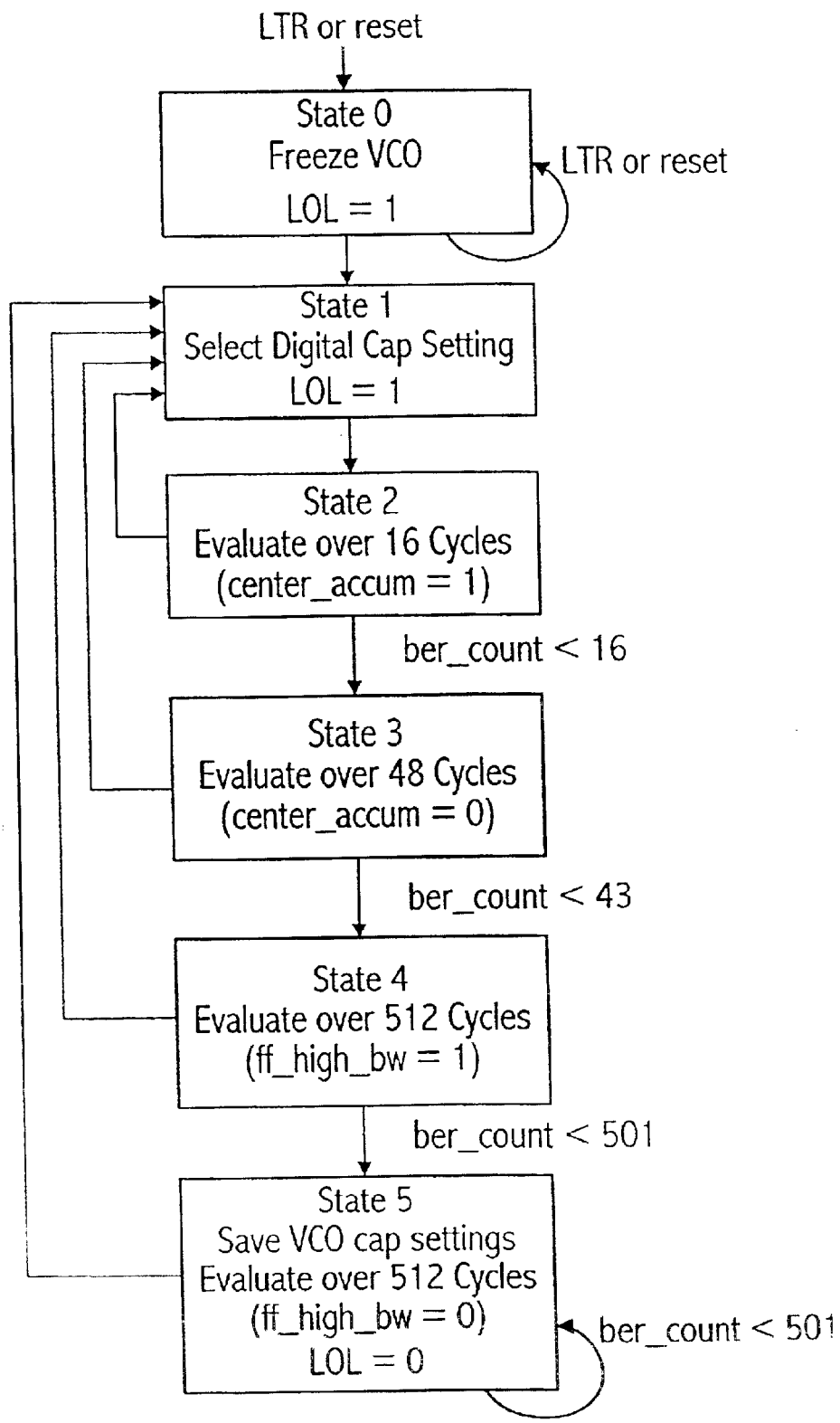
FIG. 16 illustrates an exemplary high level flow diagram of the control structure utilized to acquire a frequency.

Referring now to FIG. 16, an exemplary high level flow diagram is shown that illustrates an embodiment of the control structure utilized to acquire a frequency. The state machine of the exemplary clock and data recovery circuit (CDR) begins in state 0, which is entered as a result of a power on (or other) reset or because of assertion of a lock to reference (LTR) signal. The lock to reference signal causes the CDR to lock to a reference clock (if available) or to stored capacitance values of the VCO as described further herein. In state 0, the loss of lock (LOL) signal is asserted indicating that the clock and data recovery circuit has not yet locked. When neither reset nor LTR is being asserted, the CDR enters state 1 and begins the task of acquiring the input frequency.

In state 1, an impedance setting is chosen. Prior to, or on entering state 1, several initialization steps may be taken. For example, the fine capacitor setting may be zeroed out to allow the fine capacitor setting to be swept for each medium/coarse setting. In addition, the digitally controlled capacitors may be set at their midrange to prepare for frequency acquisition. Other details of the control logic are described further herein.

Figure 17:
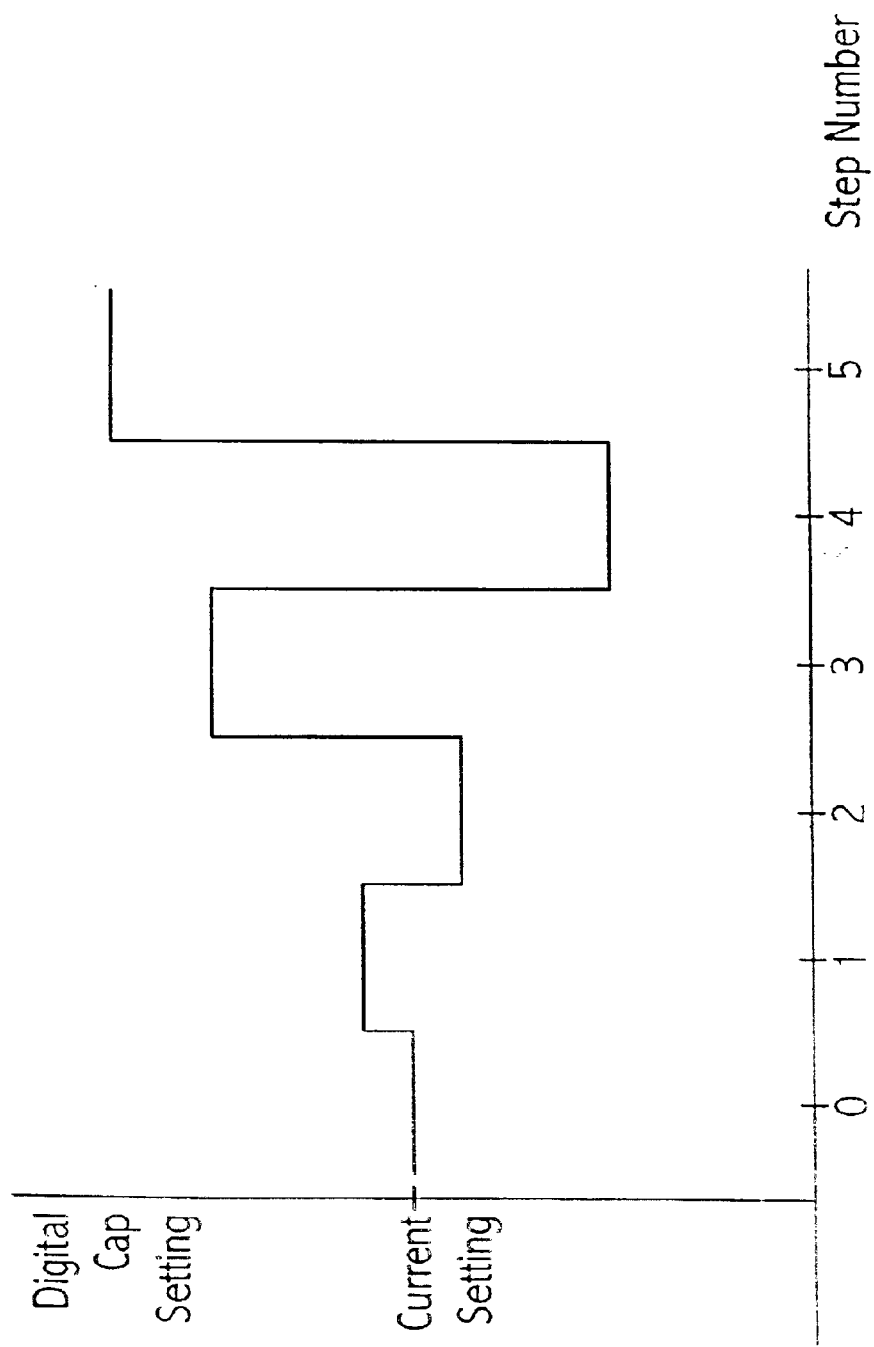
FIG. 17 illustrates one preferred approach for the stepping algorithm used to vary the capacitor settings.

Referring now to FIG. 17, one preferred approach to the stepping algorithm used to vary the capacitor settings is illustrated. As shown in FIG. 17, the capacitor setting is varied gradually above and below a center capacitance value. With each step of the algorithm, the capacitance is varied with increasing amplitude above and then below the initial setting. That has the advantages of minimal frequency deviation after first lock is achieved. In addition, a fast acquisition is achieved when the desired setting is close to a current setting. Further, the probability of locking onto a harmonic of the desired frequency is reduced. In addition, that approach avoids large frequency deviations, which may be undesirable from a customer's viewpoint. In one embodiment, the approach of varying the capacitance above and below a center value is applied only to the coarse and medium capacitance settings. The fine capacitance settings are swept in a linear fashion for each medium/coarse setting. In one embodiment, the control logic can step through 336 different capacitance settings, including 6 fine settings, 7 course settings, and 8 medium settings. Note that the use of the stepping algorithm shown in FIG. 17 is exemplary only. Other approaches, including a completely linear approach, may also be used. In addition, the use of fine medium and coarse capacitance settings is exemplary. Additional settings or fewer settings maybe used according to system requirements.

Referring a gain to FIG. 16, once one of the capacitor settings is selected in state 1, the state machine moves to state 2 in which the selected capacitor setting is evaluated for bit errors. On entering state 2, a bit error counter and a trial counter are initialized. Bit errors are determined to be those transitions that occur in the forbidden zone. The evaluation in state 2 is intended to provide a fast indication of lock or lack thereof after relatively few trials (only 16 trials lasting approximately 6.6 $\mu s$). A trial is an evaluation period on period of measurement described previously lasting for at least the minimum period of the frequency offset.

The risk associated with few trials is that there will be a false lock. The approach described in FIG. 16 uses initially few trials followed by successively larger number of trials. If a false lock occurs, the next series of longer trials should detect the false lock. Note that the fast evaluation (16 trials) is sensitive to a long string of transitionless bits.

In one embodiment, the control logic is being clocked at a rate significantly slower than the data rate. For example, the data rate may be 2.488320 GHz (OC-48), while the state machine operates) at a clock rate of data rate/1024 or 2.43 MHz. For each state machine clock cycle 1024 bits are transmitted and evaluated by the forbidden zone detection circuit. Note that the time period of each evaluation cycle (or trial) corresponds to the 0.4 microseconds measurement period T described above.

If a transition does occur in the forbidden zone during the measurement period T, the bit error counter increments to record the error. The trial counter counts the number of trials over which to evaluate the existence of a bit error during the 1024 bit times. In the illustrated embodiment, 16 evaluation cycles or trials are performed in state 2, which corresponds to approximately 6.6 microseconds. If after 16 evaluation cycles the bit error count is 16, meaning that at least one forbidden zone transition occurred in each of the 16 evaluation cycles, the state machine returns to state 1 to step the digital capacitor settings and thereby adjust the capacitor settings in accordance with, e.g., the stepping algorithm described in FIG. 17. If however, after 16 evaluation cycles are completed, the bit error count is less than 16, then the state machine enters state 3.

State 3 provides a longer period of evaluation than state 2, which helps identify false lock conditions. On entering state 3, the bit error counter and the trial counter, which respectively count the number of detected bit errors and the number of evaluation cycles utilized in the particular state, are both reinitialized, e.g., set to zero. In the illustrated embodiment, 48 cycles are evaluated in state 3. If bit error count is 43 or greater, indicating that lock has not been achieved, the control logic returns to state 1 to step the capacitance settings. In one embodiment, the evaluation of lock in state 3 is robust against 4000 transitionless bits and a maximum bit error rate of $1 \times 10^{-3}$. In the illustrated embodiment, the state 3 evaluation takes approximately 19.6 microseconds given the OC-48 data rates described earlier. If, however at the end of those 48 cycles, the bit error count is less than a predetermined number (43 is the illustrated embodiment), the control logic enters state 4.

State 4 provides a longer period of evaluation than state 3. The bit error counter and the trial counter, which respectively count the number of bit errors and the number of evaluation cycles utilized in the particular state, are both initialized. In the illustrated embodiment, 512 cycles are evaluated in state 4. At the end of those 512 cycles, if the bit error count is less than a predetermined number (497 in the illustrated embodiment), the control logic enters state 5. If however, the bit error count is 497 or greater, indicating that lock has not been achieved, the control logic returns to state 1 to again step the capacitance settings. The evaluation of lock in state 4 is robust against 8000 transitionless bits and a bit error rate of up to $2 \times 10^{-3}$. In the illustrated embodiment, the state 4 evaluation takes approximately 209.7 microseconds, given the rates described earlier. While one preferred embodiment utilizes successively longer testing states, other embodiments may include only one or fewer states. That would entail determining lock after, e.g., 1000 trials.

State 5 is a locked state, and loss of lock (LOL) is deasserted in state 5 to indicate that lock has been achieved. The state machine remains in the locked state evaluating bit errors. The bit errors may again be evaluated over e.g., 512 cycles. At the end of those 512 cycles, if the bit error count is less than a predetermined number (e.g., 497 in the illustrated embodiment), the control logic remains in state 5. If however, the bit error count is 497 or larger, the state machine returns to state one and asserts loss of lock. In the locked state, error monitoring may be selectively enabled. In addition, the capacitor settings for the VCO can be saved (and the accumulator value from the integrating path 240). If lock is lost, those saved values may be used to control the VCO output to output a clock that was recently locked to the input data stream.

Figure 18:
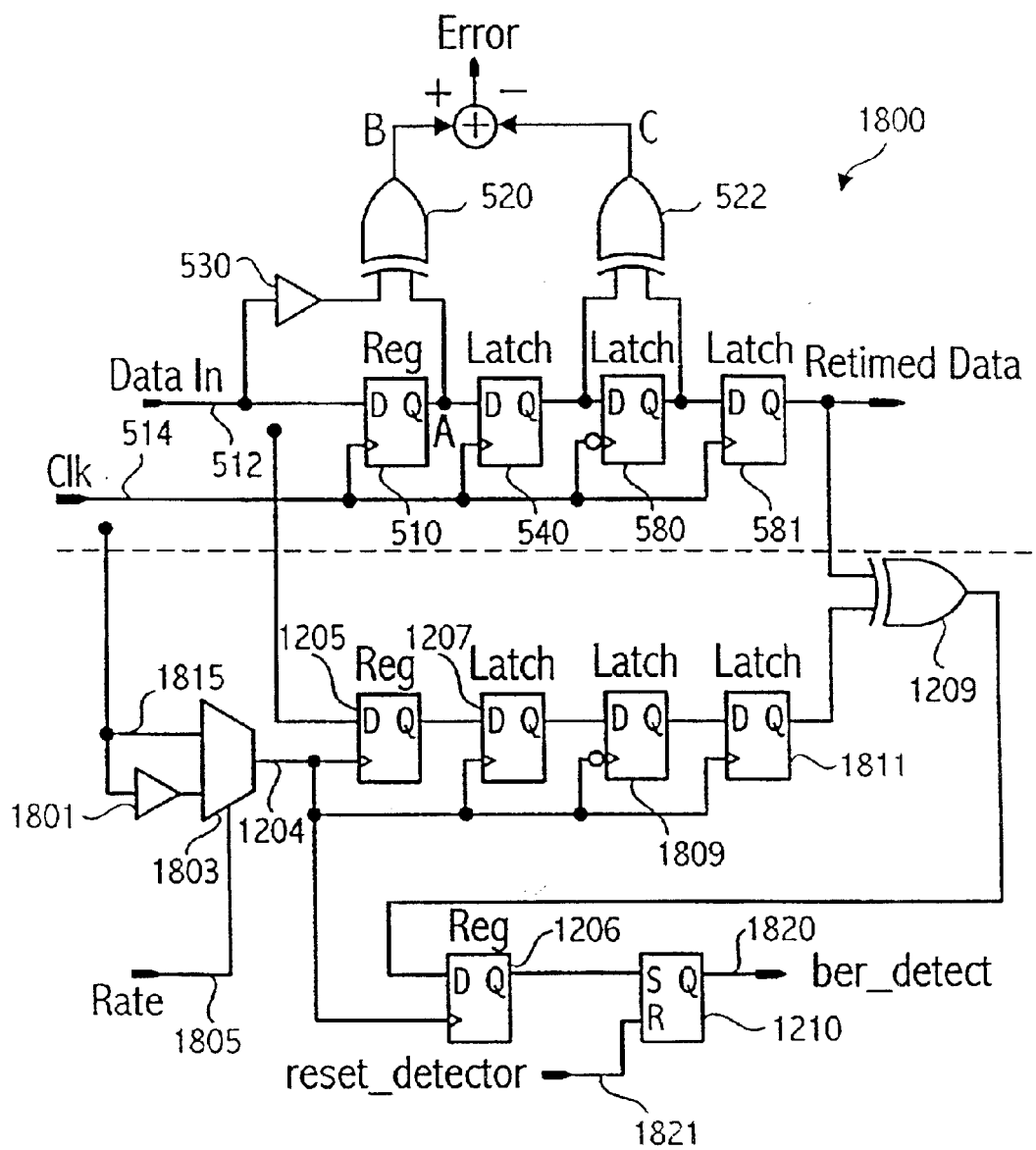
FIG. 18 illustrates one embodiment of an augmented phase detector that determines when transitions occur in the forbidden zone.

With that understanding of how bit errors (transitions in the forbidden zone) are used to determine whether the PLL is locked, an embodiment 1800 of an augmented phase detector that determines when transitions occur in the forbidden zone is illustrated in FIG. 18. The circuit is similar to the phase detector illustrated in FIG. 12, except there are extra latch stages 580, 581 and 1409 and 1411. In the embodiment illustrated in FIG. 18, the latch 540 insulates the earlier signal entering the XOR gate 522 from variations in the timing at node A resulting from varying input data timing (i.e., variations in clock-to-Q timing of register 510 as a function of its input data setup time). The latches 581 and 1811 ensure that the retimed data is not out of phase with the input data (half a cycle oft) and may also be preferable from a loading perspective.

The embodiment illustrated in FIG. 18 also provides a variable length delay, which translates into a phase window appropriate for different data rates. The phase window is a portion of the period of the recovered clock conveyed on node 514. In one embodiment, when the delay path 1815 is selected by selector 1803, the delay is approximately 50–60 picoseconds, which corresponds to an approximately 15% phase window for a 2.5 GHz data rate. However, if a slower data rate is being used, extra delay can be selected by selecting the delay path incorporating extra delay 1801. A rate select signal indicating the data rate frequency may be used for the selector signal 1805. While only two delays are illustrated, multiple delays may be selectable to accommodate a wider range of data rates.

As also illustrated in FIG. 18, when a bit error is indicated on node 1820, the control logic resets the SR latch using the reset signal 1821.

Figure 19:
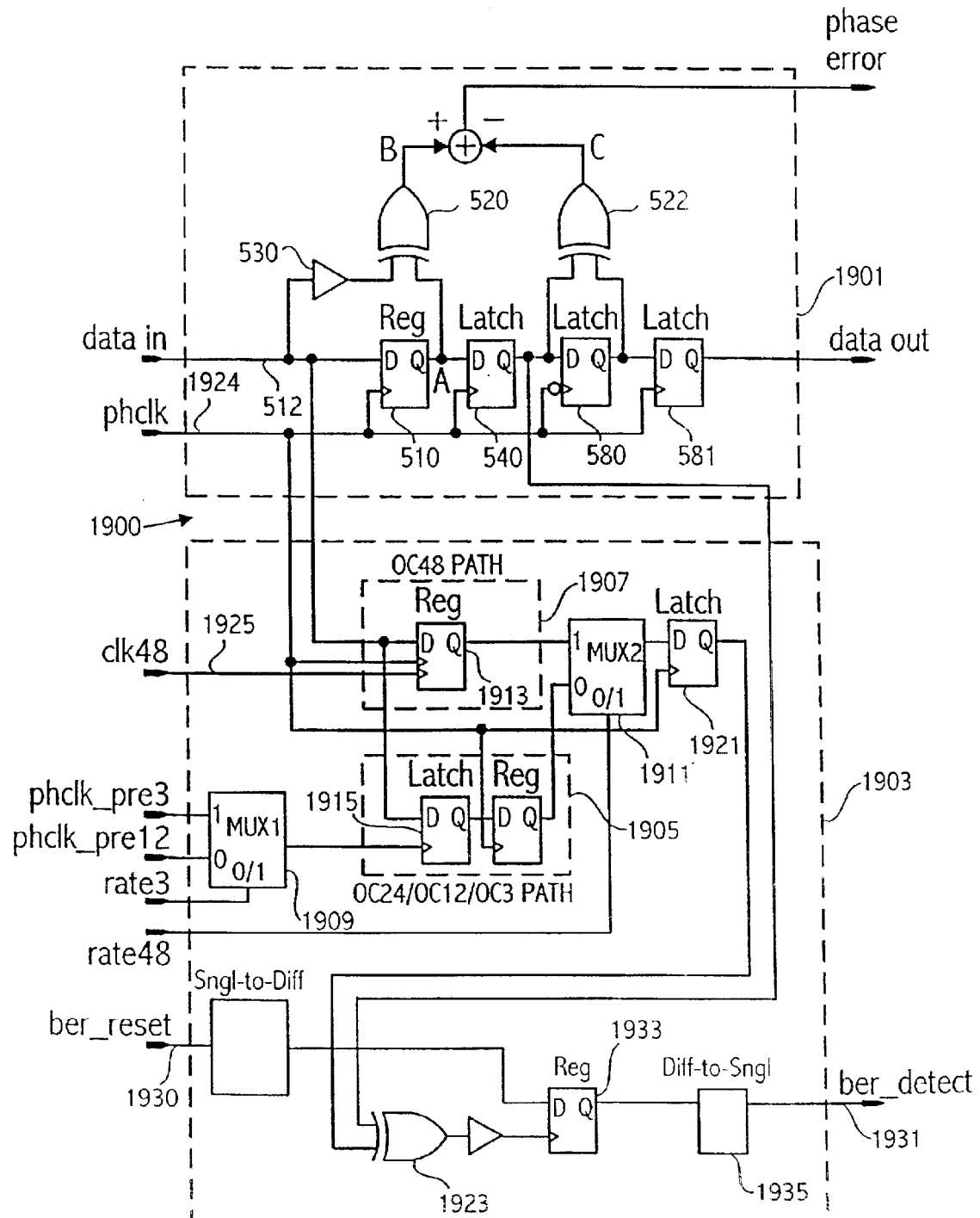
FIG. 19 illustrates one embodiment of an augmented phase detector that determines when transitions occur in the forbidden zone.

FIG. 19 illustrates another embodiment of an augmented phase detector that determines when transitions occur in the forbidden zone. The circuit is similar to the augmented phase detector illustrated in FIG. 18. The augmented phase detector 1900 includes the phase detector portion 1901 and a bit error detector 1903. The primary difference between the augmented phase detector 1900 and the augmented phase detector 1800 is that the delays are implemented differently. The embodiment illustrated in FIG. 19 is intended to support multiple clock frequencies including the various SONET data rates includes OC-3 (155.520 Mbs), OC-12 (622.080 Mbs), OC-24 (1.244.16 Mbs), and OC48 (2,488.320 Mbs). There are two delay paths in the bit error detector 1903 based on clock frequency. The clocks for OC24/OC12/OC3 utilize a delay path 1905, while the OC-48 clock utilizes the delay path 1907. A multiplexer 1909 selects the appropriate lower speed clock for delay path 1905. Multiplexer 1911 selects between delay path 1907 and 1905. The data conveyed on node 512 is clocked into register 1913 and latch 1915. The output from the selected delay path is latched into latch 1921. The output from latch 1921 and latch 540 are compared in XOR gate 1923. Note that in a preferred embodiment, all signals shown in FIG. 19 are differential except for rate3, rate48, ber_reset, and ber_detect. As more fully described herein, the delay in the OC48 path (multiplexer 1911=1) derives its delay as the interpolation between clk48 and phclk as described more fully herein. Note that the phclk conveyed on node 1924 is determined according to the particular clock frequency being supported.

At the beginning of a test cycle (e.g., 1024 data bit times), the ber_reset signal conveyed on node 1930 is set to the opposite binary value of the ber_detect signal conveyed on 1931. At the end of the test interval, if ber_detect equals ber_reset, then an error was not detected by comparator 1923 and register 1933 is not clocked and ber_reset and ber_detect remain at different values. If on the other hand, an error is detected by XOR gate 1923, register 1933 is clocked causing the ber_reset to be clocked into register 1933, converted to a single ended signal in differential to single ended converter 1935, and output on node 1931 as the ber_detect signal.

Figure 20:
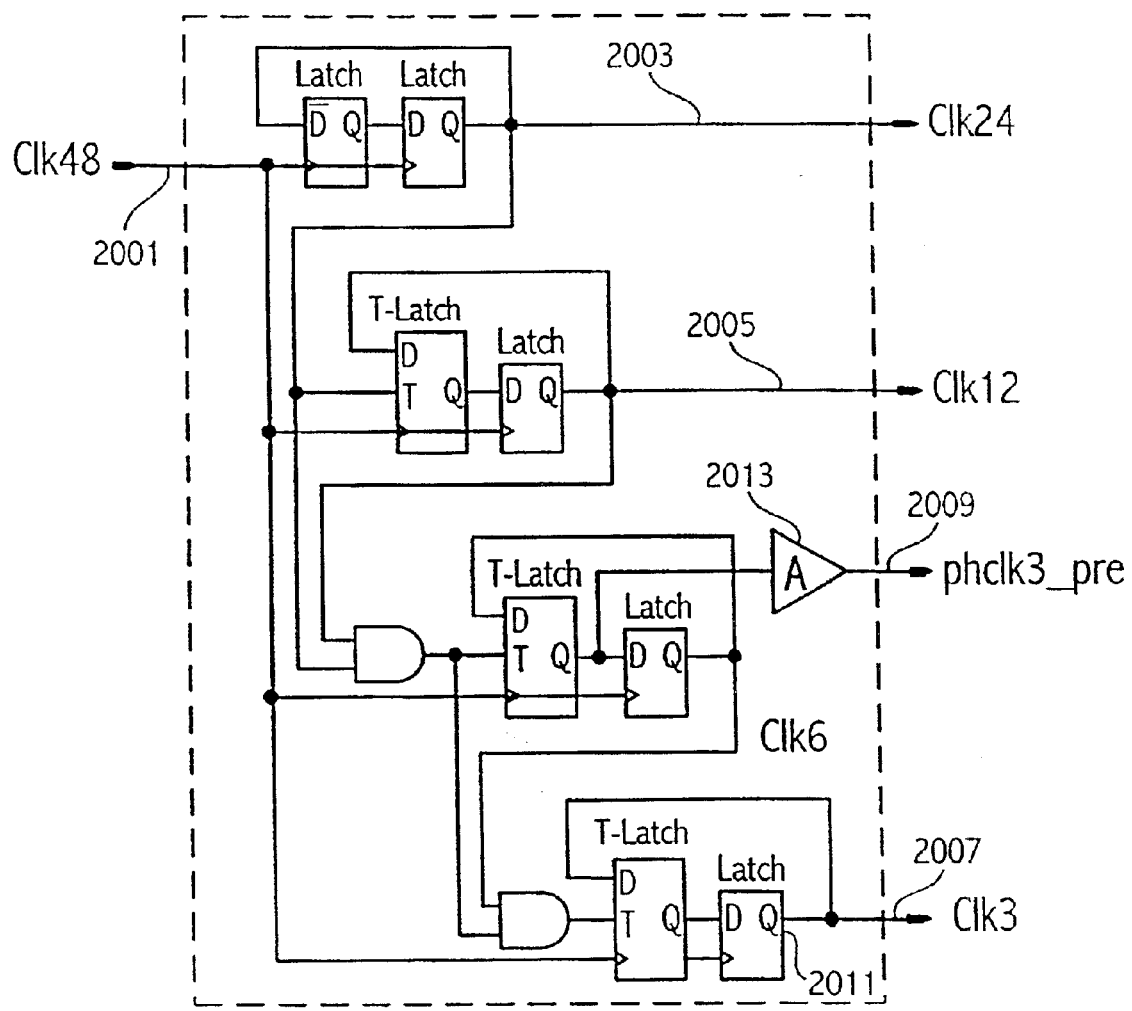
FIG. 20 illustrates the implementation of the delay associated with the OC3 clock and the generation of the clocks for OC24, OC12 and OC3 mode of operations.

FIG. 20 illustrates the implementation of the delay associated with the OC3 clock and the generation of the clocks for OC24, OC12 and OC3 mode of operations. All the illustrated signals are differential. The OC-48 clock (clk48) conveyed on node 2001 is divided in half to create clk24 conveyed on node 2003, and further divided to create clk12 conveyed on node 2005.

The phclk3_pre is twice the OC3 (clk3) frequency conveyed on node 2007. The clock phclk3_pre is supplied on node 2009 to multiplexer 1909. The critical edge of phclk3_pre is three half cycles of clk 48 (ideally approximately 600 picoseconds but less in practice due to loading).

Note that, phclk3_pre could also be produced by tapping before the latch 2011 producing clk3. The location of tapping to generate phclk3_pre may depend on loading issues. In the particular implementation shown in FIG. 20, the amplifier 2013 is utilized to minimize the impact of loading. The use of the amplifier lowers the delay between phsclk and phclk3_pre and therefore reduces the forbidden zone. That reduction in the forbidden zone may be undesirable.

Figure 21:
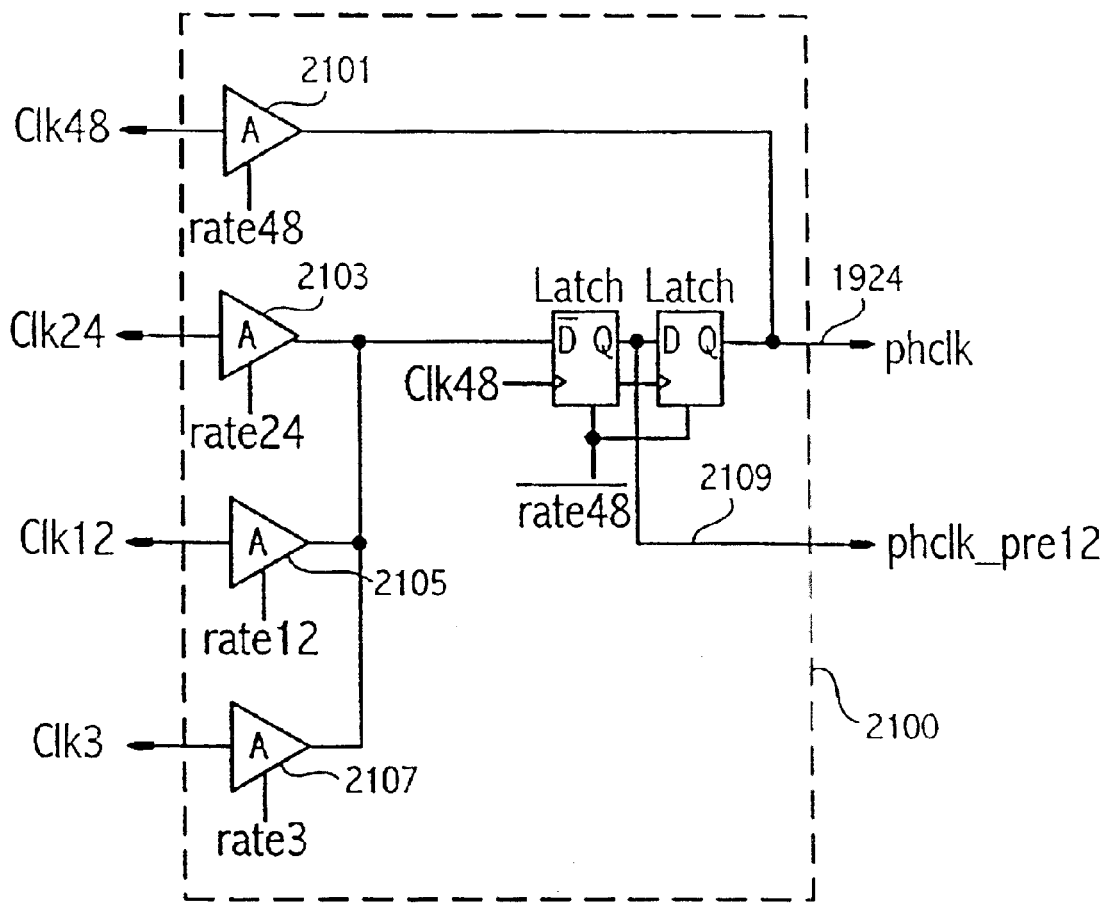
FIG. 21 illustrates implementation of the delay associated with OC24 and OC12 clocks.

FIG. 21 illustrates implementation of the delay associated with OC24 and OC12 clocks. Clk48, clk24, clk12 and clk3 are gated by the respective clock select signals rate48, rate24, rate12 and rate3 signals in buffers 2101, 2103, 2105, and 2107. Note that all signals shown in FIG. 21 are differential. Phclk_pre12 ideally precedes phclk by half a clk48 period (approximately 200 picoseconds) for OC24 and OC12 clocks. Phclk_pre12 is used for both OC24/OC12. The clock phclk, conveyed on node 1924 to clock the phase detector 1901 is selected by the selector circuit 2100 shown in FIG. 21. For OC48, phclk is delay ed from clk48 by the propagation delay of one buffer (approximately 60 picoseconds). However, in some embodiments, a one buffer delay provides a forbidden zone that is too large.

Accordingly, interpolation between the clock phclk conveyed on node 1924 and the clock clk48 conveyed on node 1925 is utilized to achieve a smaller delay and thus a smaller forbidden zone. A smaller forbidden zone gives better jitter tolerance and more accurate ber measurements. In one embodiment, the forbidden zone is approximately 0.1 UI.

Figure 22:
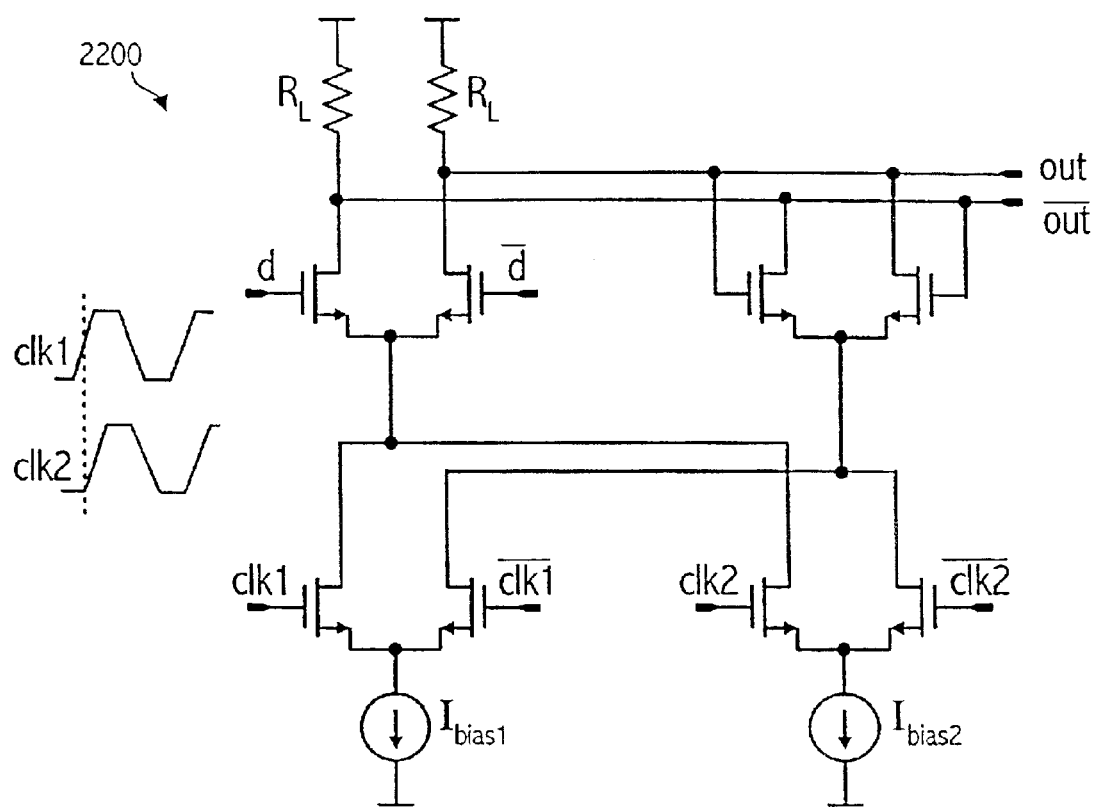
FIG. 22 illustrates interpolating between two clocks to achieve a shorter delay than can be achieved by utilizing one delay buffer.

FIG. 22 illustrates interpolating between two clocks to achieve a shorter delay than can be achieved by utilizing one buffer. FIG. 22 illustrates a differential latch 2200 which can be cascaded two in a row to form a register with interpolated sample time such as the differential register 1913 (shown in FIG. 19). Assume clk2 is generated by passing clk1 through a differential buffer with a delay of approximately 60 picoseconds. The sample time of the register is determined by the interpolation of the clk1 and clk2 transition edges as set by the relative values of the bias currents Ibias1 and Ibias2. Assume $I_{bias1}+I_{bias2}=I_{bias}$. The sample time is determined by the $I_{bias1}$ and $I_{bias2}$. For example, if $I_{bias1}=I_{bias2}$, and $I_{bias2}=0$, the transition edge of clk1 determines the sample time. If $I_{bias1}=0$, and $I_{bias2}=I_{bias2}=I_{bias}$, the sample time is determined by the transition edge of clk2. Finally, if $I_{bias1}=I_{bias2}=I_{bias}/2$, the sample time is approximately half way between the transition edges of clk1 and clk2. Thus, the sample time, and thus the delay and the width of the forbidden zone, can be narrowed or lengthened by adjusting the bias currents. Note that the bias current $I_{bias}$ is set according to the voltage drop desired across resistor loads $R_L$.

Figure 23:
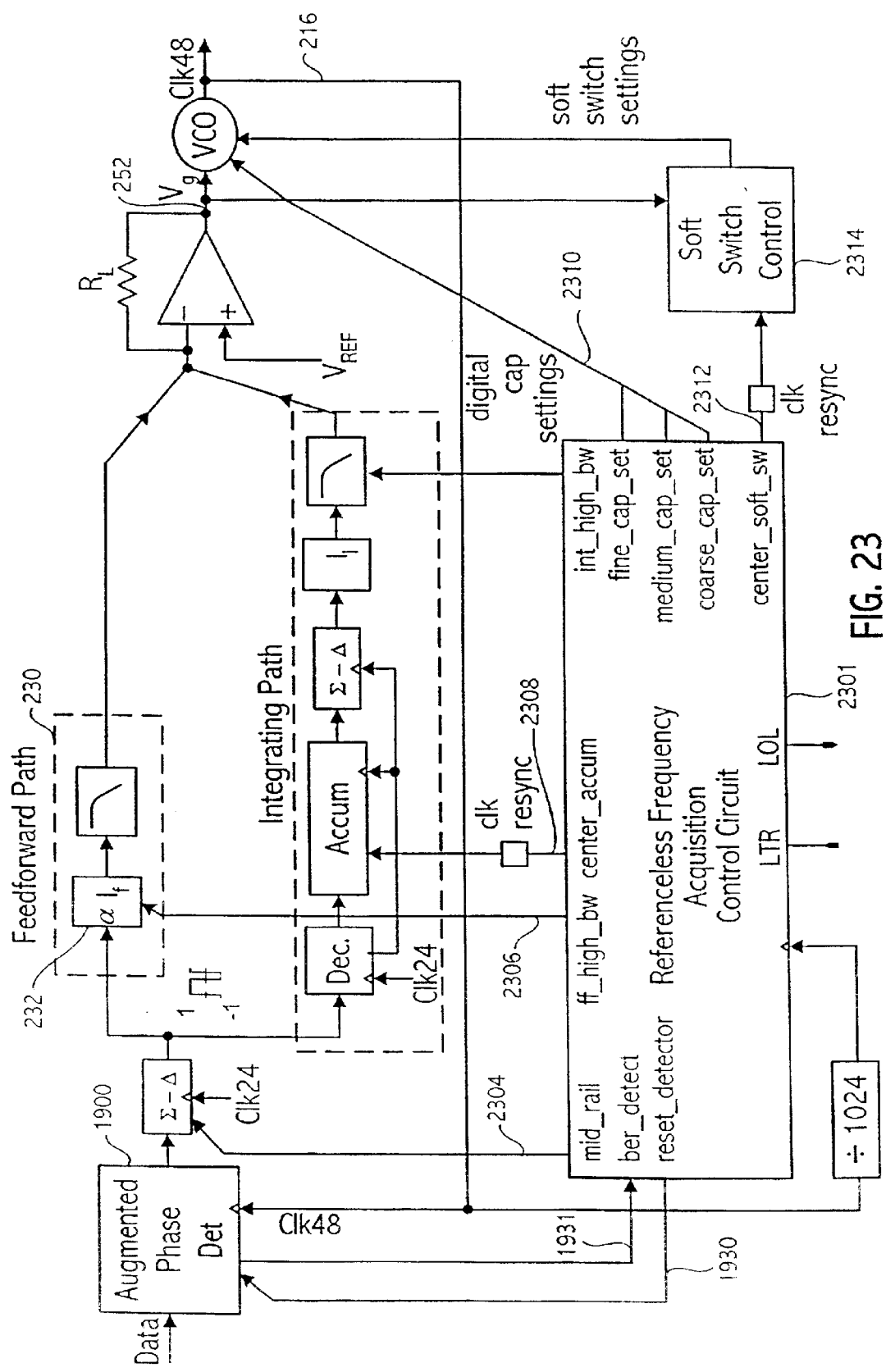
FIG. 23 shows a block diagram of a portion of an exemplary clock and data recovery circuit incorporating the augmented phase detector.

FIG. 23 shows a block diagram of an exemplary clock and data recovery circuit that can advantageously exploit the augmented phase detectors and associated control logic described herein (particularly FIG. 19). The clock and data recovery circuit shown in FIG. 23 includes a control circuit 2301 for referenceless frequency acquisition. The control circuit 2301 operates in accordance with the state machine shown in FIG. 16. The control circuit receives a bit error detect signal conveyed on node 1931 and supplies the reset detector signal on node 1930. As described previously, when the bit error detect signal and reset-detector signal are at different values, a bit error has occurred.

Aside from receiving the bit errors and resetting the detect logic associated therewith, the control circuit also outputs the capacitor settings used by the VCO 260. As described previously, the VCO 260 receives the control signal $V_g$ conveyed on node 252 that adjusts the analog capacitance 410 (FIG. 4). In the illustrated embodiment, the control circuit 2301 supplies the coarse, medium, and fine capacitor control settings for the digitally controlled capacitors 416 (FIG. 4) on node 2310. Node 2310 may be implemented as a multi-bit value supplying, e.g., control values indicating 7 different coarse settings, 8 different medium settings and 6 fine settings for a total of 336 possible capacitor settings.

The control logic also provides a variety of control signals useful in various aspects of the disclosed embodiments. For example, the control logic supplies the mid_rail signal 2304 to the delta-sigma modulator 212 to cause its output to be set to its midpoint when the PLL is operating in a lock to reference mode (state 0). If loss of lock has occurred, asserting the mid_rail signal 2304 zeros the feedforward path 230. The feedforward high bandwidth (ff_high_bw) signal conveyed on node 2306 to the gain block 232 of the feedforward path 230 functions as a bandwidth control signal to select either a higher or lower open loop bandwidth. During acquisition of the frequency of the input data stream, (states 1–4) the feedforward high bandwidth signal is set to maximize the gain to provide a wider bandwidth and thus better lock-in range. The gain is then reduced once confidence of lock is higher or once lock is achieved to provide better performance since a wide lock-in range is no longer needed. The center accumulator (center_accum) signal adjusts the up/down counter in the accumulate block 244 to its center value. When asserted, the integrating path is essentially shut off. An integrating path high bandwidth control signal (int_high_bw) is conveyed on node 2310 to adjust the filter bandwidth provided in filter 248. The center soft switch (center_soft_sw) control signal conveyed on node 2312 to soft switch control circuit 2314 causes the soft switch control to output a center capacitance value during acquisition of the frequency.

In an exemplary embodiment, in state 2 of FIG. 16, center_accum=1, ff_high_bw=1, int_high_bw=1, and mid_rail=0, with a 1 indicating an asserted signal. With control signals at those values, the integrating path is turned off and the feed focused path is set for high gain. In state 3, center_accum=0, ff_high_bw=1, int_high_bw=0, thus enabling the integrating path. In state 4, center_accum=0, int_high_bw=1, and int_high_bw=0. In the locked state the feedforward high bandwidth signal is deasserted to reduce gain.

Note that the augmented phase detector circuit 1900 in the illustrated embodiment is receiving a clock signal conveyed on node 1924 that in the illustrated embodiment supports SONET OC-48/OC-24/OC 12/OC3 data rates (approximately 2.5 GHz for OC-48). The delta-sigma modulator receives a clock at half that rate. The control circuit 2301 receives a clock that is divided down by 1024. One advantage of operating the control circuit 2301 at a much slower clock rate is that it runs slowly enough that it can be easily synthesized by readily available synthesis tools, which results in design savings. In addition, a slower clock rate can save power during operation.

Figure 24A:
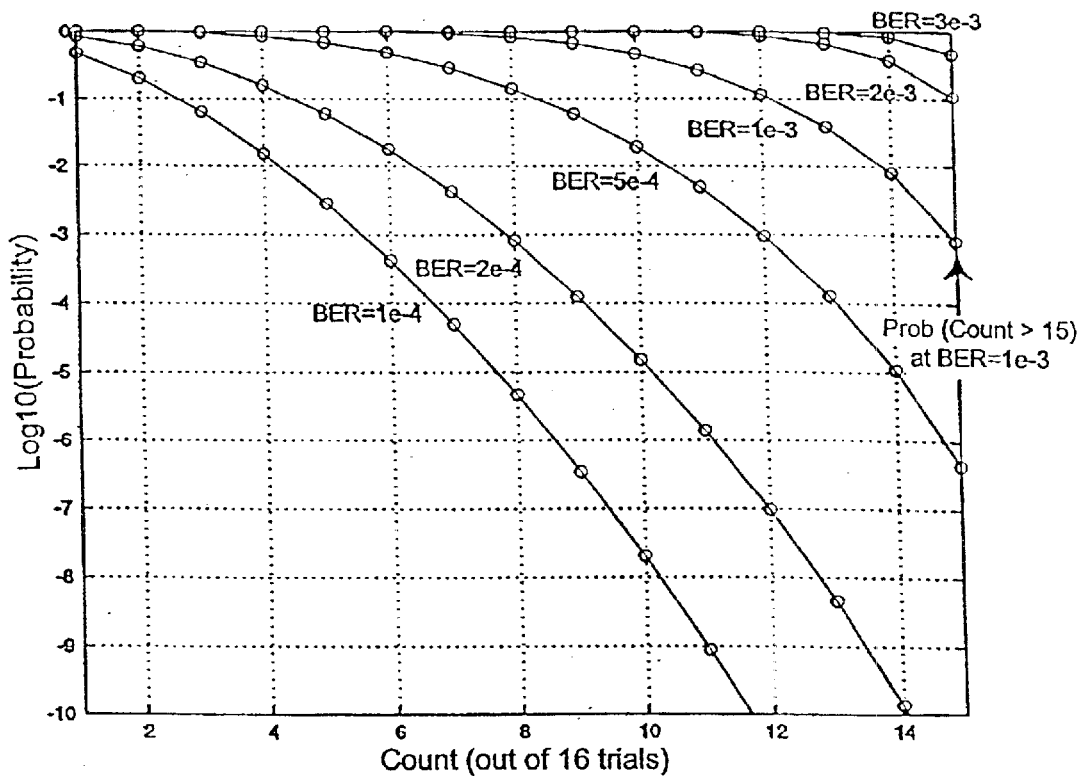
FIG. 24A shows the probability of falsely asserting out-of-lock with various bit error rates (BER) and for various bit error counts for 16 trials.

There are two basic errors that can occur utilizing the forbidden zone bit error detection. The first potential error is asserting that the PLL is out-of-lock when it is in fact locked. The probability of that happening depends upon the number of trials that occur as well as the bit error rate of the transmitted data. Referring to FIG. 24A, an exemplary graph illustrates the probability of falsely asserting out-of-lock with various bit error rates (BER) versus various bit error counts for 16 trials. Each of the curves shown in FIG. 24A corresponds to a different bit error rate. The first curve corresponds to a bit error rate of $1 \times 10^{-4}$. As the bit error count increases from 4 to 11, the probability of falsely declaring out-of-lock declines from $1 \times 10^{-2}$ to $1 \times 10^{-9}$. That is, the probability declines from one in a hundred to one in a billion. Note that as the bit error rate increases, the probability of falsely declaring out-of-lock also increases. In other words, if there are more bit errors, they are more likely to fall in the forbidden zone resulting in the false declaration of being out-of-lock.

Figure 24B:
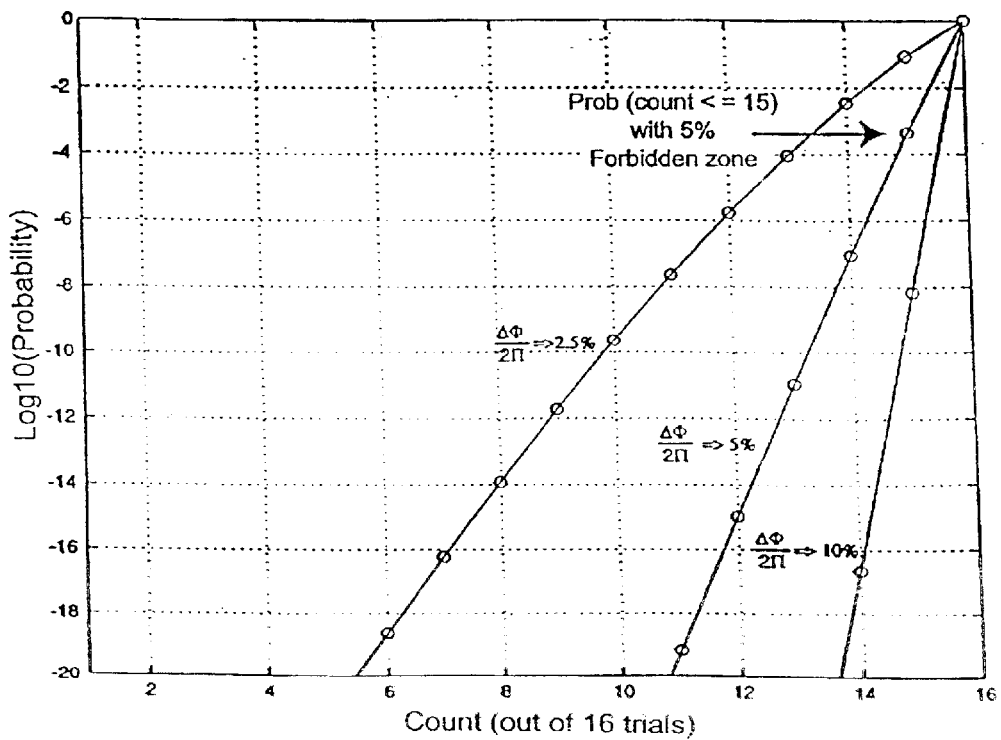
FIG. 24B shows the probability lock is falsely declared versus count and width of the forbidden zone for 16 trials.

A second potential error that can occur using the forbidden zone approach described herein is to falsely declare the PLL is locked when in fact it is out-of-lock. One parameter that effects the false declaration of lock is the size of the forbidden zone. If the size of the forbidden zone is increased, more data transitions will occur in the hidden zone and thus more data transitions will be considered bit errors and thus the probability of falsely declaring lock should decrease with a larger forbidden zone. FIG. 24B shows the probability that lock is falsely declared versus count and width of the forbidden zone. When the forbidden zone ($\Delta\Phi/2\pi$) is 10%, with a count of fourteen, the probability of falsely declaring lock is less than $1 \times 10^{-16}$. However, for the same count, when the forbidden zone is 5% of the period, the probability of falsely declaring lock is approximately $1 \times 10^{-7}$. Thus, the probability of falsely declaring lock decreases with an increasing forbidden zone.

Figure 25A:
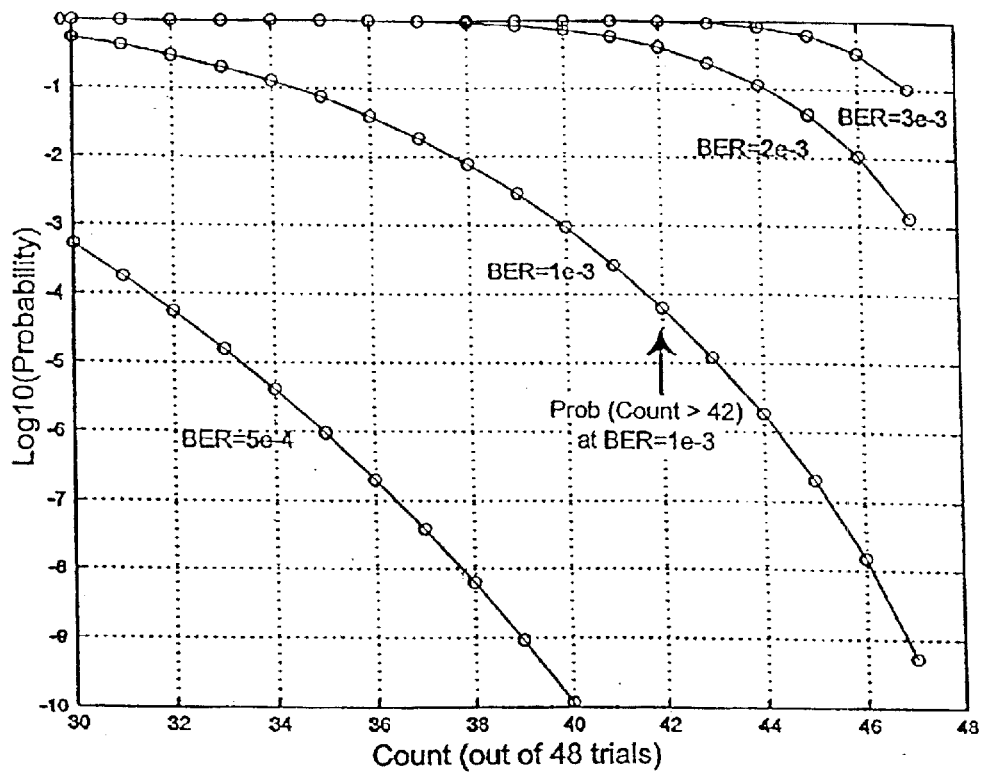
FIG. 25A shows the probability of falsely asserting out-of-lock with various bit error rates (BER) and for various bit error counts for 48 trials.
Figure 25B:
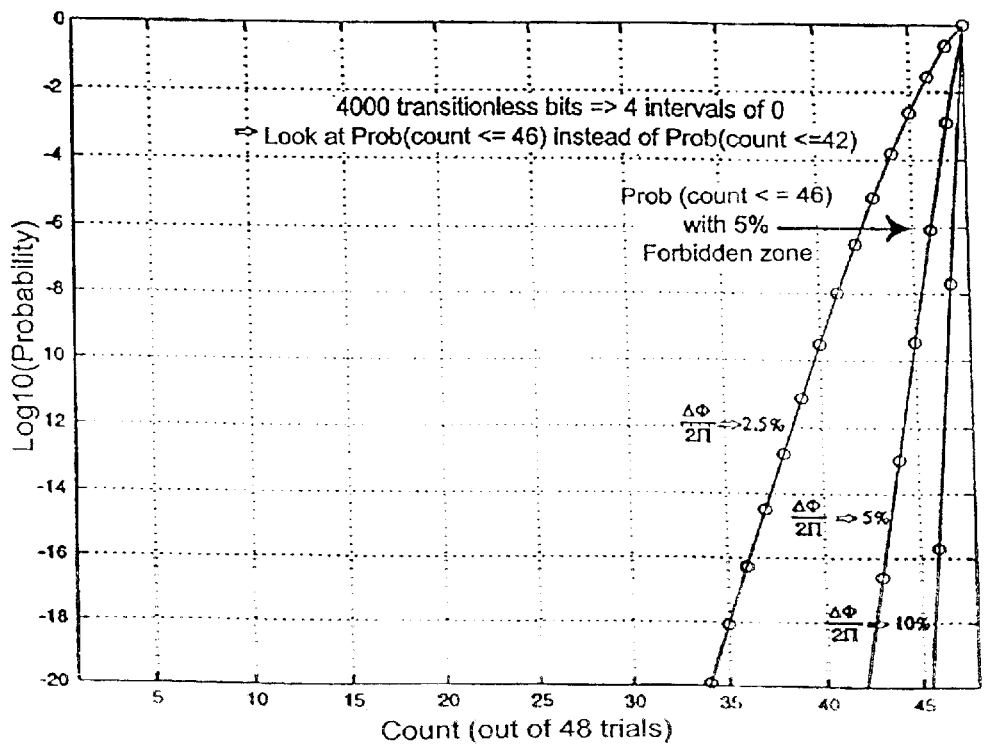
FIG. 25B shows the probability lock is falsely declared versus count and width of the forbidden zone for 48 trials.

FIGS. 24A and 24B shows the probability for 16 trials, which corresponds to state 2 in FIG. 16. The probability curves for state 3 (48 trials) is shown in FIGS. 25A and 25B with the probability of falsely declaring out-of-lock shown in FIG. 25A for various bit error rates versus count. As would be expected, the probability of falsely declaring out-of-lock decreases with an increasing count. Thus, with a BER of $1\times10^{-3}$, the probability of falsely declaring out-of-lock is less than $1\times10^{-4}$ with a bit error count of 42.

FIG. 25B shows the probability of declaring lock falsely for various forbidden zone widths and counts. FIG. 25B shows that the probability of falsely declaring lock is decreased as the forbidden zone increases.

Figure 26A:
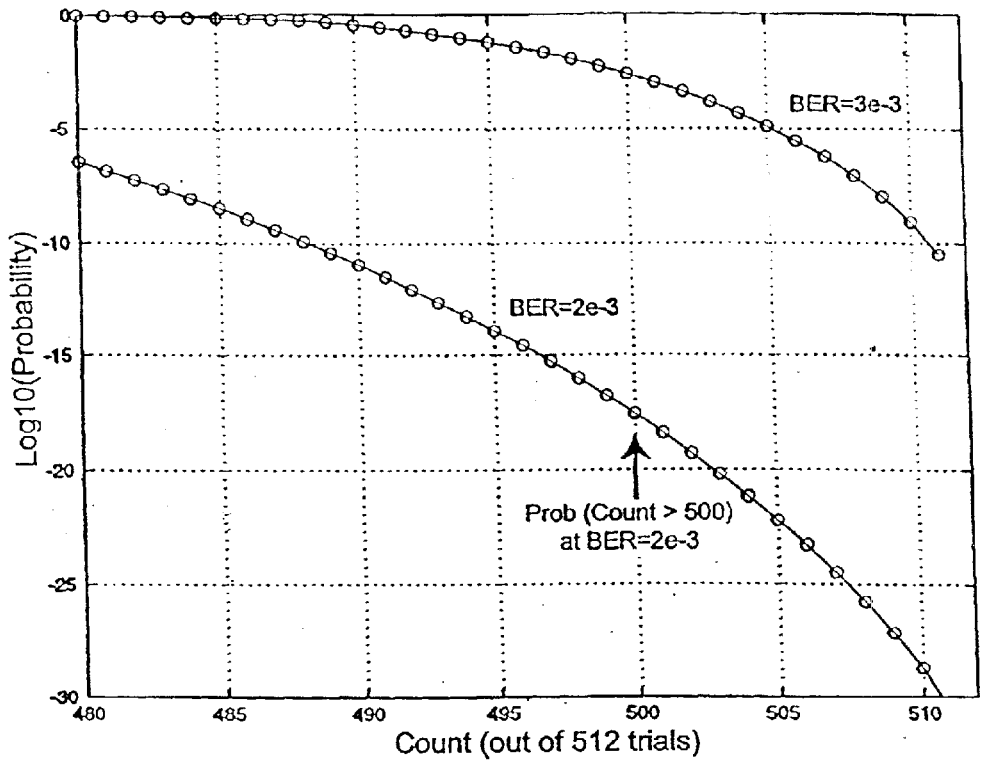
FIG. 26A shows the probability of falsely asserting out-of-lock with various bit error rates (BER) and for various bit error counts for 512 trials.
Figure 26B:
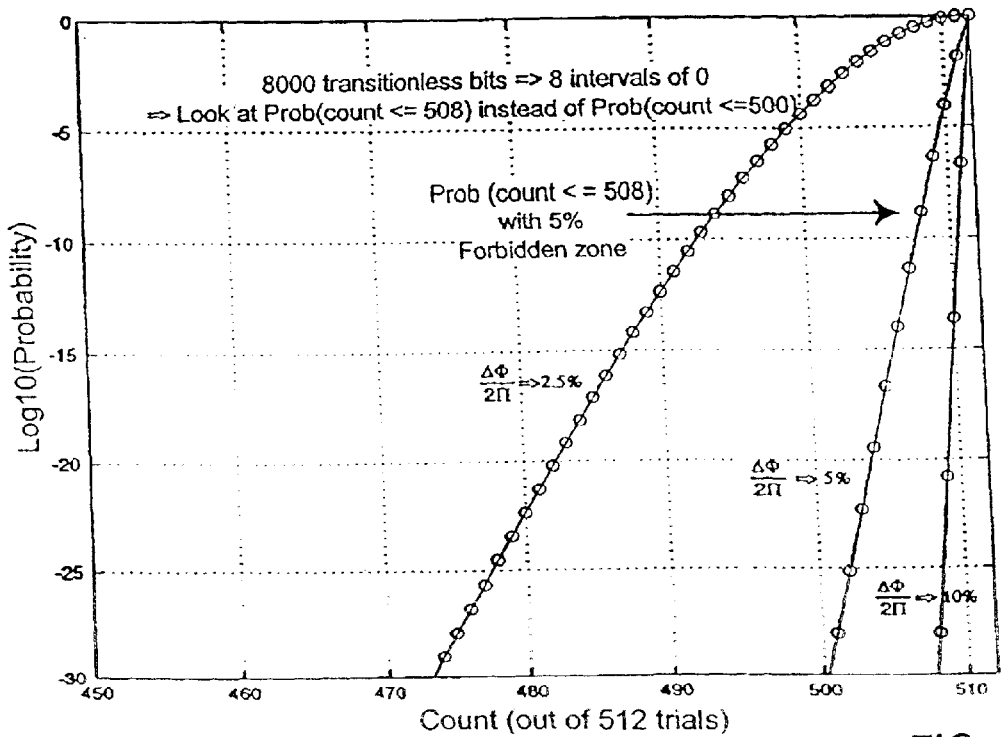
FIG. 26B shows the probability lock is falsely declared versus count and width of the forbidden zone for 512 trials.

The probability curves for states 4 and 5 (512 trials) are shown in FIGS. 26A and 26B. FIG. 26A illustrates the probability of falsely declaring out-of-lock versus count for various bit error rates. As would be expected, the probability of falsely declaring out-of-lock decreases with increasing count. Thus, even with a BER of $2\times10^3$, the probability of falsely declaring out-of-lock is less than $1\times10^{-15}$ for a bit error count of 500.

FIG. 26B shows the probability of declaring lock falsely for various forbidden zone widths and counts. FIG. 26B shows that the probability of falsely declaring lock decreases with an increased size of the forbidden zone.

The forbidden zone detection circuitry used to determine whether or not the PLL is locked can also be used to indicate the bit error rate once the PLL is locked. Thus, in the locked state, the state machine can continue to monitor the number of bit errors that occur during, e.g., 512 cycles. If after 512 cycles the number of detected bit errors is less than the predetermined threshold of approximately 500, then the PLL is considered to still be locked, the control logic remains in the locked state, the bit error counter and trial counter are reset, and the monitoring continues for another 512 evaluation cycles.

If the bit error rate is above the threshold count value of approximately 500, the state machine determines the PLL to be out-of-lock and the state machine returns to state 1 and tries to reacquire lock. In trying to reacquire lock, the state machine can enter a hold_vco_ state prior to trying to reacquire lock. In that state, the accumulator state is maintained (center_accum is set to 0), the center_soft_sw is set to 0, the high bandwidth signals (high_bw) for the feedforward and integrating paths are both set to 0 and mid_rail is asserted. An enable signal for the error monitor function is disabled since the PLL is out-of-lock. The error monitoring function is only valid while the PLL is in-lock. In addition, the control logic delays in this state for 12.3 microseconds to allow for a loss of signal (LOS) exception to occur. That LOS exception can result in LTR being asserted. While in this initialization state, the VCO outputs a clock having a frequency based on the stored VCO settings. Note that the accumulator settings from several intervals ago may be used to control the VCO output.

One advantage of using the forbidden zone detection technique is that in the locked state, if the bit error rate is below the threshold count (e.g., 501), the number of evaluation cycles having transitions in the forbidden zone can be used to indicate the actual bit error rate. In the locked state, the various ranges of bit errors (a bit error being an evaluation cycle having one or more forbidden zone transitions) are assigned a digital value. FIG. 27A shows a table of one embodiment of assigning a digital value corresponding to the number of trials (evaluation cycles) having one or more forbidden zone transition for 512 trials in the locked state. That digital value can be stored in a register. In one embodiment, the digital value of the error rate is supplied to a D/A converter that supplies an analog signal, typically an analog current, on an output terminal of the integrated clock and data recovery circuit (see FIG. 45) indicative of the bit error rate. Alternatively, if access is provided to that register, for instance by a serial communication port, that register can be read to provide an indication of the bit error rate. Note that when the PLL is not locked, the bit error rate indication can be invalidated by setting the output terminal to a maximum or minimum value. Note that if the BER is 1, then a another bit error detection scheme is used to achieve better resolution at low bit error rates.

More specifically, in one embodiment a secondary bit error rate counter is used to provide increased resolution by counting bit errors for a longer time period. More particularly, in one embodiment, the secondary bit error rate counter counts 256 locked-state cycles of 512 trials each. Thus, the secondary bit error rate counter counts for 256× 512 trials. After each 512 trials, while in the locked state, the lower order bits (e.g., the three low order bits) of the BER counter are added to a secondary BER counter. FIG. 27B illustrates the digital values generated based on the value of the sub bit error count according to one embodiment of the invention.

Figure 28:
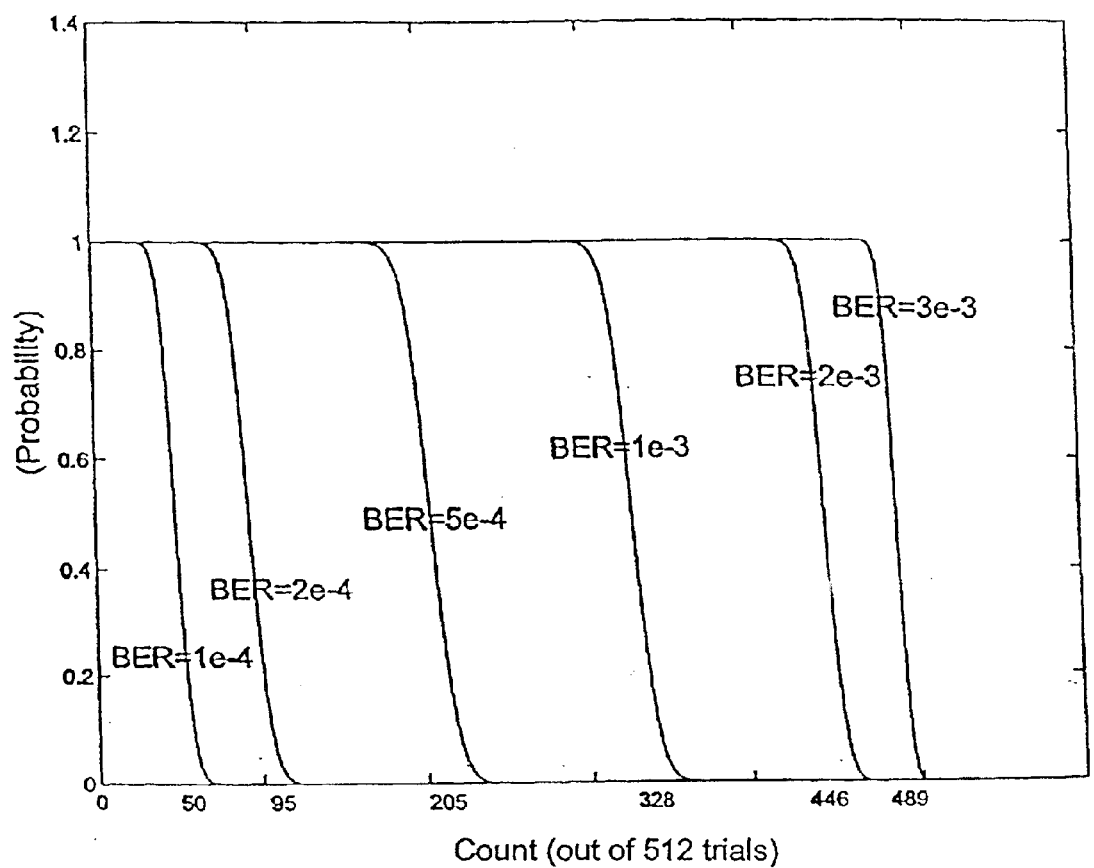
FIG. 28 shows the probability that the measured count of transitions in the forbidden zone (the bit error count) is greater than the bit error rate for 512 trials when the PLL is in-lock.

Referring to FIG. 28, the probability curves for various bit error rates show why it is possible to infer the bit error rate from the count of evaluation cycles having transitions in the forbidden zone. FIG. 28 shows the probability that the measured count of transitions in the forbidden zone (the bit error count) is greater than the bit error rate for 512 trials when the PLL is in-lock. As can be seen, for a bit error rate of $1\times10^{-4}$, the probability that the bit error count is greater than the bit error rate is negligible if the measured count is greater than approximately 50. For a bit error rate of $1\times10^{-3}$, the probability that the bit error count is greater than the bit error rate is negligible if the bit error count is greater than approximately 328. Thus, the bit error count determined using the forbidden zone provide a good measure of the bit error rate, even for bit error rates as high as $3\times10^{-3}$ when the bit error count is greater than approximately 489. For low bit error rates additional resolution may be obtained using the sub bit error counter described in relation to FIG. 27B.

Figure 41:
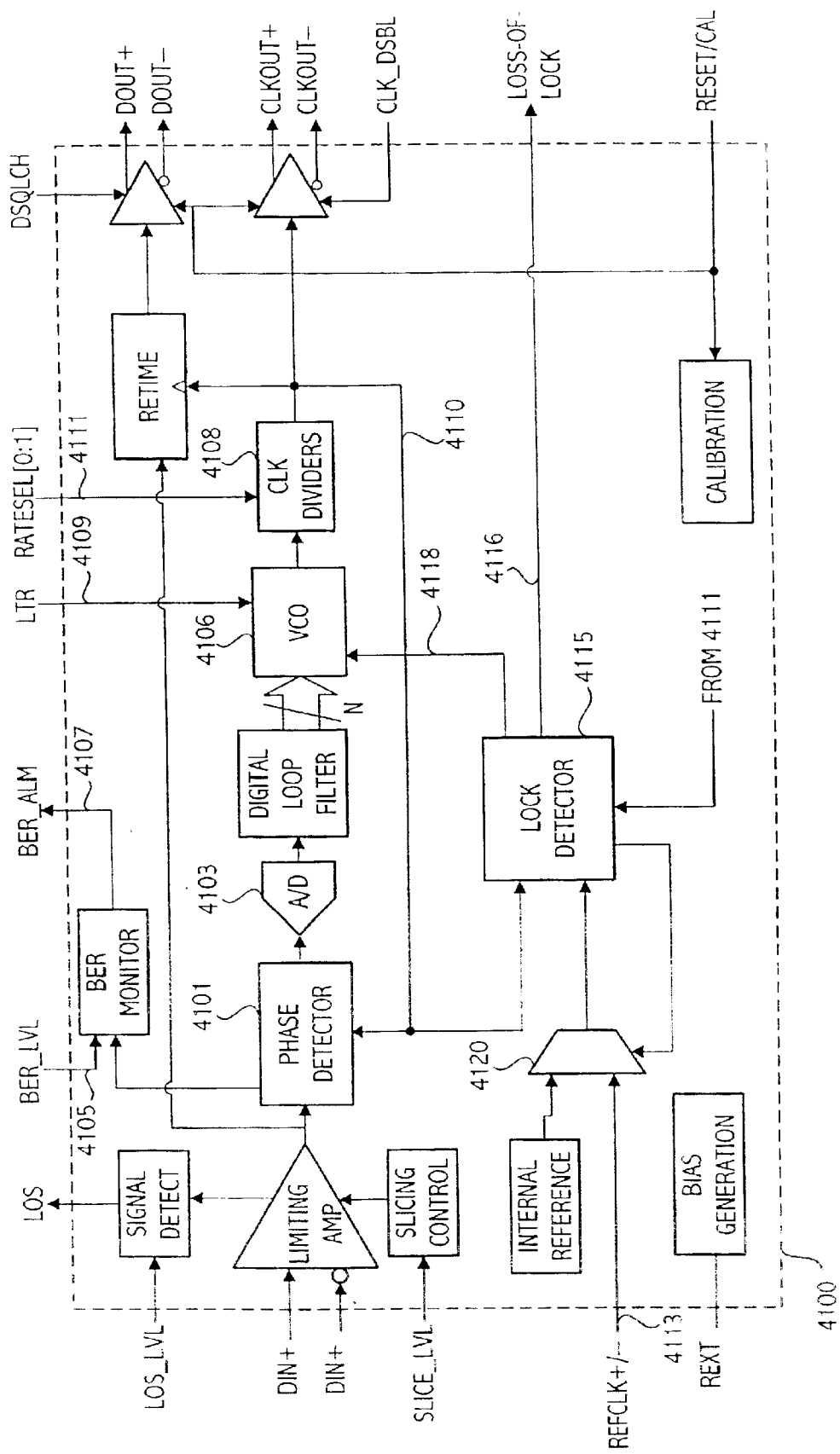
FIG. 41 shows a block diagram of a clock and data recovery integrated circuit incorporating various aspects described herein.

In addition to outputting an analog signal indicative of the bit error rate, a BER alarm output terminal may be used to indicate that the bit error rate is above a programmable or fixed threshold value. That threshold value may be determined by an analog signal (e.g., a voltage) supplied to a BER alarm level input terminal of the integrated circuit. The supplied analog voltage may be converted to a digital value and compared with a calculated bit error rate. If the measured bit error rate is above the BER threshold value, the BER alarm output terminal indicating the bit error rate is above the threshold value is set. In one embodiment the bit error alarm threshold can be set to one of 64 discrete values between error rates of $10^{-3}$ and $10^{-4}$ by applying a voltage to the BER alarm level input terminal between 500 mV and 2.25V, corresponding to bit error rates of $10^{-3}$ and $10^{-4}$, respectively. That voltage is then converted to the appropriate six bit digital value and compared with the calculated bit error rate to determine whether to assert the BER alarm output terminal. FIG. 41 illustrates the BER alarm output terminal and the BER alarm level input terminal.

The bit error rate, determined as described above, every 512 trials, may be used to control the BER alarm output pin. Alternatively, the bit errors may be counted and the alarm output controlled more frequently if desired. In one embodiment the BER alarm output is evaluated every approximately 25.6 microseconds. If after 64 trials (at 2.5 MHz), the BER counter is above a critical count value corresponding to the BER alarm level, the BER alarm is asserted. In one embodiment, hysteresis may be selectable so that once the BER alarm is asserted, it is deasserted after 128 or 256 trials. Alternatively, no hysteresis may be utilized. The hysteresis utilized may be programmed over a serial communication port, hardwired in the design or pin programmable.

Figure 29:
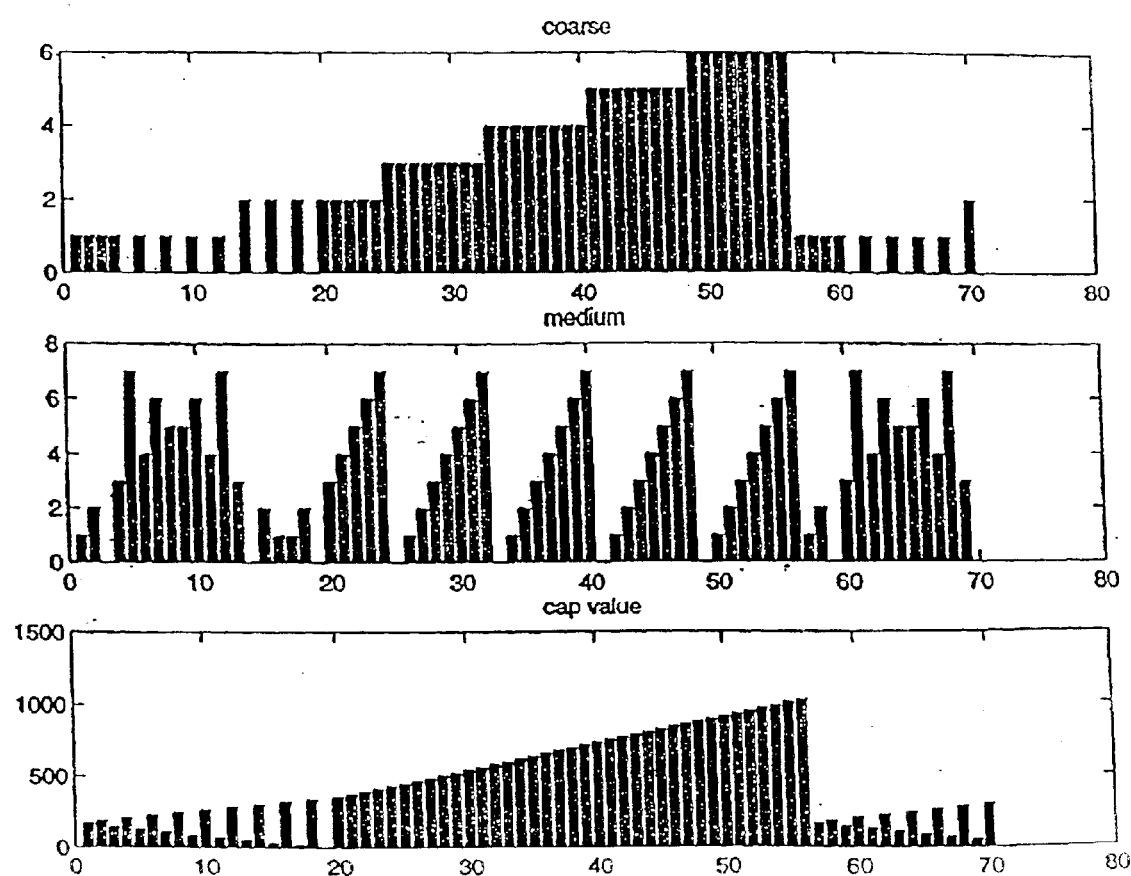
FIGS. 29–31 illustrate the operation of stepping the capacitance values of the VCO while trying to acquire lock.
Figure 30:
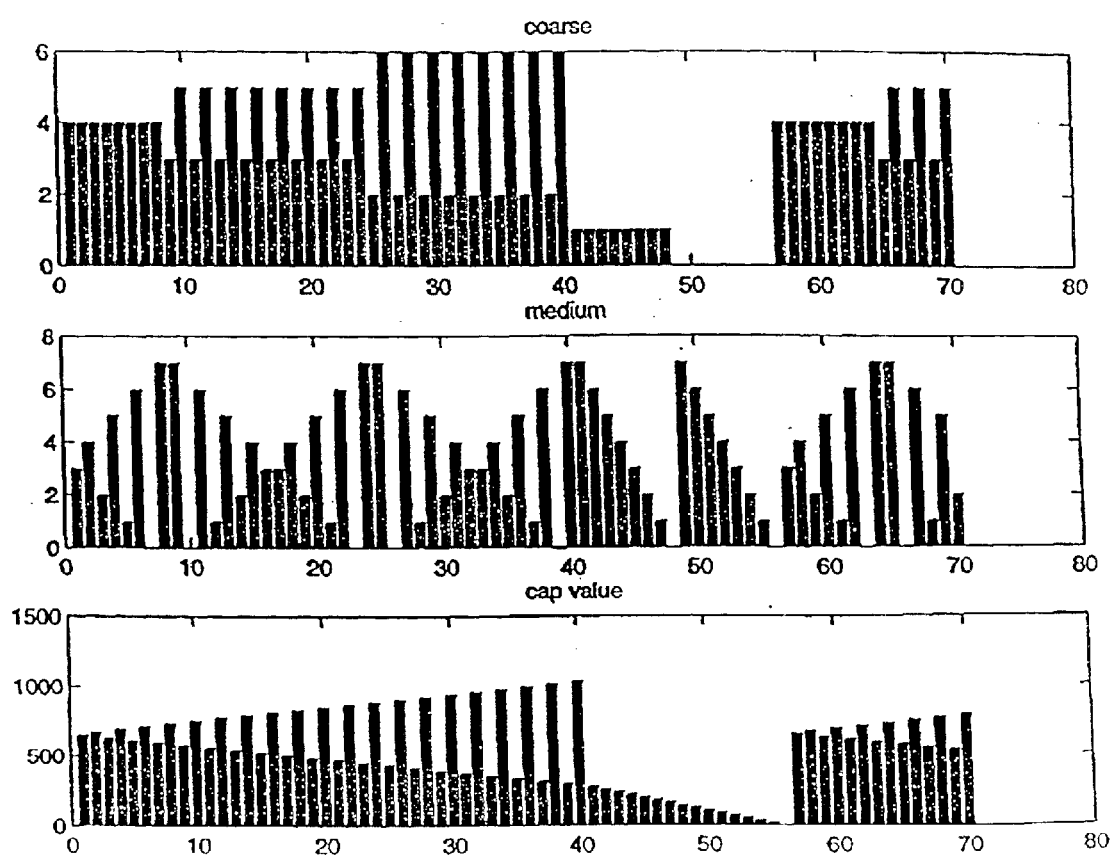
Figure 31:
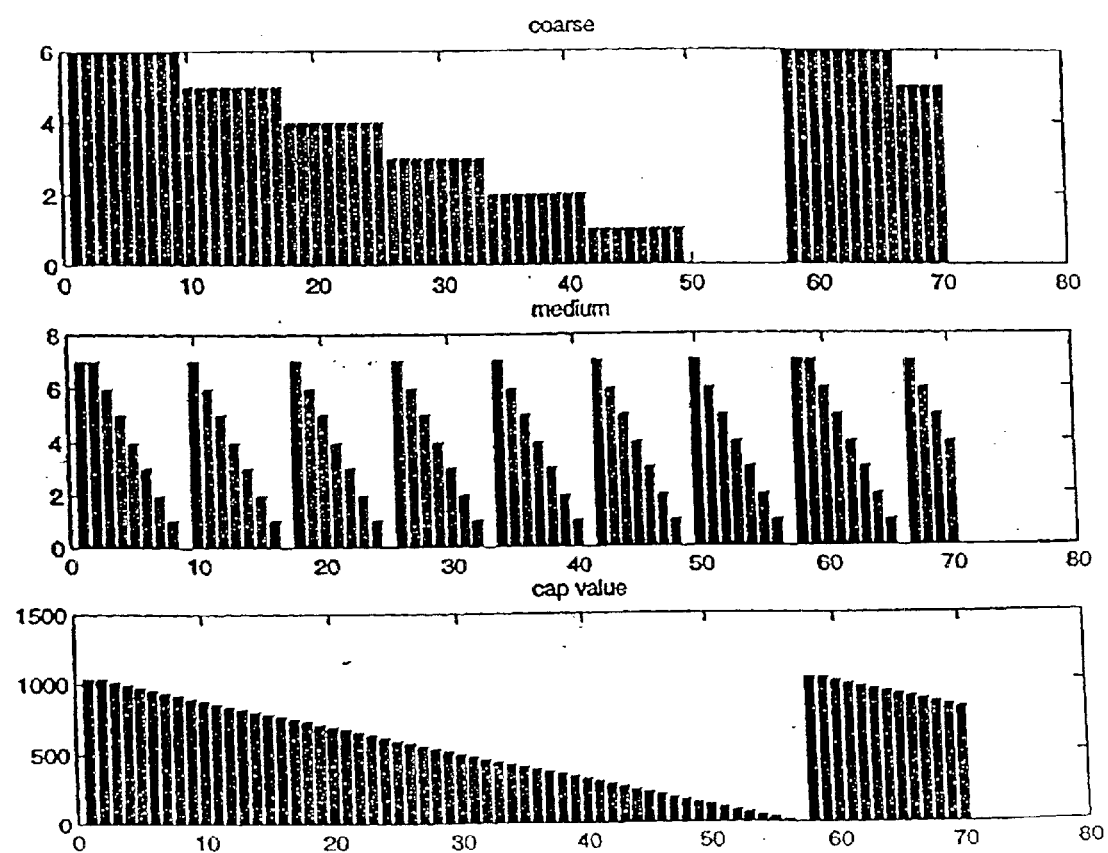

Referring to FIGS. 29–31, exemplary simulations illustrate operation of stepping the capacitance values of the VCO while trying to acquire lock. In the embodiments illustrated in FIGS. 29–31, there are assumed to be 7 different coarse capacitance settings and 8 different medium capacitance settings. In addition, fine frequency capacitance settings (6 in an exemplary embodiment) are swept for each of the coarse/medium settings. In the example shown in FIGS. 29–31, the top graphs indicate the coarse capacitance settings, the middle graphs indicate the medium capacitance settings and the bottom graphs indicate the cumulative coarse/medium capacitance values. The capacitance values are in femtoFarads. In FIG. 29, the initial medium capacitance setting is 1 and the initial coarse capacitance setting is 1. Note that the stepping of the coarse and medium capacitance settings causes the total capacitance shown in the bottom graph to step successively more positively and negatively around the initial capacitance value determined by an initial coarse and medium setting of one. After 20 different setting combinations, a minimum capacitance value is reached and the capacitance value is incremented for the remainder of the possible capacitance values. After 56 different settings, the stepping of the capacitance values begins to repeat.

In FIG. 30, the initial medium capacitance setting is 3 and the initial coarse capacitance setting is 4. The stepping of the coarse and medium capacitance settings causes the total capacitance to step successively more positively and negatively around the initial capacitance value determined by the initial medium and coarse setting. After 40 different combinations of course and medium settings, a maximum capacitance value is reached and the capacitance value is decremented for the remainder of the possible capacitance values. After 56 different settings, the stepping of the capacitance values begins to repeat.

In FIG. 31, the initial medium capacitance setting is 7 and the initial coarse capacitance setting is 6, which are maximum values. Since the initial setting is a maximum value, the stepping of the coarse and medium capacitance settings causes the total capacitance to step negatively from the initial maximum capacitance value. After 56 different setting combinations, the minimum capacitance value is reached and stepping of the capacitance values begins to repeat.

While variable capacitance circuits may be particular useful in LC tank circuit implementations of an oscillator, other embodiments may utilize different types of oscillators, e.g., a ring oscillator. In addition, rather than adjusting the capacitance to acquire lock, the voltage or current supplied to a variable oscillator may be adjusted to change frequency until lock is achieved. As long as a control parameter can be adjusted for the particular oscillator used so its output frequency can be varied in response to bit error detection techniques described herein, the type of oscillator that can be used to practice the invention can vary widely and include a wide variety of voltage controlled and current controlled oscillator circuits.

Figure 32:
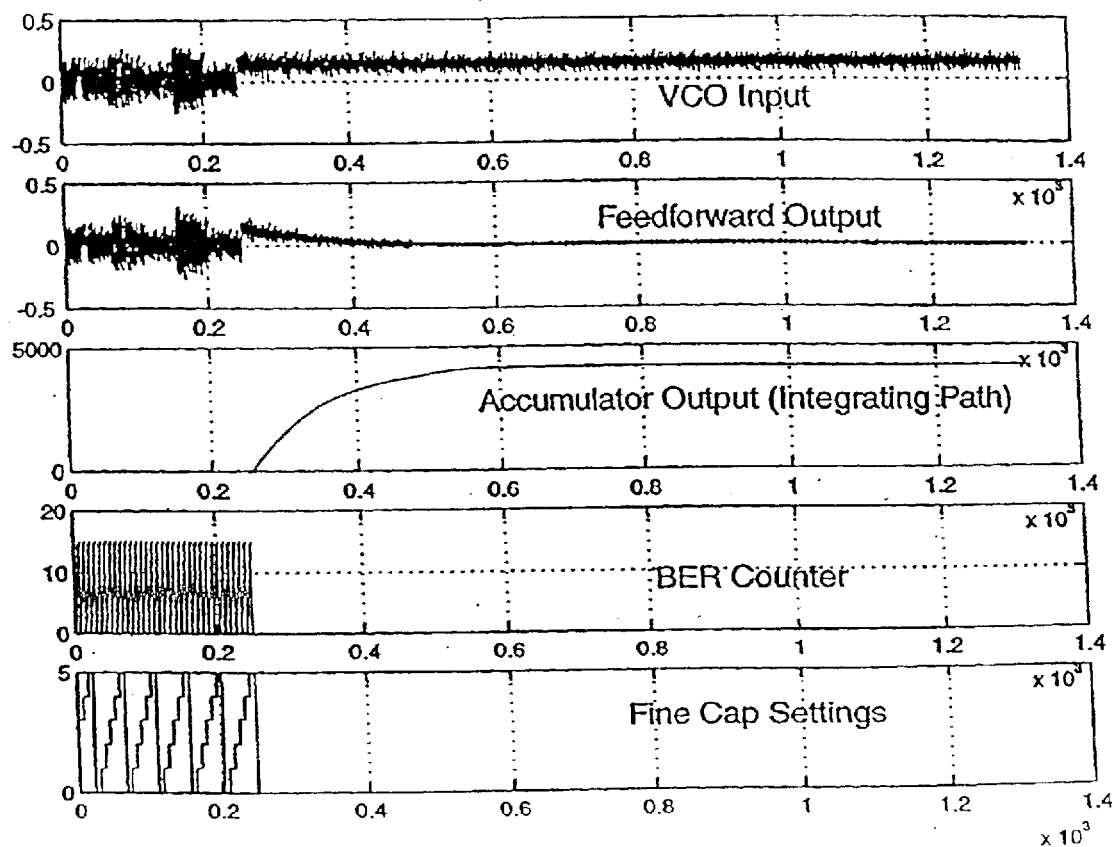
FIGS. 32–40 illustrate simulation of frequency detection under various conditions.
Figure 33:
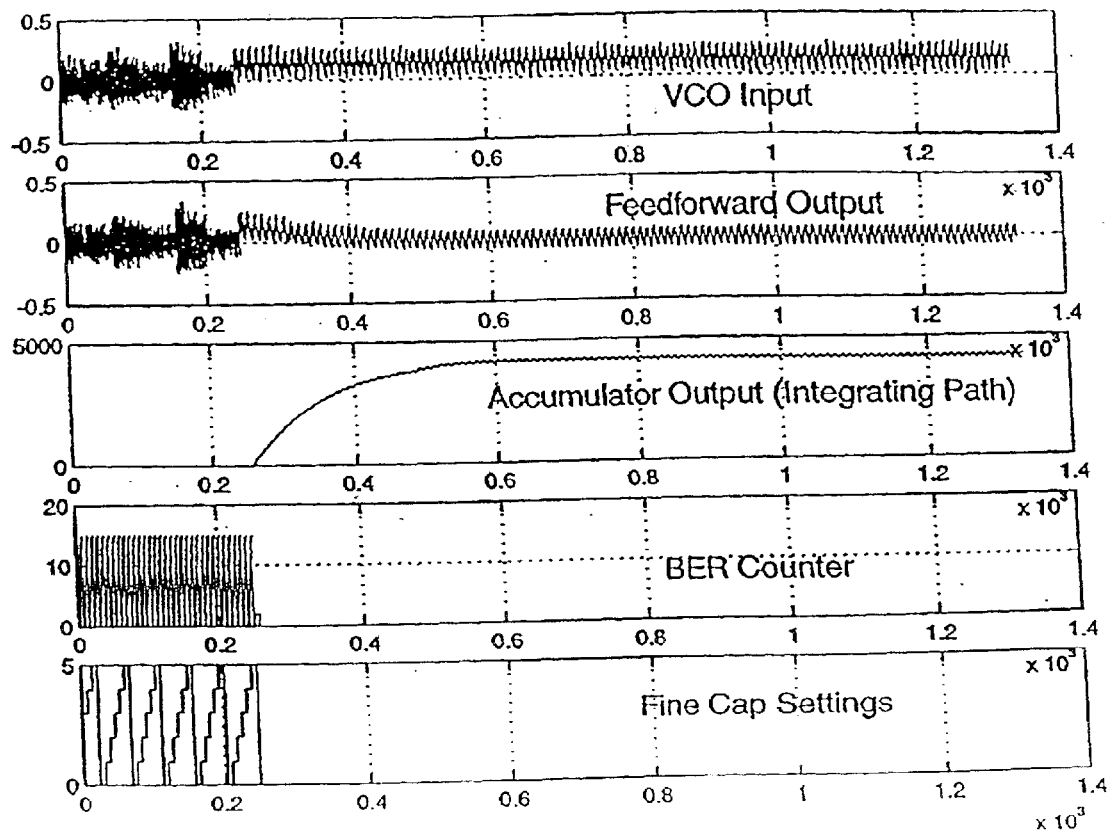
Figure 34:
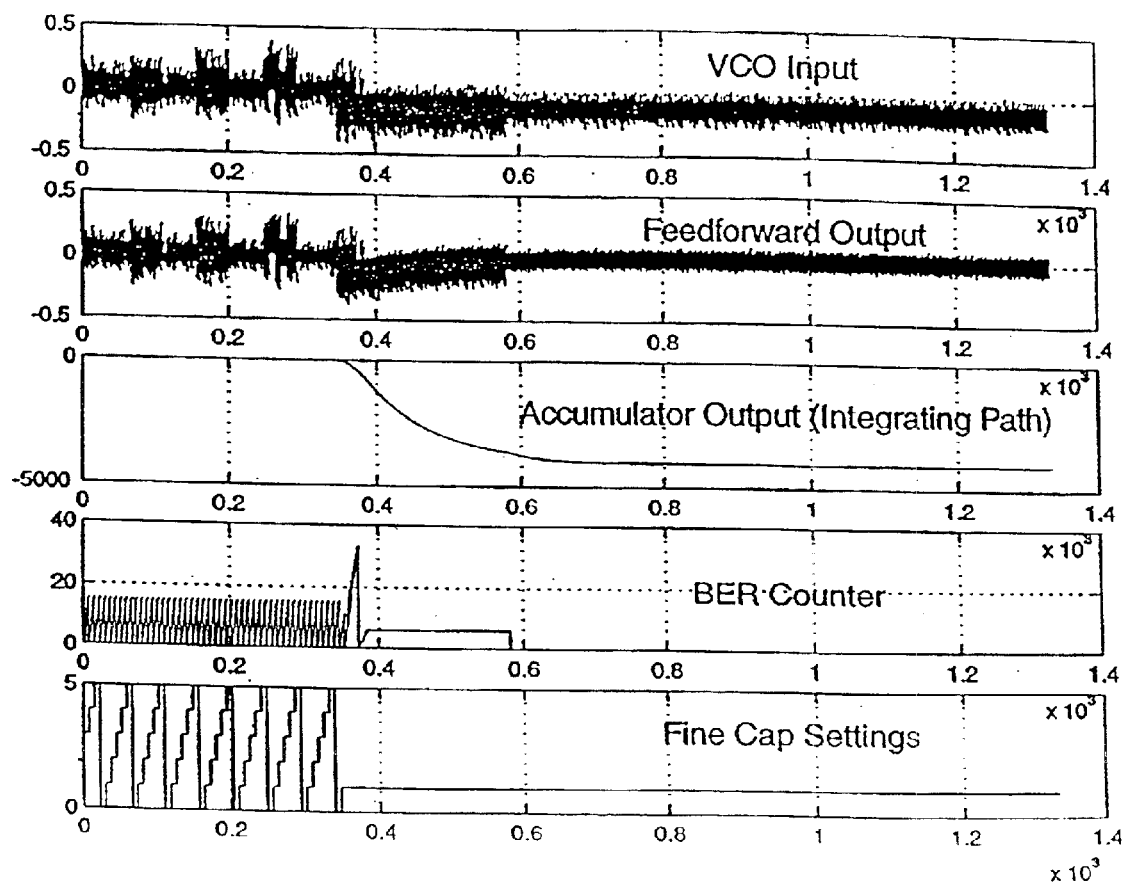
Figure 35:
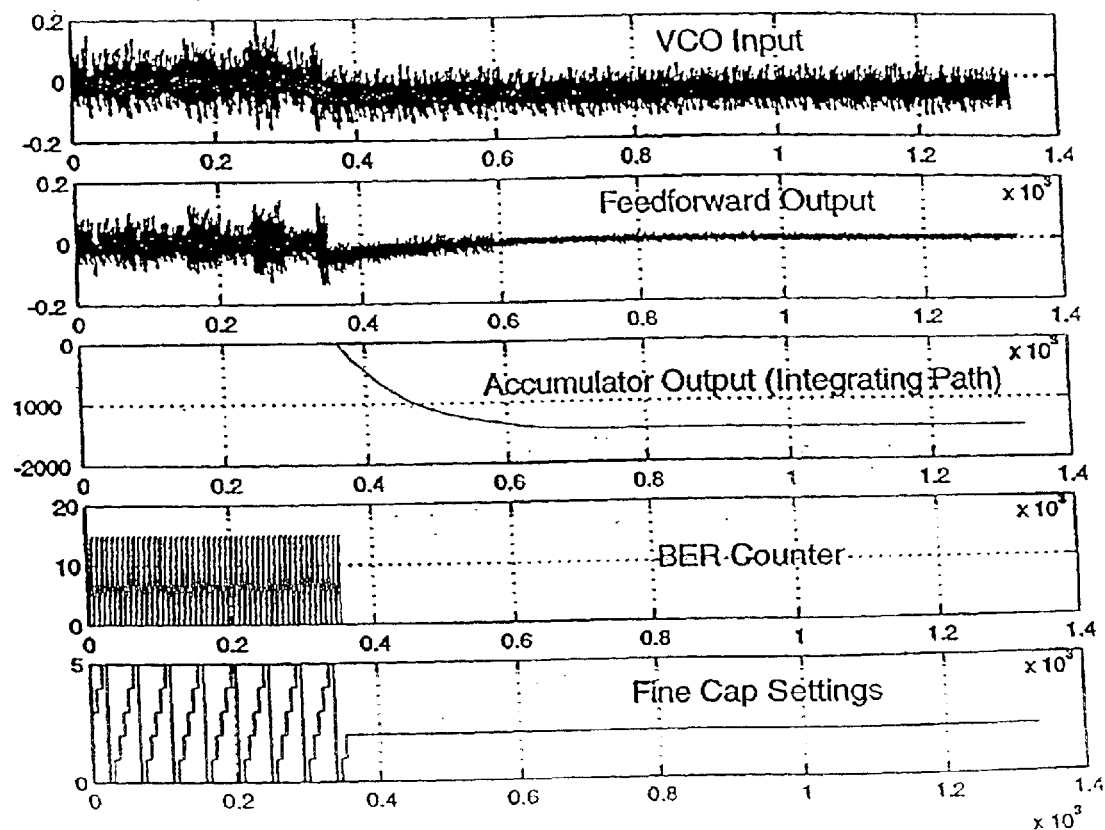
Figure 36:
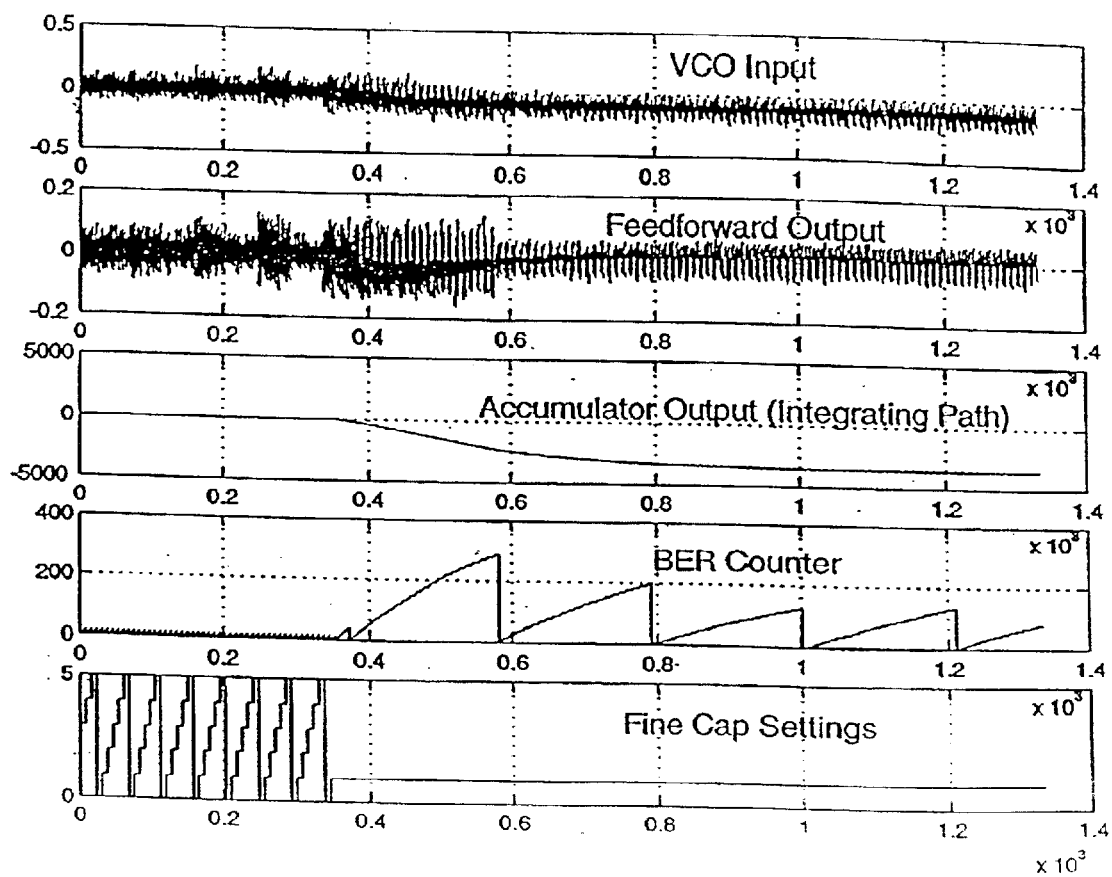
Figure 37:
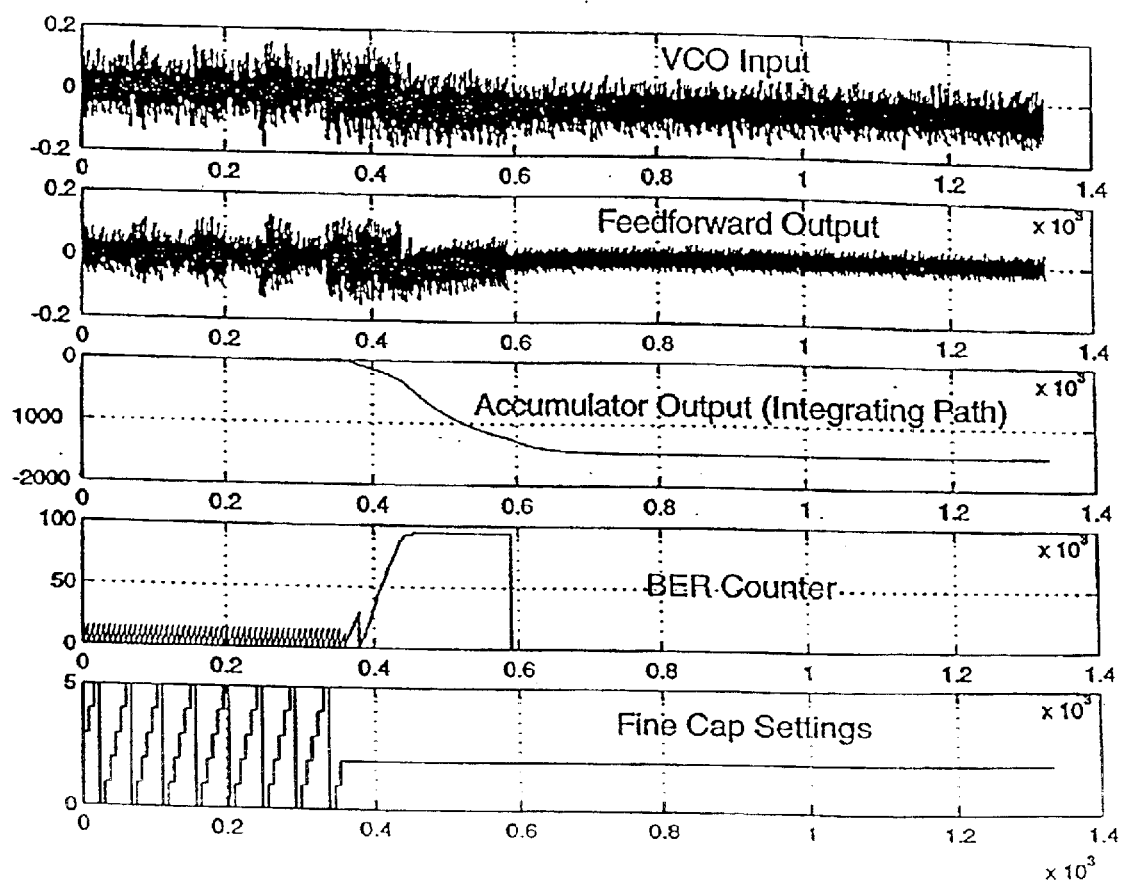
Figure 38:
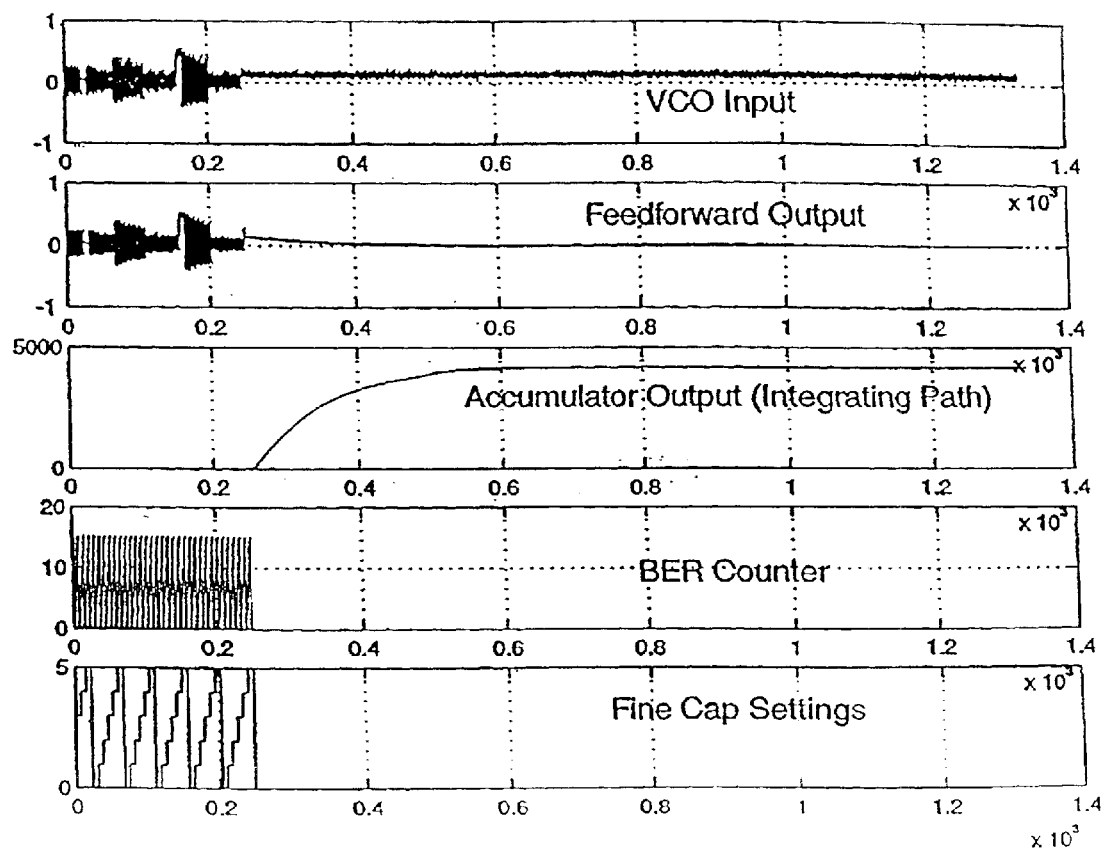
Figure 39:
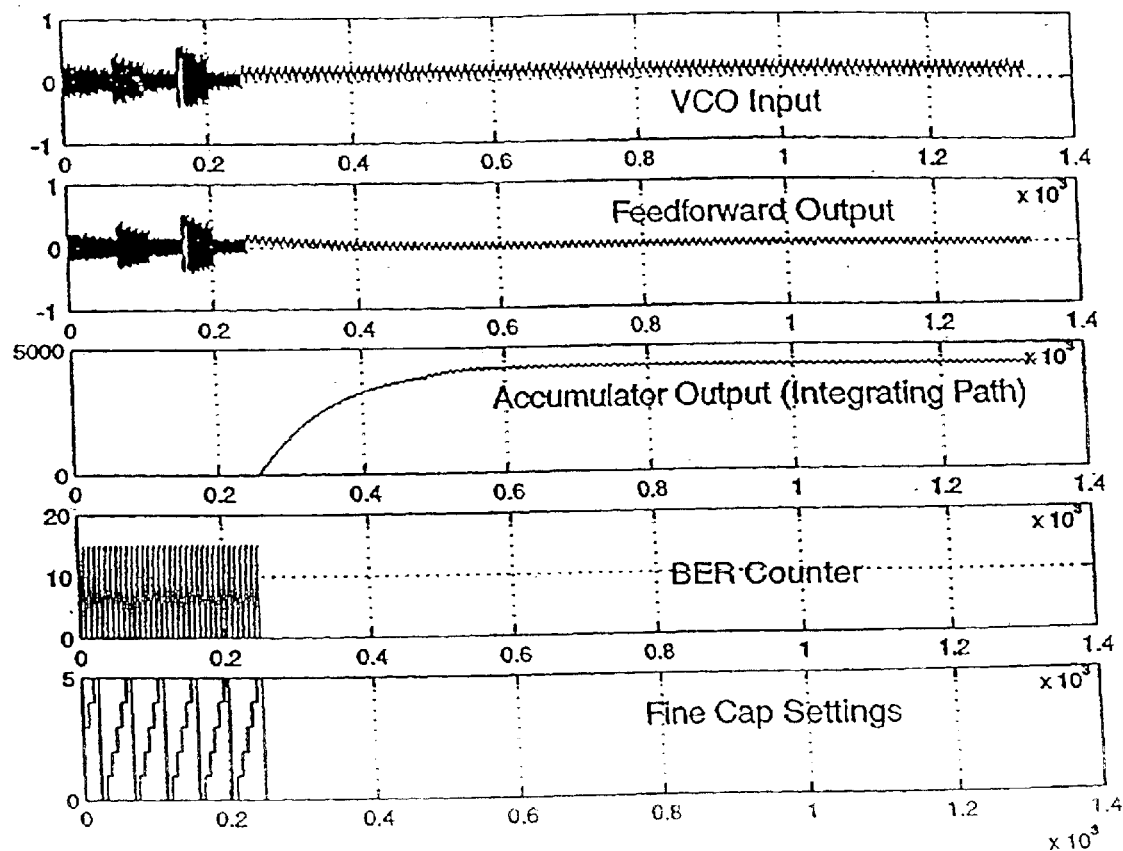
Figure 40:
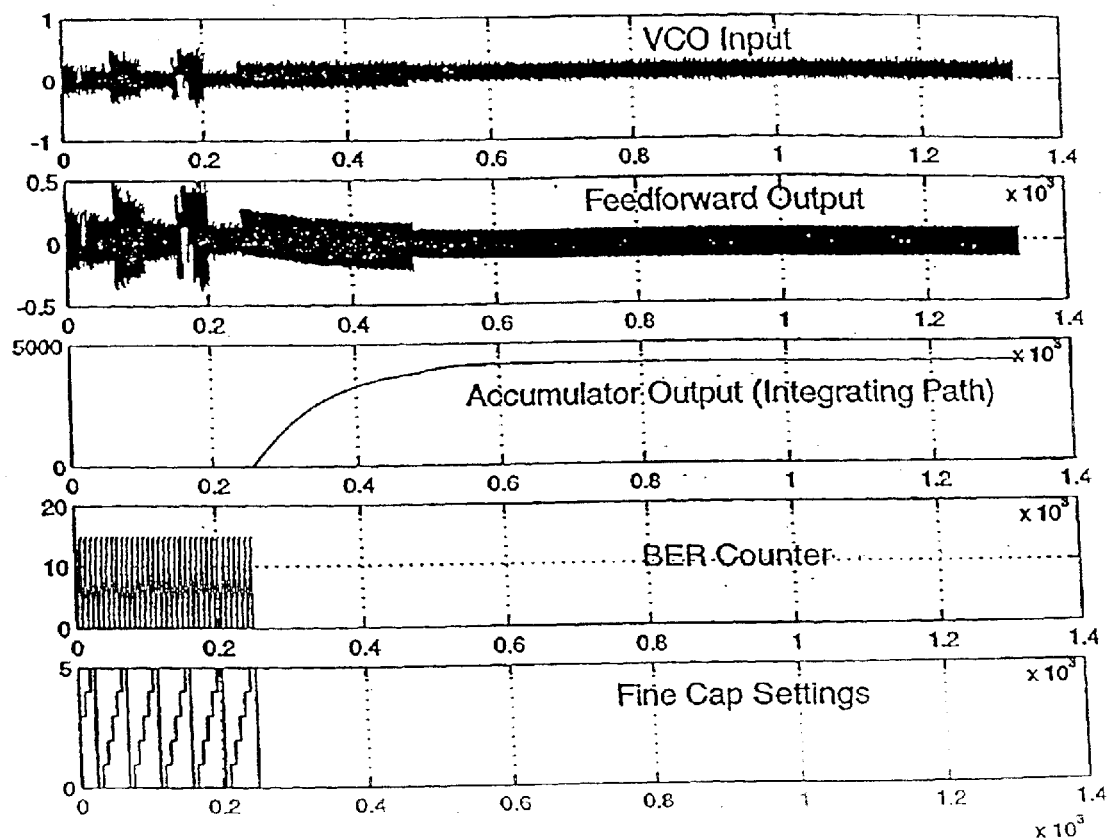

FIGS. 32–40 illustrate simulations of frequency detection under various scenarios of jitter and transition densities for one embodiment of the invention. The figures show the VCO input and feedforward output (see FIG. 23) in volts. The figures also illustrate accumulator output, the bit error rate counter and the stepping of the fine capacitors settings (0–5). Once the accumulator output begins to become positive, lock is achieved. In FIG. 32, the transition density is assumed to be ½ with no jitter. In FIG. 33, the jitter is 5 Unit Intervals (UI) at 100 kHz. The PLL performance can be seen to exceed the jitter tolerance specifications proposed for SONET/SDI equipment by Bellcore GR-253-CORE, Issue 2, December 1995 and the ITU-T G.958. The x axis shown in FIGS. 32–40 is in thousands of microseconds.

FIG. 32 shows that the fine capacitor settings were adjusted each time the BER counter reached 16, indicating that lock was not achieved in state 2. After approximately 250 microseconds, the VCO has locked to the input data stream and the fine capacitor settings are no longer being swept, indicating that the coarse and medium settings are stable as well. Note that the accumulator output shown indicates offsets from a center value and not necessarily negative or positive numbers. Note also that the characteristics of the input data stream affect the BER counter. For example, FIG. 36, the BER counter, while locked, indicates a higher bit error rate than FIGS. 32–35.

Referring to FIG. 41, the various referenceless embodiments described herein are particularly useful in a clock and data recovery (CDR) integrated circuit 4100, which is utilized for high speed serial communication systems in which timing information and data is extracted. Note that an analog bit error rate threshold signal, described previously, is supplied on input terminal 4105 as the threshold for the bit error rate alarm signal supplied on output terminal 4107, which is asserted when the measured bit error rate is above the threshold value. The CDR 4100 may also supply on a BER output terminal (not shown), an analog voltage indicating the bit error rate as previously described herein. Lock to reference (LTR) supplied on input terminal 4109 is an externally provided signal causing the control circuit 2301 (FIG. 23) to remain in state 0. The rate select inputs on input terminals 4111 may be used to select the programmable delay values (see FIGS. 18 and 19) in the augmented phase detector utilized in PLL 372.

In addition FIG. 41 shows conceptually the optional use of an external reference clock (REFCLK+/−) supplied on node 4113 to provide the exemplary integrated circuit with both referenceless and reference clock modes of operation. Selector circuit 4120 symbolically shows the two modes of operation although it is not intended to represent the actual implementation of referenceless mode operation as described above. In reference clock mode, the reference clock helps the VCO acquire the frequency of the input data stream, by centering the VCO output frequency for a nominal output that approximates the frequency of the input data stream. Use of the optional external reference clock can minimize acquisition time and maintain a stable output clock when lock-to-reference is asserted. In reference clock mode, the VCO multiplies the reference clock by a predetermined (or selectable factor), e.g., 16, to achieve the nominal VCO output. In addition to using the reference clock to center the nominal output of the PLL, the reference clock is also used to determine whether lock has been achieved as described below. In one embodiment the reference clock centers the VCO for a nominal output of between 2.5 GHz and 2.7 GHz. The VCO frequency is centered at 16, 32 or 128 times the reference clock frequency. Automatic detection circuitry continuously monitors the reference clock input to determine whether the device should be configured for a reference clock that is $\frac{1}{16}$, $\frac{1}{32}$, or $\frac{1}{128}$ time the nominal VCO output.

When the external reference clock is used, the lock-detect circuit compares the frequency of a divided down version of the recovered clock with the frequency of the supplied reference clock. If the recovered clock frequency deviates from that of the reference clock by a predetermined amount, the PLL is declared out of lock and the loss-of-lock indicator is asserted. While the loss-of-lock signal is asserted on output terminal 4116, the PLL tries to reacquire lock with the incoming data stream. In one embodiment, during reacquisition the recovered clock frequency will drift over a 1% range relative to the supplied reference clock. The LOL output remains asserted until the recovered clock frequency is within the reference clock frequency by the predetermined amount. In referenceless mode, lock is determined as previously described herein. During reacquisition in referenceless mode, the recovered clock frequency can vary by 10% from the nominal data rate.

Note that the lock-to-reference (LTR) input can be used to force the PLL to lock to the externally supplied reference. In referenceless mode, LTR causes the VCO to output a frequency based on previously stored digital control values as described previously herein.

Because added input pins can cause increased cost, it would be desirable to detect the mode of operation (referenceless or use of a reference clock) without the need for an additional pin or pins to specify the mode of operation. Thus, e.g., in a clock and data recovery application, capable of operating in referenceless and reference clock mode, it would be desirable to detect the mode of operation according to, e.g., the signal that is supplied on an input terminal used for the reference clock. In one embodiment, in referenceless mode of operation, the input terminals 4113 are tied to a fixed voltage, e.g. grounded. In reference clock mode of operation, the input terminals 4113 have a reference clock, which may operate at one or more frequencies. In the simplest implementation, the CDR 4100 detects between one reference frequency and no reference frequency. In a preferred implementation, the clock and data recovery circuit 4100 automatically detects not only whether to operate in referenceless or reference clock mode of operation, but also detects, which of a plurality of possible reference clock frequencies are being supplied in reference clock mode of operation.

Figure 42:
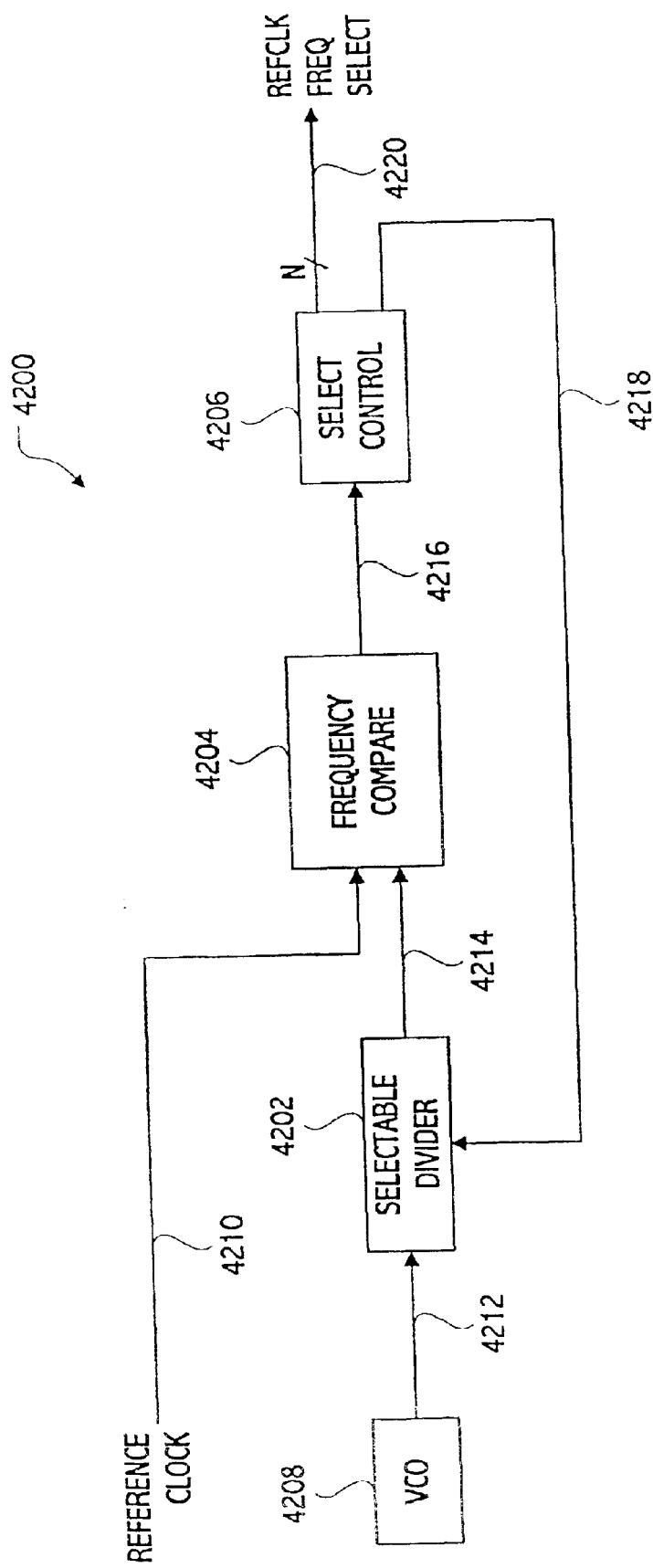
FIG. 42 is a block diagram of an embodiment of an auto-detect block in accordance with the present invention.

A block diagram is shown in FIG. 42 of a circuit block residing on an integrated circuit device which automatically detects the frequency of the reference clock signal and can be used to determine whether to operate in reference clock mode or referenceless mode. In one embodiment in reference clock mode, the supplied reference clock is one of at least two possible reference clock frequencies. In referenceless mode, a fixed voltage, e.g., 0V, may be supplied to the integrated circuit device. The auto-detect block 4200 includes a selectable divider 4202 which receives, by way of node 4212, the output clock from an internal voltage control oscillator 4208. Alternatively, another source for an internal frequency reference could be used instead of a VCO. A frequency compare block 4204 is used to compare the frequency of the reference clock signal conveyed on node 4210 to the frequency of a second signal conveyed on node 4214 which is either the VCO clock frequency or a divided-down version thereof. The output of the frequency compare block 4204, conveyed on node 4216, is communicated to a select control block 4206 which provides an output signal (on an N-bit bus 4220) to indicate which of the reference clock frequencies is detected. Select control block 4206 also generates on node 4218 one or more control signals to control the selectable divider block 4202.

To appreciate the functionality of this circuit, assume the VCO 4208 operates nominally at 200 MHz. Further assume that the reference clock supplied by way of node 4210 may either be a 200 MHz clock, a 100 MHz clock, or a 50 MHz clock. The selectable divider block 4202 produces on its output node 4214 a clock rate which is either equal to 200, 100 or 50 MHz, depending upon the state of the control input (node 4218) from the select control block 4206. Each of these three frequencies is sequentially conveyed on node 4214 and is compared to the external reference clock by frequency compare block 4204. An indication is provided by way of node 4216 as to how well the individual frequency matches the external reference clock frequency. The select control block 4206, which may be a relatively simple state machine, scans through all potential frequencies and generates the output signal (conveyed on node 4220) in accordance with the frequency found to be the best match.

The selectable divider block 4202 may be implemented in a variety of ways. For example, a string of simple dividers which together implement a rudimentary ripple counter may be implemented along with a multiplexer, controlled by the select input received on node 4218, to choose which of the intermediate frequencies are routed to the output node 4214. Alternatively, a more individualized divider circuit may be incorporated which is configured to produce various divider ratios when selected in accordance with the control input received on node 4218.

If the frequency of the internal VCO is much higher than the highest potential reference clock frequency, an optional divider may be included between the VCO 4208 and the selectable divider block 4202 to generate a signal having a convenient frequency, such as the highest possible incoming frequency of the external reference clock. Each of the blocks described in FIG. 42 may be implemented in a variety of suitable ways.

Figure 43:
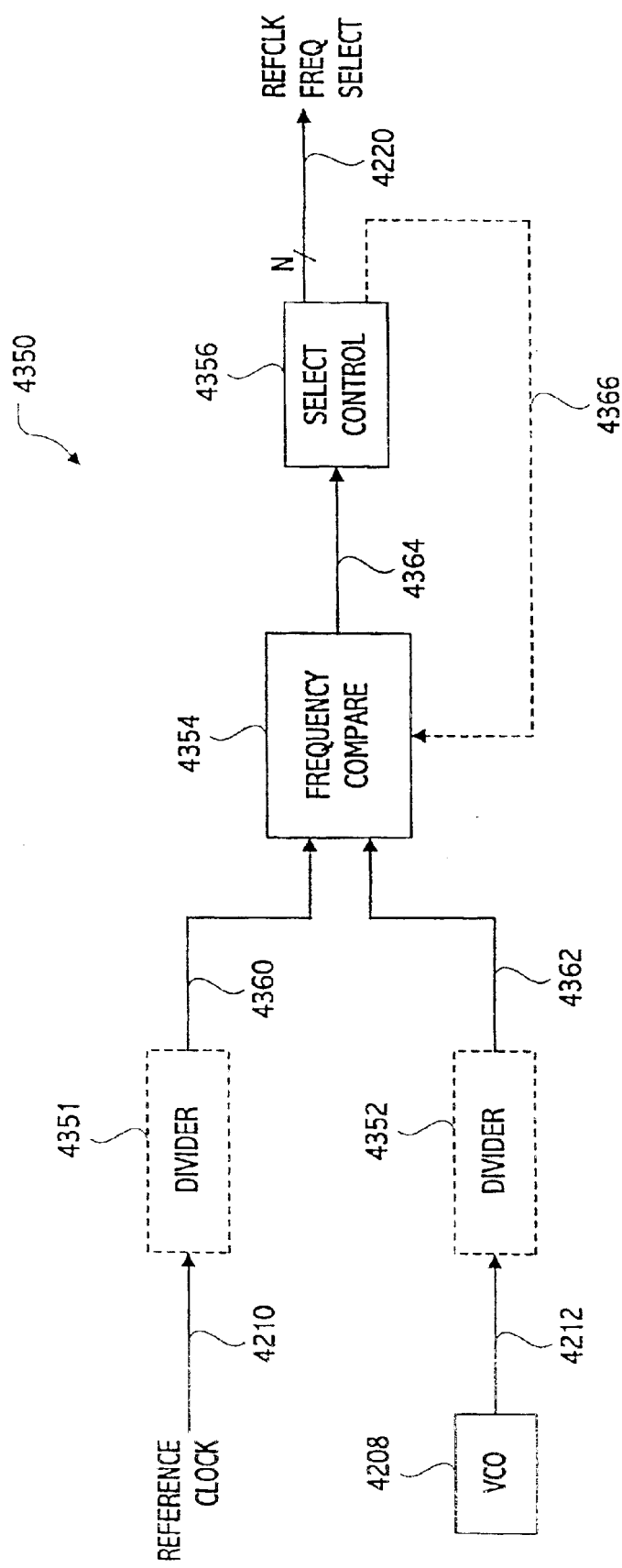
FIG. 43 is a conceptual block diagram of another embodiment of an auto-detect block in accordance with the present invention.

A conceptual block diagram is shown in FIG. 43 of another circuit block residing on an integrated circuit device which automatically detects which of at least two possible reference clock frequencies is being supplied to the integrated circuit device. The auto-detect block 4350 includes an optional divider 4351 that receives the reference clock signal conveyed on node 4210 and generates an output signal on node 4360 (either identical with the reference clock signal or preferably a divided-down version thereof). An optional divider 4352 receives, by way of node 4212, the output clock signal from the internal voltage control oscillator 4208 and generates an output signal on node 4362 (either identical with the VCO clock signal or preferably a divided-down version thereof). As before, another source for an internal frequency reference could be used instead of a VCO. A frequency compare block 4354 is used to compare the frequency of the reference clock signal (or a divided-down version thereof) to the frequency of the VCO clock frequency (or a divided-down version thereof). The output of the frequency compare block 4354, conveyed on node 4364, is communicated to a select control block 4356 which provides an output signal on node 4220 (which may, if required, be an N-bit bus) to indicate which of the reference clock frequencies (including no frequency) is detected. One or more optional control signals may also be generated on node 4366 to control the frequency compare block 4354. Alternatively, such a control signal may be generated entirely within the frequency compare block 4354. The optional dividers 4351, 4352 are preferably utilized to lower the frequency of both the VCO clock and the reference clock, and consequently may simplify the implementation and lower the power consumption of the frequency compare block 4354. Each of the blocks described in FIG. 43 may be implemented in a variety of suitable ways.

Figure 44:
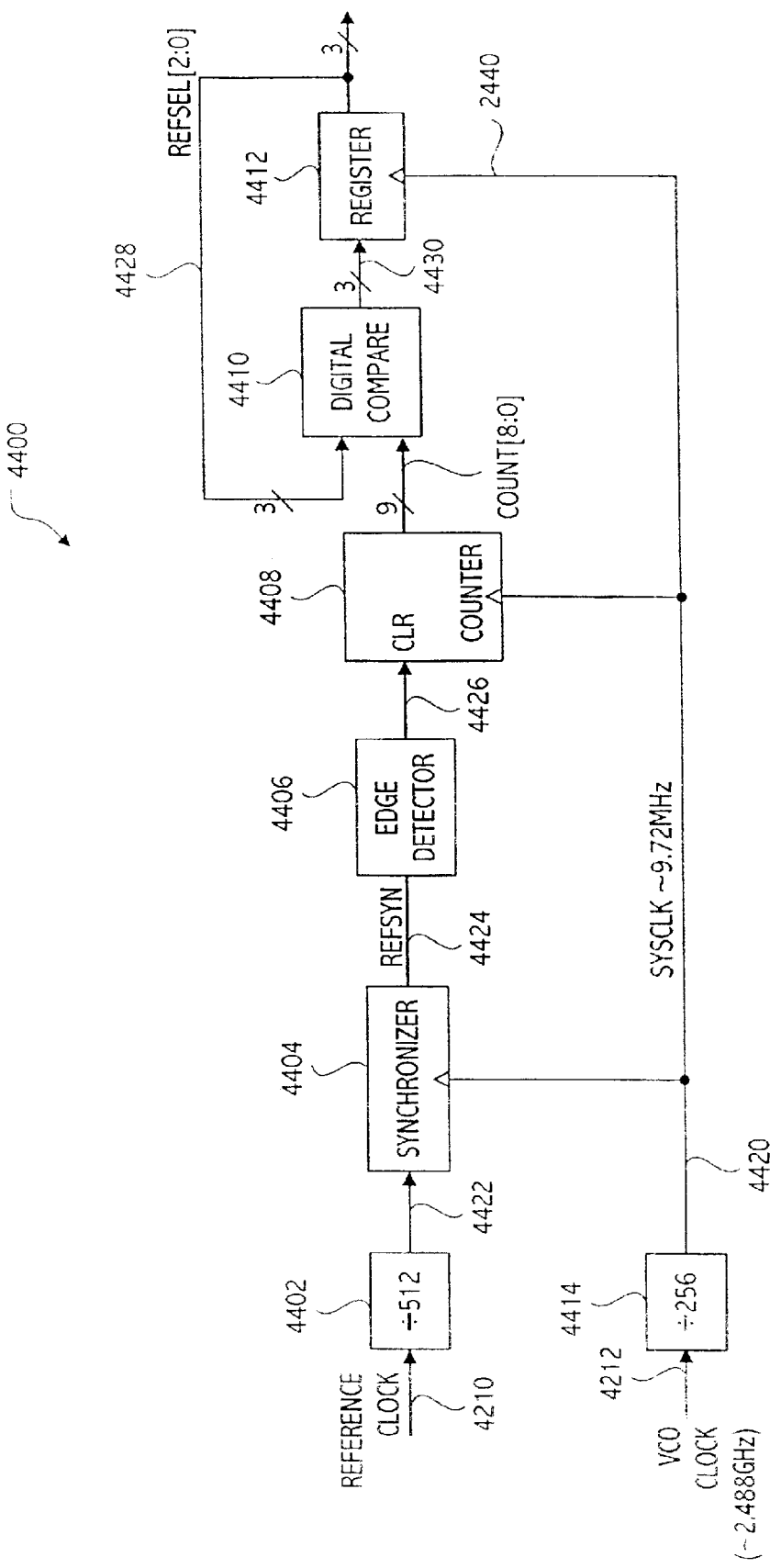
FIG. 44 is a block diagram of yet another embodiment of an auto-detect block in accordance with the present invention.

Referring now to FIG. 44, an embodiment is shown which is particularly suitable for use in a clock and data recovery circuit. In this exemplary embodiment an internal VCO (not shown) is configured to nominally operate at 2.488 GHz. The reference clock provided to the integrated circuit may have a frequency of 155.52 MHz, 77.76 MHz, 38.88 MHz, 19.44 MHz, 9.72 MHz or 4.86 MHz (or lower). The auto-detect block 4400 includes a divide-by-256 block 4414 which generates on its output node 4420 a SYSCLK signal having a nominal frequency equal to 9.72 MHz. Also included is a divide-by-512 block 4402 which receives the externally provided reference clock conveyed on node 4210 and generates on its output node 4422 a divided-down version thereof. Since the VCO clock runs so much faster than even the fastest potential externally provided reference clock frequency, the square wave generated on output node 4422 is, for all possible reference clock frequencies, much slower than the SYSCLK signal generated on node 4420. Since the externally provided reference clock is likely to be asynchronous to the VCO clock, particularly prior to initial lock of the loop, a synchronizer 4404 is included to generate on its output node 4424 a REFSYN signal substantially equal in frequency and duty cycle to its input signal, but which is synchronized to the SYSCLK signal. Such a synchronizer 4424 may be implemented in any of a variety of well-known ways. One particularly suitable way utilizes two D-registers in series, both clocked by the SYSCLK signal, to reduce the likelihood of metastable operation influencing the timing of the output signal REFSYN. The REFSYN signal is therefore a synchronous signal with respect to the SYSCLK signal, although the edge placement of the REFSYN signal has an uncertainty of one cycle of the SYSCLK signal, as described below. Traditional synchronous design techniques may be utilized for the remainder of the circuitry.

The REFSYN signal conveyed on node 4424 is next communicated to an edge detector 4406 which generates on its output 4426 a pulse upon detecting a high-to-low or low-to-high transition in the REFSYN signal. In other words, this pulse occurs once every half-period of the REFSYN signal. Counter 4408 is provided to count the number of cycles of the SYSCLK signal which occur during each half period of the REFSYN signal. The output of the edge detector, node 4426, is provided to counter 4408 to clear the counter once per half period of the REFSYN signal. In this way, during each half period the counter 4408 starts counting from zero and counts up to a value which indicates the number of SYSCLK cycles "counted" during the preceding half period of the REFSYN signal. The value of this counter is communicated, for this example, as a COUNT [8:0] signal using a nine-bit output bus. The digital compare block 4410 compares the state of the COUNT signal, and looks at the current state of the reference clock select signal conveyed on node 4428 (denoted as the REFSEL[2:0] signal) to generate on its output bus 4430 a updated value for the REFSEL signal which is clocked into a 3-bit register 4412 by the SYSCLK signal.

Both divide blocks 4402 and 4414 may be conveniently implemented as a series connected group of simple registers configured as divide-by-two blocks forming a rudimentary ripple counter. No reset signal is required for these divider registers because even if they power up into arbitrary states, after a brief period of clocking all of the flip-flops will align themselves in a known state and implement correctly the appropriate divide-by factor for each of the two respective blocks. The edge detector 4406 may be conveniently implemented in a variety of ways. One such particularly advantageous implementation utilizes an XOR gate. One input of the XOR gate is connected directly to the REFSYN signal conveyed on node 4424, while the other input of the XOR gate is connected to a delayed version of the same REFSYN signal generated by a simple delay circuit. Such a configuration is well known in the art and generates a brief output pulse whose duration is equal to the delay through the delay circuit.

It can be appreciated from inspection of FIG. 44 that each half period of a synchronized signal, divided-down from an externally provided reference clock, is used to count the number of cycles of a divided-down VCO clock signal which occur during each half period. During each half period, a counter increments from zero up to a value indicative of how many SYSCLK signal clock cycles are counted, and which value is communicated as a multiple-bit signal on a parallel bus. By looking at the count value which is reached on this bus before it is reset, the frequency of the externally provided reference clock may be ascertained and appropriate internally provided select signals generated to indicate which of the potential reference clock frequencies is being provided to the device. If the nominal or free-running frequency of the VCO clock is controlled well enough to result in predictable ranges of count values as a function of which frequency the reference clock is operating at, then the maximum value of this count may be used to determine which of the discrete reference clock frequencies is provided.

Referring now to Table 1, a chart is shown which summarizes, for each of six discrete possible reference clock frequencies, the resulting variations in the maximum value of the count value. In each of the six entries (i.e., rows) of the chart, the VCO frequency is assumed to vary within a range of −20% to +40% of the nominal value of 2.488 GHz. The third column of the chart specifies the corresponding SYSCLK period for both the low end and high end of the VCO operating range. As can be seen, the period ranges from 0.129 microseconds for a VCO operating at 20% below its nominal frequency (i.e., 2.0 GHz) to a period of 0.073 microseconds for a VCO operating at the upper end of its nominal operating range (i.e., 3.5 GHz). The fourth column of the chart sets forth the length of the measured interval $t_{meas}$ as defined by:

$$t_{meas} = \frac{0.5}{\left(\frac{REFCLK}{512}\right)} \pm t_{SYSCLK}$$

Recall that the measurement interval is one-half period of the REFSYN signal, which is a synchronized, divided-by-512 derivative of the external reference clock signal REFCLK. The $\pm t_{SYSCLK}$ term accounts for the potential duty cycle error of 1 SYSCLK period caused by the synchronizer 204. The fifth column of Table 1 indicates the value of the COUNT which corresponds to the measurement interval specified in the fourth column. Looking initially at the first line of the chart for a reference clock frequency of 155.52 MHz, and with a VCO operating 20% slower than its nominal operating frequency, the maximum COUNT value corresponds to either 13.8 or 11.8. Similarly, for a fast VCO, the maximum COUNT value corresponds to either 23.4 or 21.4.

TABLE 1

| REF-CLK MHz | VCO freq. | $t_{SYSCLK}$ ($\mu$sec) | $t_{meas}$ ($\mu$sec) | COUNT | Comparison threshold | REFSEL [2:0] |
|---|---|---|---|---|---|---|
| 155.52 | −20% | 0.129 | 1.646 ± 0.129 | 13.8 or 11.8 | COUNT ≤ 23 | 7 |
|  | +40% | 0.073 | 1.646 ± 0.073 | 23.4 or 21.4 |  |  |
| 77.76 | −20% | 0.129 | 3.292 − 0.129 | 24.6 ≈ 24 | 24 ≤ COUNT ≤ 47 | 6 |
|  | +40% | 0.073 | 3.292 + 0.073 | 45.8 ≈ 45 |  |  |
| 38.88 | −20% | 0.129 | 6.584 − 0.129 | 50.2 ≈ 50 | 48 ≤ COUNT ≤ 95 | 5 |
|  | +40% | 0.073 | 6.584 + 0.073 | 90.6 ≈ 90 |  |  |
| 19.44 | −20% | 0.129 | 13.169 − 0.129 | 101.4 ≈ 101 | 96 ≤ COUNT ≤ 191 | 4 |
|  | +40% | 0.073 | 13.169 + 0.073 | 180.2 ≈ 180 |  |  |
| 9.72 | −20% | 0.129 | 26.34 − 0.129 | 203.8 ≈ 203 | 192 ≤ COUNT ≤ 383 | 3 |
|  | +40% | 0.073 | 26.34 + 0.073 | 359.4 ≈ 359 |  |  |
| 4.86 (or less) | −20% | 0.129 | 52.68 − 0.129 | 408.6 ≈ 408 | 384 ≤ COUNT | 2 |
|  | +40% | 0.073 | 52.68 + 0.073 | 717.8 ≈ 717 |  |  |

The sixth column of Table 1 indicates a comparison threshold for the COUNT value which may be used to ascertain which of the reference clock frequencies is measured. The final column indicates the value of the reference select signal REFSEL which is accordingly set when the maximum COUNT value falls within the range specified in the sixth column. For example, again looking at the first entry of the table, (i.e., REFCLK=155 MHz), if the maximum COUNT value reached before being reset is less than or equal to 23, then the reference clock may be assumed to be equal to the 155.52 MHz frequency, and the REFSEL signal is set to 7. This may be safely assumed even taking into account the assumed variations in VCO operating frequency. Looking at the second entry of the table, if the maximum COUNT value reached before being reset falls within the range greater than or equal to 24, but less than or equal to 47, the REFCLK is assumed to be equal to 77.76 MHz, and the REFSEL signal is set to a value of 6.

The logic within the digital compare block 4410 may be implemented in a wide variety of ways to perform the necessary function of ascertaining the highest count value reached before being reset. One potential method which might be employed would involve looking at the value of the counter just before it is reset and unilaterally setting the value of the reference select signal based upon what that maximum value was determined to be. One potential difficulty with this approach concerns the situation when no external reference clock is being provided to the device. In such a case the compare logic 4410 would be waiting forever for a signal which never occurs and consequently the state of the reference select signal may either be undetermined or may be not optimal for a device having no reference signal applied thereto. Another approach assumes initially that the reference select signal is set to a value of 7 when the counter 208 initially starts incrementing. The compare block 4410 waits until the first threshold is exceeded—in this case, when the value of the count first reaches 24—at which point the reference clock is now known to be at one of the frequencies lower than the 155 MHz frequency. At this point it is not known which of the other frequencies the REFCLK is operating at, but it is concluded upon reaching the count of 24 that it cannot be operating at 155 MHz. In that case the value of the reference select signal REFSEL may be immediately decremented from 7 to 6, and the compare block 4410 continues looking at the COUNT value. If the COUNT value reaches the next threshold value, in this case 48, the compare block determines that the reference clock cannot be operating at 77 MHz either, and immediately may update the register 4412 containing the value of the REFSEL signal to a value of 5. At some point, assuming a valid REFCLK signal is indeed being received by the device, the edge detector 4406 will generate a pulse on node 4426 which generates a synchronous clear input signal to the counter 4408 which causes it to be reset to 0 upon the next transition of the SYSCLK signal. The REFSEL signal, having been gradually decremented as the value of the count grew, should be therefore already set properly for the particular reference clock frequency encountered.

Assume briefly that the reference select signal REFSEL reached 5 as a result of the first pass of counting, as described above. When the counter again starts incrementing, it will eventually reach the count of 24, as before. This time, however, the compare block 4410 sees that the REFSEL signal is already set to a value which is less than 6, and therefore does not cause the value to change. When the next threshold value of 48 is reached, the reference select signal is already set to a value of 5 and the compare block 4410 may be arranged to reinforce this value. Preferably, any such circuit within the auto detect block 4400, and particularly the digital compare block 4410 should be designed to tolerate unknown logic state conditions either as a result of system power-up or as a result of perturbations on power supply lines or arising from other noise sources.

During the initial measurement cycle, one particular advantage of incrementally updating the value of the reference select signal REFSEL as each succeeding count threshold is reached, rather than waiting for the pulse which clears the counter, arises because the REFSEL signal more quickly approaches its correct value, even during the initial counting period. If the value of the REFSEL signal is communicated immediately to other circuits within the device and which, as would be expected, is used to adjust various divide ratios, the internal clock rate of other circuits may more quickly be caused to increase as the reference clock is determined to be one of the lower potential external reference clock frequencies. This may speed up any self-test or calibration activities, and may speed up the acquisition of frequency lock in an internal PLL circuit.

Referring again to Table 1, the last entry indicates a reference clock frequency of 4.86 MHz. In a preferred embodiment, this frequency is not actually used. Instead, whenever the COUNT value reaches 384, the reference clock frequency is assumed to be 2.43 MHz rather than 4.86 MHz, the REFSEL signal is set to 2, and the remainder of the device is configured accordingly for a 2.43 MHz reference clock frequency.

In order to detect when no reference clock signal is supplied, and thus referenceless mode of operation is indicated, several approaches can be used exploiting the circuitry shown in FIG. 44. For example, an overflow signal from counter 4408 indicating that the counter has reached or exceeded its maximum count value would indicate that no edge was detected, and thus no reference clock is present. In another embodiment, a count value is selected and if the counter exceeds that count value, referenceless mode of operation is selected. In one embodiment, the count value may correspond to a frequency of 1 MHz or less, thus indicating that no valid clock signal is present on the reference clock input terminal. In such an embodiment, another row would be entered in Table 1 corresponding to the 1 MHz frequency and the REFSEL signal set to, e.g., 1 or 0, to indicate referenceless mode.

It should be appreciated upon inspection of the embodiment shown in FIG. 44 that very few circuits operate at a frequency anywhere close to a high frequency. Most circuits, in fact, operate at a quite slow frequency. Moreover, almost no circuits operate at the reference clock frequency. This reduces the digital noise that might otherwise be communicated into a PLL that uses the reference clock frequency. Furthermore, traditional design techniques may be utilized to implement the various circuit blocks described herein. For example, the circuits "downstream" of the synchronizer 4404, such as the edge detector 4406, the counter 4408, the register 4412, and especially the digital compare block 4410, are not particularly critical in performance, and are therefore particularly suitable for implementation using logic synthesis tools to achieve the functionality described.

Figure 45:
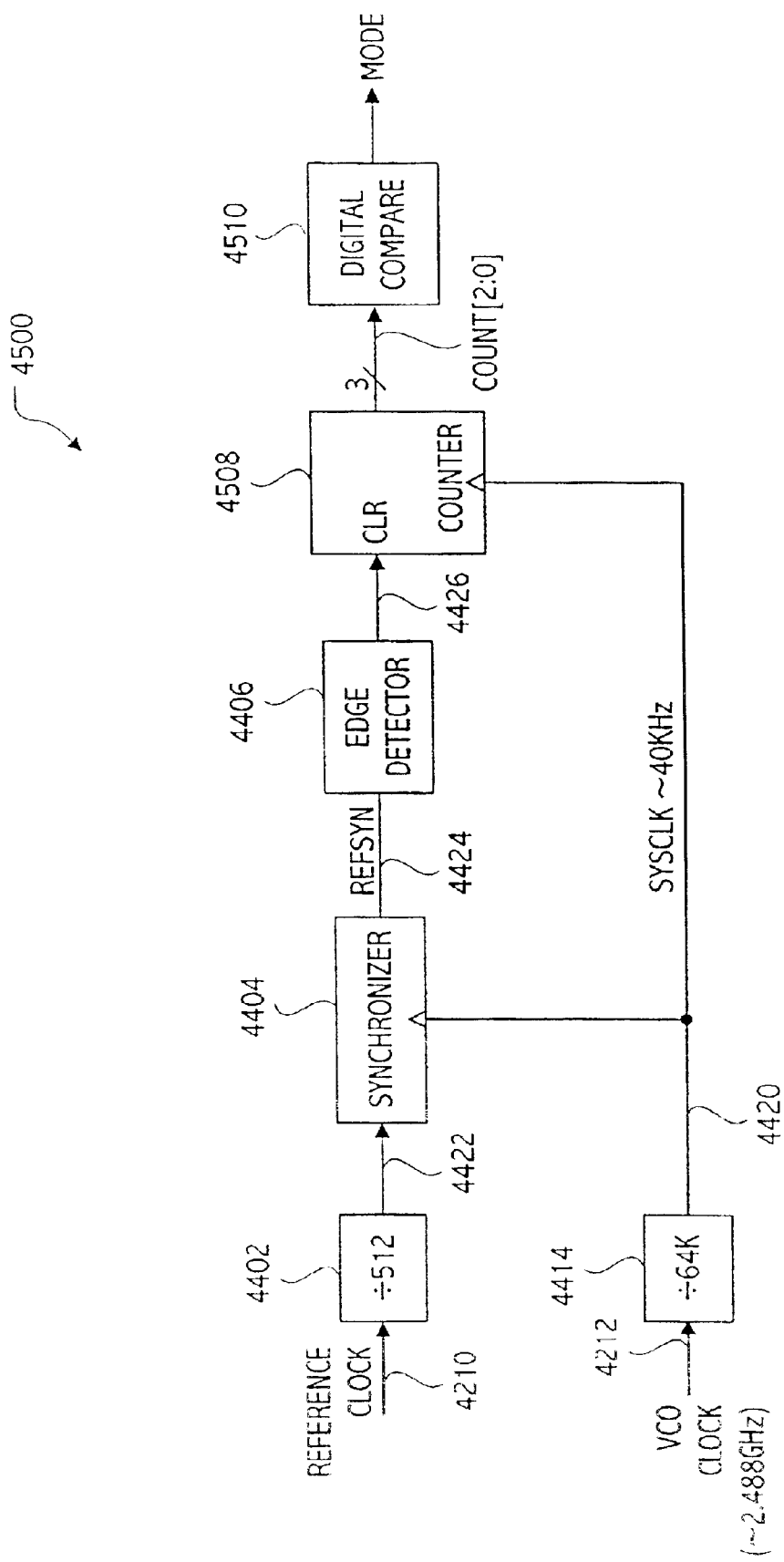
FIG. 45 is a block diagram of another embodiment of a mode detect circuit to detect whether the integrated circuit is operating in referenceless or reference clock mode of operation.

In still another embodiment, as shown in FIG. 45, a separate frequency detect circuit can be used to determine whether the CDR circuit is operating in referenceless or reference clock mode of operation. The circuit shown in FIG. 45 is similar to the detect circuit shown in FIG. 44 except that the SYSCLX is significantly slower (only approximately 40 KHz). The counter 4508 may be implemented as only a three bit counter. If the counter counts to its maximum, then the digital compare logic determines the CDR to be in referenceless mode of operation. A value of seven implies that the frequency of the signal on the reference clock input terminal is less than approximately 1 MHz and therefore there is assumed to be no valid reference clock. Thus, if reference clock mode of operation is detected (counter value less than seven), then the frequency specified by the detect circuit shown in FIG. 44 may be utilized. Note that appropriate resynchronization of various logic blocks and clocks signals may be necessary in any particular design, depending on the speed and relationship between the various clocks utilized. Note also that the frequency detect circuit may be continuously monitoring to determine whether there is a valid reference clock present.

Referring again to FIG. 41, the exemplary clock and data recovery circuit 4100 is preferably implemented as a single integrated circuit particularly well suited to operation with a SONET data stream. A differential input data signal is buffered and conveyed to a phase detector 4101 along with a data rate select signal conveyed from input terminal 4111. The phase error signal from the phase detector 4101 is filtered by a digital loop filter to generate a first control signal for a VCO 4106. A clock divider block 4108 selectively divides the VCO clock signal in accordance with an externally-provided rate select signal communicated on node 4111 to generate the recovered clock signal on node 4110. An externally-provided reference clock signal REFCLK is conveyed on node 4113 to a lock detector block 4115, along with the rate select signal on node 4111 and the recovered clock signal on node 4110. The lock detector block 4115 generates a LOSS-OF-LOCK signal (LOL) conveyed on node 4116 and may also generate a second control signal for the VCO 4106 (on node 4118) to aid in frequency acquisition of the data recovery PLL.

An auto-detect block 4200 described above, may be implemented within the lock detector block 4115 to auto-detect which REFCLK frequency, of several possible frequencies, is received by the device, without requiring dedicated integrated circuit pins to so indicate. In this example, the its circuit 4100 configures the VCO 4106 to operate at a nominal frequency of 2.488 GHz when receiving an externally-provided REFCLK frequency of either 155.52, 77.76, or 19.44 MHz. Of course, in operation the exact frequency of the VCO 4106 adjusts depending on the incoming data signal. Depending upon which REFCLK frequency is detected, various dividers are configured in the lock detector 4115 to ensure that the VCO operates at a multiple of the REFCLK frequency necessary to generate a 2.488 GHz clock rate. For example, since the rate select signal conveyed on node 4111 determines the ratio between the VCO output clock signal (the output of VCO 4106) and the recovered clock signal conveyed on node 4110, and since both the rate select signal and the recovered clock signal are received by the lock detector block 4116, a divider within the lock detection block 4115 may be configured to achieve an overall divide ratio between the VCO clock frequency and the REFCLK frequency, and thus control the VCO 4106 to achieve a VCO clock frequency which is a known multiple of the REFCLK frequency.

Other potential REFCLK frequencies, such as 38.88, 9.72, and 2.43 MHz, are not available for use in a normal operating mode, but instead correspond respectively to different test modes of operation (a REFCLK frequency of 4.86 MHz is not used, as described above). When a REFCLK frequency equal to one these three "normally unused" frequencies is auto-detected, the clock and data recovery circuit 4200 preferably enters a corresponding one of three available test modes, all without requiring dedicated pins to convey one or more test mode enable signals which might otherwise be required.

As used herein, a "clock signal" is not necessarily a well-shaped square wave with abrupt transitions, as is commonly assumed in modest-speed digital circuits. Rather, a clock signal need only be a periodic signal (or a gated periodic signal). Consequently, sawtooth waveforms, "sloppy" square waveforms, sinusoidal waveforms, triangular waveforms, and any other periodic waveform may be used as a clock signal. An externally-provided frequency reference signal may be a signal entirely generated off-chip and conveyed as a identifiable signal to the integrated circuit. Alternatively, such an externally-provided frequency reference signal may be provided by a resonant circuit, such as a crystal, coupled to the integrated circuit even though a portion of any required "oscillator" circuitry may be contained on-chip.

Even though the block diagrams herein are described using the concept of circuit nodes connecting the blocks, it should be appreciated that, when required by various embodiments, such a "node" may actually represent a pair of nodes for conveying a differential signal, or may represent multiple separate wires (e.g., a bus) for carrying several related signals or a multi-bit digital word.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, any of a variety of circuits may be used to compare the reference frequency signal to an internal frequency source. In particular, a PLL with a particular lock range could be used to sequentially try to lock onto each of the possible reference frequencies. Such a circuit could try each divider setting until a lock indication is received. In some cases the bias level of a VCO control voltage may be used to indicate which frequency is "detected." Alternatively, a phase/frequency detector type circuit could be provided having an output which indicates whether the external reference signal is above or below the frequency of an internally generated signal. An accompanying state machine then searches each frequency until its frequency is "bounded" by two comparisons. A group of possible reference frequencies having frequencies other than which are related by a factor of two in frequency may be used provided the internal frequency reference is controlled to an acceptable degree to enable unambiguous determinations. In some embodiments utilizing a PLL, the VCO does not always operate at the same nominal frequency and various dividers in the PLL feedback path may or may not be configured as a function of which external reference frequency is provided. Moreover, the VCO need not operate at a frequency which is an integral multiple of the external reference frequency, but rather may operate, at times, with a multiple which is a ratio of integers. Accordingly, other embodiments, variations, and improvements not described herein are not necessarily excluded from the scope of the invention, which is defined by the following appended claims.

What is claimed is:

1. An integrated circuit comprising:
   an input terminal for receiving an input signal; and
   a frequency detection circuit, coupled to receive an indication of the input signal and responsive to detect a frequency of the input signal and to determine according to the detected frequency whether the integrated circuit is operating in a referenceless mode of operation or in a reference clock mode of operation.

2. The integrated circuit as recited in claim 1 wherein the integrated circuit, in reference clock mode of operation, is coupled to receive the input signal as an externally provided reference clock signal, wherein the integrated circuit further comprises a phase-locked loop circuit operable to generate an output signal from the phase-locked loop circuit having a frequency related to that of the reference clock signal thereby assisting the phase-locked loop to lock to a frequency of an input data stream, the output signal approximating the frequency of the input data stream, the phase-locked loop circuit being operable in a referenceless mode to lock to the input data stream without the use of the reference clock signal.

3. The integrated circuit as recited in claim 1 further comprising a phase-locked loop circuit operable in reference clock mode of operation to output a clock according to a frequency of a clock embedded in a received data stream, the integrated circuit utilizing the reference clock to determine a loss of lock by the phase-locked loop circuit with respect to the input data stream, the phase-locked loop circuit being operable in a referenceless mode to determine loss of lock absent the use of the reference clock signal.

4. The integrated circuit as recited in 1 wherein in reference clock mode of operation, the input signal is a reference clock signal, used for at least one of frequency acquisition or lock detect.

5. The integrated circuit as recited in claim 1 wherein the input terminal is coupled to a fixed voltage in the referenceless mode of operation.

6. The integrated circuit as recited in claim 1 wherein the input signal is below a predetermined frequency in the referenceless mode of operation.

7. The integrated circuit as recited in claim 1 wherein a divided down version of the input signal is used in detecting the frequency of the input signal.

8. The integrated circuit as recited in claim 1 wherein the frequency detection circuit further comprises a counter and an edge detection circuit, the counter counting until an edge is detected by the edge detection circuit, and wherein if a predetermined count value is reached because no edge is detected, indicating the input signal is below a predetermined frequency, the referenceless mode of operation is indicated.

9. An integrated circuit comprising:
   a phase-locked loop circuit operable in a first mode to receive an externally provided reference clock signal and to utilize the reference clock signal in the first mode to assist locking to a clock embedded in an input data stream, the phase locked loop circuit being operable in a second mode to operate absent the use of the reference clock signal; and
   a frequency detection circuit for determining, absent any additional externally provided signal to indicate, whether the integrated circuit is to operate in the first or second modes of operation.

10. The integrated circuit as recited in claim 9 wherein the frequency detection circuit is coupled to receive an indication of a signal supplied on an input terminal that receives the reference clock signal in the first mode.

11. The integrated circuit as recited in claim 9 wherein the frequency detection circuit includes a counter and an edge detection circuit, the counter counting until an edge is detected by the edge detection circuit, and wherein if no edge is detected in a predetermined time period, the second mode of operation is indicated.

12. A method of operating an integrated circuit comprising:
   receiving a reference signal on an input terminal of the integrated circuit;
   detecting a frequency of the reference signal; and
   operating a phase-locked loop circuit in one of referenceless and reference clock mode of operation according to the detected frequency of the reference signal.

13. The method as recited in claim 12 further comprising continuously monitoring the input terminal to determine if the integrated circuit is in the referenceless or reference clock mode of operation.

14. The method as recited in claim 12 wherein detecting the frequency further comprises:
   counting in a counter clocked by a signal other than the reference signal;
   determining a count value according to a detected transition of the reference signal; and
   detecting the frequency of the reference signal according to the count value, one of the count values corresponding to referenceless mode of operation and another one or more count values corresponding to the reference clock mode of operation.

15. The method as recited in claim 12 wherein the reference signal is a reference clock signal in reference clock mode of operation.

16. The method as recited in claim 12 further comprising determining the integrated circuit to be in the referenceless mode of operation if the detected frequency of the reference signal is below a predetermined frequency.

17. The method as recited in claim 12 further comprising determining the integrated circuit to be in the reference clock mode of operation if the detected frequency of the reference signal is above a predetermined frequency.

18. An integrated circuit comprising:

an input terminal for receiving a reference signal; and means for determining if the integrated circuit is operating in a referenceless mode of operation or in a reference clock mode of operation according to a detected frequency of the reference signal.

19. The integrated circuit as recited in claim 11 wherein a count value of the counter is indicative of a detected frequency of the reference clock signal, the detected frequency indicating whether the integrated circuit is to operate in the first or second mode of operation.

20. An integrated circuit comprising:

an input terminal for receiving a reference signal; and means for determining if the integrated circuit is operating in a referenceless mode of operation or in a reference clock mode of operation according to a detected frequency of the reference signal; and wherein the means for determining further comprises a counter and an edge detection circuit, the counter counting until an edge is detected by the edge detection circuit, the count value indicative of the detected frequency and wherein if no edge is detected in a predetermined time period, referenceless mode of operation is indicated.

* * * * *